(12) United States Patent
Kanda et al.

(10) Patent No.: US 10,607,700 B2
(45) Date of Patent: Mar. 31, 2020

(54) SEMICONDUCTOR CIRCUIT, DRIVING METHOD, AND ELECTRONIC APPARATUS

(71) Applicant: SONY CORPORATION, Tokyo (JP)

(72) Inventors: Yasuo Kanda, Kanagawa (JP); Yuji Torige, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/067,749

(22) PCT Filed: Dec. 16, 2016

(86) PCT No.: PCT/JP2016/087589
§ 371 (c)(1),
(2) Date: Jul. 2, 2018

(87) PCT Pub. No.: WO2017/122497
PCT Pub. Date: Jul. 20, 2017

(65) Prior Publication Data
US 2019/0013076 A1    Jan. 10, 2019

(30) Foreign Application Priority Data
Jan. 15, 2016    (JP) ................. 2016-006423

(51) Int. Cl.
*G11C 11/00*    (2006.01)
*G11C 14/00*    (2006.01)
(Continued)

(52) U.S. Cl.
CPC ........ *G11C 14/0081* (2013.01); *G11C 11/161* (2013.01); *G11C 11/412* (2013.01);
(Continued)

(58) Field of Classification Search
CPC . G11C 14/0081; G11C 11/161; G11C 11/412; G11C 11/419
See application file for complete search history.

(56) References Cited

U.S. PATENT DOCUMENTS

2004/0257113 A1    12/2004  Toyoda
2014/0149773 A1*    5/2014  Huang ............... G11C 13/0007
713/323
(Continued)

FOREIGN PATENT DOCUMENTS

JP          2013-030240       2/2013
WO      WO 2004/040582       5/2004
(Continued)

OTHER PUBLICATIONS

International Search Report prepared by the Japan Patent Office dated Jan. 26, 2017, for International Application No. PCT/JP2016/087589.

*Primary Examiner* — Uyen B Tran
(74) *Attorney, Agent, or Firm* — Sheridan Ross P.C.

(57) ABSTRACT

A semiconductor circuit of the disclosure includes a first circuit that is able to generate, on the basis of a voltage at a first node, an inverted voltage of the voltage at the first node, and apply the inverted voltage to a second node, a second circuit that is able to generate, on the basis of a voltage at the second node, an inverted voltage of the voltage at the second node, and apply the inverted voltage to the first node, a first transistor that is turned ON to couple the first node to a third node, a second transistor that is turned ON to supply a first direct-current voltage to the third node, and a first storage section that is coupled to the third node and includes a first storage device that is able to take a first resistance state or a second resistance state.

26 Claims, 41 Drawing Sheets

(51) Int. Cl.
    *G11C 11/16* (2006.01)
    *G11C 11/412* (2006.01)
    *G11C 11/419* (2006.01)
    *H01L 27/22* (2006.01)
    *H01L 43/02* (2006.01)
    *H01L 43/08* (2006.01)

(52) U.S. Cl.
    CPC .......... *G11C 11/419* (2013.01); *H01L 27/228* (2013.01); *H01L 43/02* (2013.01); *H01L 43/08* (2013.01)

(56) References Cited

U.S. PATENT DOCUMENTS

2015/0070974 A1    3/2015   Shuto
2016/0329098 A1*  11/2016   Javerliac ............... G11C 11/005

FOREIGN PATENT DOCUMENTS

WO    WO 2009/028298    11/2010
WO    WO 2013/172066    11/2013

* cited by examiner

SEMICONDUCTOR CIRCUIT, DRIVING METHOD, AND ELECTRONIC APPARATUS

CROSS REFERENCE TO RELATED APPLICATIONS

This application is a national stage application under 35 U.S.C. 371 and claims the benefit of PCT Application No. PCT/JP2016/087589 having an international filing date of 16 Dec. 2016, which designated the United States, which PCT application claimed the benefit of Japanese Patent Application No. 2016-006423 filed 15 Jan. 2016, the entire disclosures of each of which are incorporated herein by reference.

TECHNICAL FIELD

The disclosure relates to a semiconductor circuit, a driving method of the semiconductor circuit, and an electronic apparatus including the semiconductor circuit.

BACKGROUND ART

Low power consumption of an electronic apparatus has been desired from a viewpoint of ecology. In a semiconductor circuit, for example, a technique of so-called power gating is often used. The power gating selectively suspends power supplied to some circuits in order to reduce power consumption. It is desirable for the circuit to which the power supply has been suspended to return to an operation state before the suspension of the power supply immediately after a restart of the power supply. One method to achieve a recovery operation in such a short period of time is to incorporate non-volatile memory in a circuit. For example, PTL 1 discloses a circuit with a combination of SRAM (Static Random Access Memory) as volatile memory and a spin transfer torque storage device.

CITATION LIST

Patent Literature

PTL 1: WO 2009/028298 A1

SUMMARY OF THE INVENTION

Incidentally, reduced write error in a storage circuit is desired, and further reduction in the write error is expected.

It is desirable to provide a semiconductor circuit, a driving method, and an electronic apparatus that make it possible to reduce the write error.

A semiconductor circuit according to an embodiment of the disclosure includes a first circuit, a second circuit, a first transistor, a second transistor, and a first storage section. The first circuit is able to generate, on the basis of a voltage at a first node, an inverted voltage of the voltage at the first node, and apply the inverted voltage to a second node. The second circuit is able to generate, on the basis of a voltage at the second node, an inverted voltage of the voltage at the second node, and apply the inverted voltage to the first node. The first transistor is turned ON to couple the first node to a third node. The second transistor is turned ON to supply a first direct-current voltage to the third node. The first storage section is coupled to the third node and includes a first storage device that is able to take a first resistance state or a second resistance state.

A driving method according to an embodiment of the disclosure, performed on a semiconductor circuit that includes a first circuit, a second circuit, a first transistor, a second transistor, and a first storage section, the first circuit being able to generate, on the basis of a voltage at a first node, an inverted voltage of the voltage at the first node, and apply the inverted voltage to a second node, the second circuit being able to generate, on the basis of a voltage at the second node, an inverted voltage of the voltage at the second node, and apply the inverted voltage to the first node, the first transistor being turned ON to couple the first node to a third node, the second transistor being turned ON to supply a first direct-current voltage to the third node, and the first storage section including a first terminal coupled to the third node and a second terminal to which a control voltage is supplied and including a first storage device that is able to take a first resistance state or a second resistance state, includes performing a first drive in a first period, the first drive setting the control voltage as a first voltage level that is different from a voltage level of the first direct-current voltage, turning ON the second transistor, and turning OFF the first transistor, to thereby allow a resistance state of the first storage device to be the first resistance state, and, performing a second drive in a second period that is after the first period, the second drive setting the control voltage as a second voltage level, to thereby allow the resistance state of the first storage device to be a resistance state that depends on the voltage at the first node.

An electronic apparatus according to an embodiment of the disclosure includes a semiconductor and a battery. The battery supplies a power supply voltage to the semiconductor circuit. The semiconductor circuit includes a first circuit, a second circuit, a first transistor, a second transistor, and a first storage section. The first circuit is able to generate, on the basis of a voltage at a first node, an inverted voltage of the voltage at the first node, and apply the inverted voltage to a second node. The second circuit is able to generate, on the basis of a voltage at the second node, an inverted voltage of the voltage at the second node, and apply the inverted voltage to the first node. The first transistor is turned ON to couple the first node to a third node. The second transistor is turned ON to supply a first direct-current voltage to the third node. The first storage section is coupled to the third node and includes a first storage device that is able to take a first resistance state or a second resistance state.

In the semiconductor circuit, the driving method, and the electronic apparatus in the respective embodiments of the disclosure, the first circuit and the second circuit allow the voltages that are inverted to each other to appear in the first node and the second node. The first transistor is turned ON to thereby allow the third node to which the first storage section is coupled, to be coupled to the first node. Further, the second transistor is turned ON to supply the first direct-current voltage to the third node.

According to the semiconductor circuit, the driving method, and the electronic apparatus in the respective embodiments of the disclosure, the second transistor which is turned ON to supply the first direct-current voltage to the third node is provided, which makes it possible to reduce write error. It is to be noted that the effects of the disclosure are not necessarily limited to the effects described above, and may be any of the effects described in the specification.

MODES FOR CARRYING OUT THE INVENTION

Figure 1:
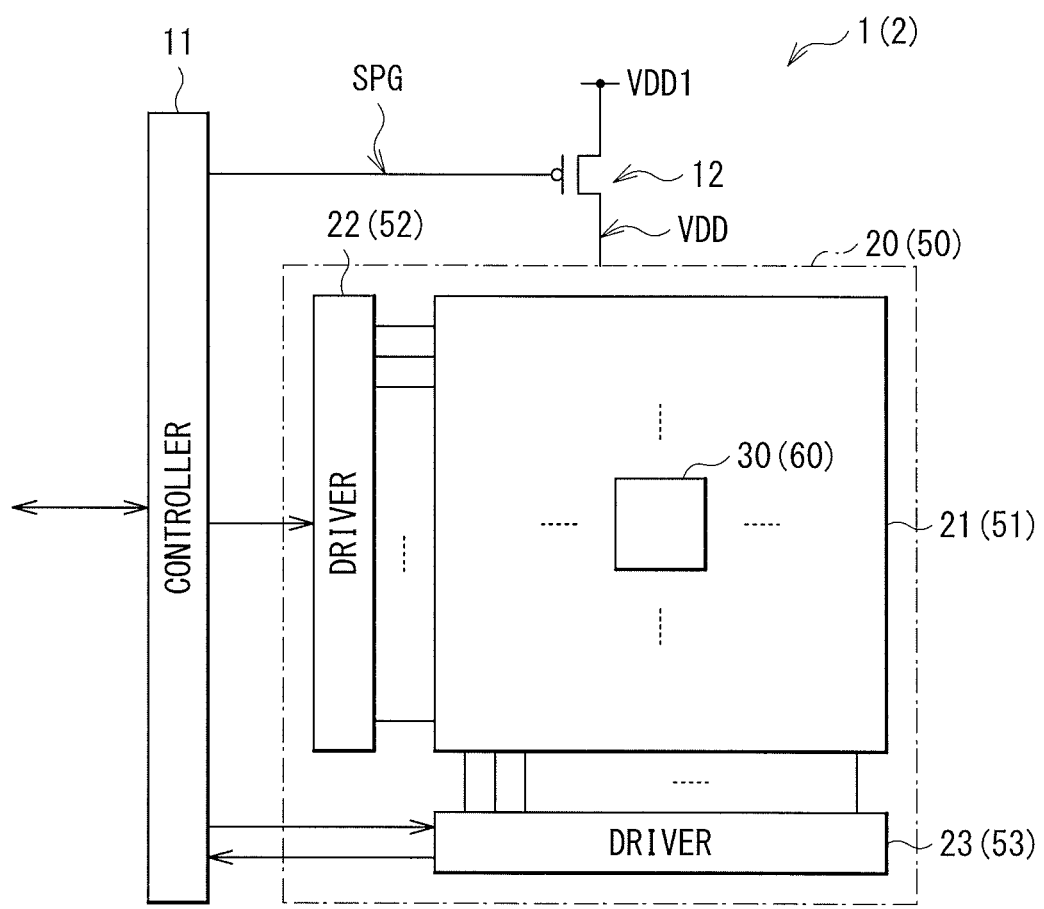
FIG. 1 is a block diagram illustrating a configuration example of a semiconductor circuit according to an embodiment of the disclosure.

In the following, some embodiments of the disclosure are described in detail with reference to the drawings. It is to be noted that descriptions are made in the following order.
1. First Embodiment
2. Second Embodiment
3. Applied Examples and Application Examples 1. First Embodiment Configuration Example FIG. 1 illustrates a configuration example of a semiconductor circuit 1 according to an embodiment. The semiconductor circuit 1 is a circuit that stores information. It is to be noted that a driving method of the semiconductor circuit according to an embodiment of the disclosure is embodied by this embodiment, and therefore, description thereof is provided together. The semiconductor circuit 1 includes a controller 11, a power supply transistor 12, and a memory circuit 20.

The controller 11 controls operation of the memory circuit 20. Specifically, the controller 11 writes information in the memory circuit 20 on the basis of a write command and write data supplied from outside. Further, the controller 11 reads information from the memory circuit 20 on the basis of a read command supplied from outside. Further, the controller 11 also has a function of controlling power supplied to the memory circuit 20 by supplying a power supply control signal SPG to the power supply transistor 12 to turn ON or OFF of the power supply transistor 12.

In this example, the power supply transistor 12 is a P-type MOS (Metal Oxide Semiconductor) transistor. The power supply transistor 12 includes a gate to which the power supply signal SPG is supplied, a source to which a power supply voltage VDDI is supplied, and a drain coupled to the memory circuit 20.

With this configuration, in a case where the memory circuit 20 in the semiconductor circuit 1 is used, the power supply transistor 12 is turned ON to supply a power supply voltage VDDI as a power supply voltage VDD to the memory circuit 20. Further, in the semiconductor circuit 1, in a case where the memory circuit 20 is not used, the power supply transistor 12 is turned OFF. In the semiconductor circuit 1, so-called power gating enables reduction of power consumption.

The memory circuit 20 stores data. The memory circuit 20 includes a memory cell array 21 and a driver 22 and a driver 23.

The memory cell array 21 includes memory cells 30 disposed in a matrix.

Figure 2:
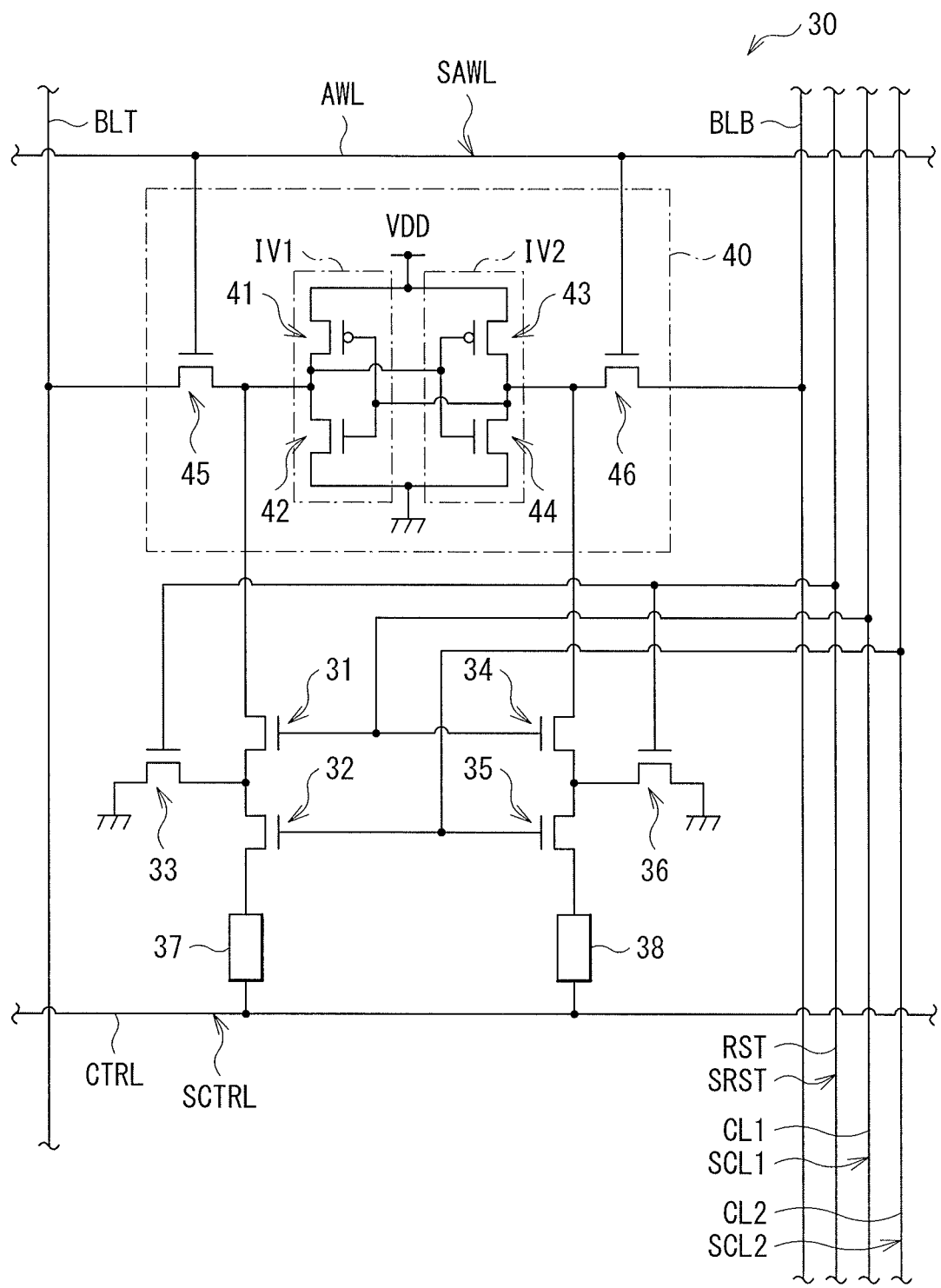
FIG. 2 is a circuit diagram illustrating a configuration example of a memory cell according to a first embodiment.
Figure 3:
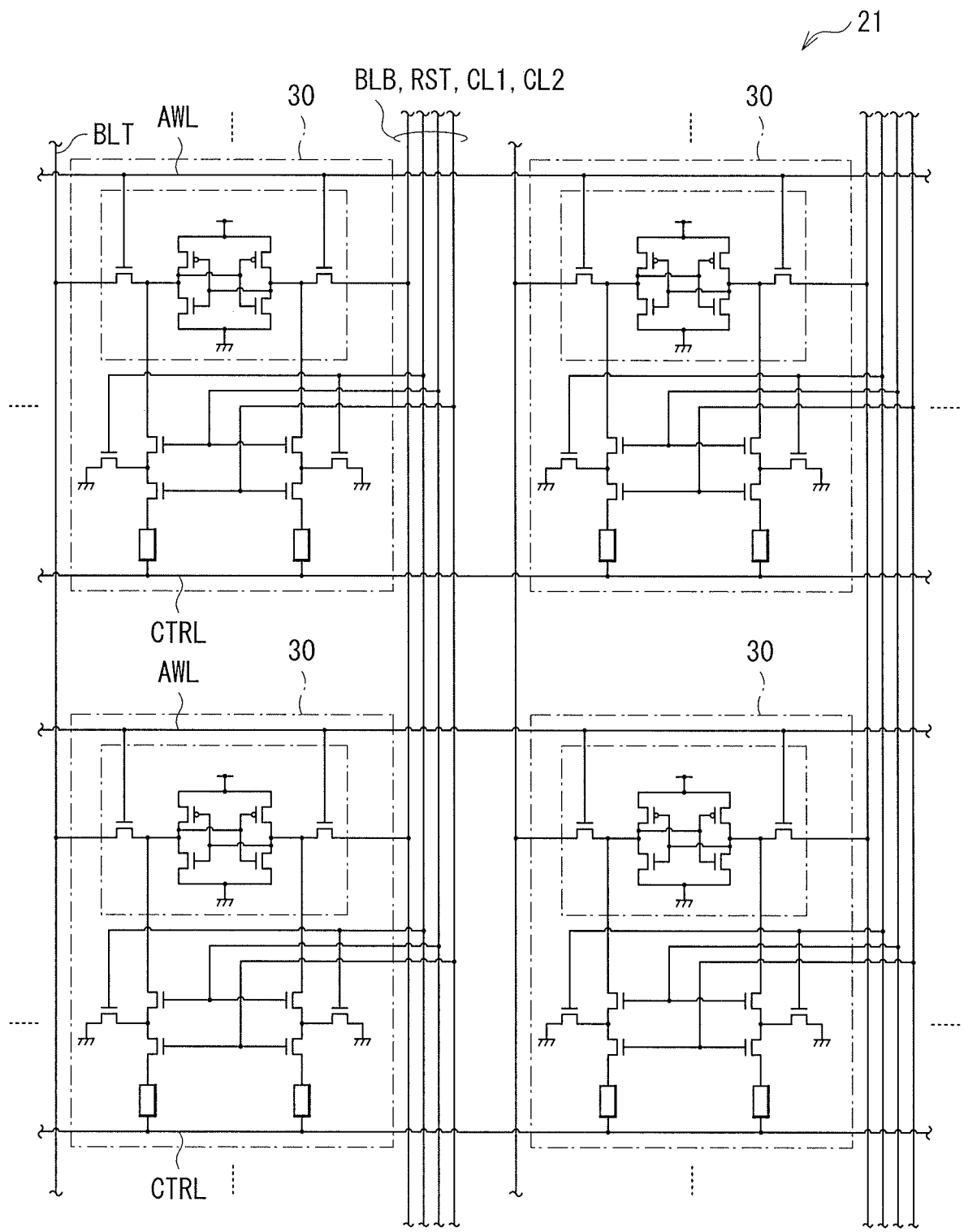
FIG. 3 is a circuit diagram illustrating a configuration example of a memory cell array including the memory cell illustrated in FIG. 2.

FIG. 2 illustrates a configuration example of the memory cell 30. FIG. 3 illustrates a configuration example of the memory cell array 21. The memory cell array 21 includes a plurality of word lines AWL, a plurality of control lines CTRL, a plurality of bit lines BLT, a plurality of bit lines BLB, a plurality of control lines RST, a plurality of control lines CL1, and a plurality of control lines CL2. The word lines AWL extend in a lateral direction in FIGS. 2 and 3. The word lines AWL each include one end coupled to the driver 22, allowing the driver 22 to apply a signal SAWL to the word lines AWL. The control lines CTRL extend in the lateral direction in FIGS. 2 and 3. The control lines CTRL each include one end coupled to the driver 22, allowing the driver 22 to apply a signal SCTRL to the control lines CTRL. The bit lines BLT extend in the vertical direction in FIGS. 2 and 3. The bit lines BLT each include one end coupled to the driver 23. The bit lines BLB extend in the vertical direction in FIGS. 2 and 3. The bit lines BLB each include one end coupled to the driver 23. The control lines RST extend in the vertical direction in FIGS. 2 and 3. The control lines RST each include one end coupled to the driver 23, allowing the driver 23 to apply a signal SRST to the control lines RST. The control lines CL1 extend in the vertical direction in FIGS. 2 and 3. The control lines CL1 each include one end coupled to the driver 23, allowing the driver 23 to apply a signal SCL 1 to the control lines CL1. The control lines CL2 extend in the vertical direction in FIGS. 2 and 3. The control lines CL2 each include one end coupled to the driver 23, allowing the driver 23 to apply a signal SCL2 to the control lines CL2.

The memory cell 30 includes an SRAM (Static Random Access Memory) circuit 40, transistors 31 to 36, and storage devices 37 and 38.

The SRAM circuit 40 stores information of one bit by positive feedback. The SRAM 40 includes the transistors 41 to 46. The transistors 41 and 43 are the P-type MOS transistors, and the transistors 42, 44, 45, and 46 are N-type MOS transistors.

The transistor 41 includes a gate coupled to a gate of the transistor 42 and drains of the transistors 43, 44, and 46, a source to which the power supply voltage VDD is supplied, and a drain coupled to drains of the transistors 42 and 45 and to gates of the transistors 43 and 44. The transistor 42 includes the gate coupled to the gate of the transistor 41 and the drains of the transistors 43, 44 and 46, a source that is grounded, and the drain coupled to the drains of the transistors 41 and 45 and to the gates of the transistors 43 and 44. The transistor 41 and 42 constitute an inverter IV1.

The transistor 43 includes the gate coupled to the gate of the transistor 44 and the drains of the transistors 41, 42, and 45, a source to which the power supply voltage VDD is supplied, and the drain coupled to the drains of the transistors 44 and 46 and the gates of the transistors 41 and 42. The transistor 44 includes the gate coupled to the gate of the transistor 43 and the drains of the transistors 41, 42, and 45, a source that is grounded, and the drain coupled to the drains of the transistors 43 and 46 and the gates of the transistors 41 and 42. The transistors 43 and 44 constitute an inverter IV2.

The transistor 45 includes a gate coupled to the word line AWL, a source coupled to the bit line BLT, and the drain coupled to the drains of the transistors 41 and 42 and the gates of the transistors 43 and 44. The transistor 46 includes a gate coupled the word line AWL, a source coupled to the bit line BLB, and the drain coupled to the drains of the transistors 43 and 44 and the gates of the transistors 41 and 42.

With this configuration, an input terminal of the inverter IV1 and an output terminal of the inverter IV2 are coupled to one another. An input terminal of the inverter IV2 and an output terminal of the inverter IV1 are coupled to one another. This allows the SRAM circuit 40 to store the information of one bit by the positive feedback. Furthermore, in the SRAM circuit 40, the transistors 45 and 46 are turned ON to cause information to be written or cause information to be read through the bit lines BLT and BLB.

The transistors 31 to 36 are the N-type MOS transistors. The transistor 31 includes a gate coupled to the control line CL1, a drain coupled to the drains of the transistors 41, 42, and 45 and the gates of the transistors 43 and 44, and a source coupled to drains of the transistors 32 and 33. The transistor 32 includes a gate coupled to the control line CL2, the drain coupled to the source of the transistor 31 and the drain of the transistor 33, and a source coupled to one end of the storage device 37. The transistor 33 includes a gate coupled to the control line RST, the drain coupled to the source of the transistor 31 and the drain of the transistor 32, and a source that is grounded. The transistor 34 includes a gate coupled to the control line CL1, a drain coupled to the drains of the transistors 43, 44, and 46 and the gates of the transistors 41 and 42, and a source coupled to drains of the transistors 35 and 36. The transistor 35 includes a gate coupled to the control line CL2, the drain coupled to the source of the transistor 34 and the drain of the transistor 36, a source coupled to one end of the storage device 38. The transistor 36 includes a gate coupled to the control line RST, the drain coupled to the source of the transistor 34 and the drain of the transistor 35, and a source that is grounded.

The storage devices 37 and 38 are non-volatile storage devices. In this example, the storage devices 37 and 38 are magnetic tunnel junction (MTJ; Magnetic Tunnel Junction) devices of spin transfer torque (STT; Spin Transfer Torque) that perform storing information by changing a direction of magnetization of a free layer F (described later) with spin injection. The storage device 37 includes one end coupled to the source of the transistor 32 and the other end coupled to the control line CTRL.

Figure 4:
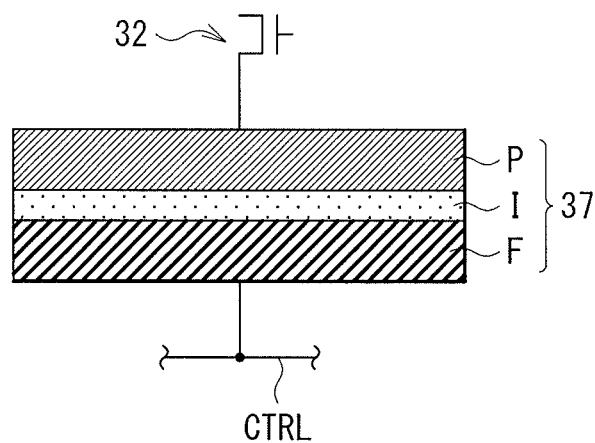
FIG. 4 is a view describing a configuration example of a storage device illustrated in FIG. 2.

FIG. 4 illustrates a configuration example of the storage device 37. The storage device 37 includes a pinned layer P, a tunnel barrier layer I, and a free layer F. In this example, the pinned layer P is coupled to the transistor 32 that is disposed on lower-layer side. The free layer F is coupled to the control line CTRL that is disposed on upper-layer side. In other words, the storage device 37 has a so-called bottom pin structure in which the free layer F, the tunnel barrier layer I, and the pinned layer P are stacked in this order from the top.

The pinned layer P includes a ferromagnetic substance in which a direction of magnetization PJ is fixed, for example, in a direction perpendicular to a film face. The free layer F includes a ferromagnetic substance in which a direction of magnetization FJ changes, for example, in a direction perpendicular to the film face, depending on a spin polarization current flowing therein. The tunnel barrier layer I functions to disconnect magnetic coupling between the pinned layer P and the free layer F and to allow a tunnel current to flow therethrough.

With this configuration, in the storage device 37, allowing a current to flow, for example, from the free layer F to the pinned layer P causes injection, from the pinned layer P to the free layer F, of polarized electrons having moment (spin) in the same direction as the direction of the magnetization PJ of the pinned layer P. This causes the direction of the magnetization FJ of the free layer F to be the same direction as the direction of the magnetization PJ of the pinned layer P (a parallel state). In such a parallel state, the storage device 37 has a low resistance value between both ends (a low resistance state RL).

Further, allowing a current, for example, from the pinned layer P to the free layer F causes the injection of electrons from the free layer F to the pinned layer P. At this time, among the electrons thus injected, polarized electrons having the moment in the same direction as the direction of the magnetization PJ of the pinned layer P pass through the pinned layer P. Among the electrons thus injected, polarized electrons having the moment in the opposite direction to the direction of the magnetization PJ of the pinned layer P are reflected at the pinned layer P, and injected into the free layer F. This causes the direction of the magnetization FJ of the free layer F to be in the opposite direction to the direction of the magnetization PJ of the pinned layer P (antiparallel state). In such an antiparallel state, the storage device 37 has a high resistance value between both ends (a high resistance state RH).

As described, in the storage device 37, the direction of the magnetization FJ of the free layer F changes depending on the direction of the current flow, causing a change in a resistance state between the high resistance state RH and the low resistance state RL. Such setting of the resistance state in the storage device 37 allows information to be stored.

It is to be noted that the storage device 37 is exemplified above for description and that the same also applies to the storage device 38.

As described, the memory cell 30 includes the transistors 31 to 36 and the storage devices 37 and 38 in addition to the SRAM circuit 40. Accordingly, for example, in a case where standby operation is performed by turning OFF the power supply transistor 12, storage operation is performed immediately before turning OFF the power supply transistor 12, which makes it possible to allow the information stored in the SRAM circuit 40 as volatile memory to be stored in the storage devices 37 and 38 as non-volatile memory. Thereafter, for example, in a case where normal operation is performed by turning ON the power supply transistor 12, the semiconductor circuit 1 performs re-storage operation immediately after turning ON the power supply transistor 12, which makes it possible to allow the information stored in the storage devices 37 and 38 to be stored in the SRAM circuit 40. This allows the state of each of the memory cells 30 to return to a state before suspension of power supply in a short period of time, after re-starting power supply, in the semiconductor circuit 1.

The driver 22 applies the signal SAWL to the word line AWL and applies the signal SCTRL to the control line CTRL on the basis of a control signal supplied from the controller 11.

The driver 23 applies the signal SRST to the control line RST, applies the signal SCL1 to the control line CL1, and applies the signal SCL2 to the control line CL2 on the basis of a control signal supplied from the controller 11. Further, the driver 23 writes information in the memory cell array 21 through the bit lines BLT and BLB on the basis of a control signal and data supplied from the controller 11. Further, the driver 23 reads information from the memory cell array 21 through the bit lines BLT and BLB on the basis of a control signal supplied from the controller 11. The driver 23 supplies the information thus read to the controller 11.

Here, the inverter IV2 corresponds to a specific example of a "first circuit" in the disclosure. The inverter IV1 corresponds to a specific example of a "second circuit" in the disclosure. The transistor 31 corresponds to a specific example of a "first transistor" in the disclosure. The transistor 33 corresponds to a specific example of a "second transistor" in the disclosure. The transistor 32 corresponds to a specific example of an "eighth transistor" in the disclosure. The transistor 34 corresponds to a specific example of a "ninth transistor" in the disclosure. The transistor 36 corresponds to a specific example of a "tenth transistor" in the disclosure. The power supply transistor 12 corresponds to a specific example of an "eleventh transistor" in the disclosure. The storage device 37 corresponds to a specific example of a "first storage device" in the disclosure. The storage device 38 corresponds to a specific example of a "third storage device" in the disclosure.

[Operation and Workings]

Description is given next of the operation and workings of the semiconductor circuit 1 according to the present embodiment.

(Overview of Overall Operation)

First, an overview of overall operation of the semiconductor circuit 1 is described with reference to FIG. 1. The controller 11 controls the operation of the memory circuit 20. Specifically, the controller 11 writes information in the memory circuit 20 on the basis of a write command and write data supplied from the outside. The controller 11 also reads information from the memory circuit 20 on the basis of a read command supplied from the outside. Further, the controller 11 controls the power supply to the memory circuit 20 by supplying the power supply control signal SPG to the power supply transistor 12 to turn ON or OFF the power supply transistor 12. The power supply transistor 12 performs ON and OFF operation on the basis of the control signal supplied from the controller 11. The power supply transistor 12 is then turned ON, allowing the power supply voltage VDD1 as the power supply voltage VDD to be supplied to the memory circuit 20. The driver 22 of the memory circuit 20 applies the signal SAWL to the word line AWL and applies the signal SCTRL to the control line CTRL on the basis of the control signal supplied from the controller 11. The driver 23 applies the signal SRST to the control line RST, applies the signal SCL1 to the control line CL1, and applies the signal SCL2 to the control line CL2 on the basis of the control signal supplied from the controller 11. Further, the driver 23 writes information in the memory cell array 21 through the bit lines BLT and BLB on the basis of the control signal and the data supplied from the controller 11. Further, the driver 23 reads information from the memory cell array 21 through the bit lines BLT and BLB on the basis of the control signal supplied from the controller 11. The driver 23 supplies the information thus read to the controller 11.

(Detailed Operation)

The semiconductor circuit 1 causes the SRAM circuit 40 as volatile memory to store information in normal operation M1. Further, the semiconductor circuit 1 performs reset operation M2 to reset the storage devices 37 and 38 to a predetermined resistance state. Further, in a case where standby operation M4 is performed by turning OFF the power supply transistor 12, for example, the semiconductor circuit 1 performs storage operation M3 immediately before turning OFF the power supply transistor 12, to thereby allow the information stored in the SRAM circuit 40 as volatile memory to be stored in the storage devices 37 and 38 as non-volatile memory. Thereafter, for example, in a case where the normal operation M1 is performed by turning ON the power supply transistor 12, the semiconductor circuit 1 performs re-storage operation M5 immediately after turning ON the power supply transistor 12, which makes it possible to allow the information stored in the storage devices 37 and 38 to be stored in the SRAM circuit 40. In the following, detailed description is given regarding this operation.

Figure 5:
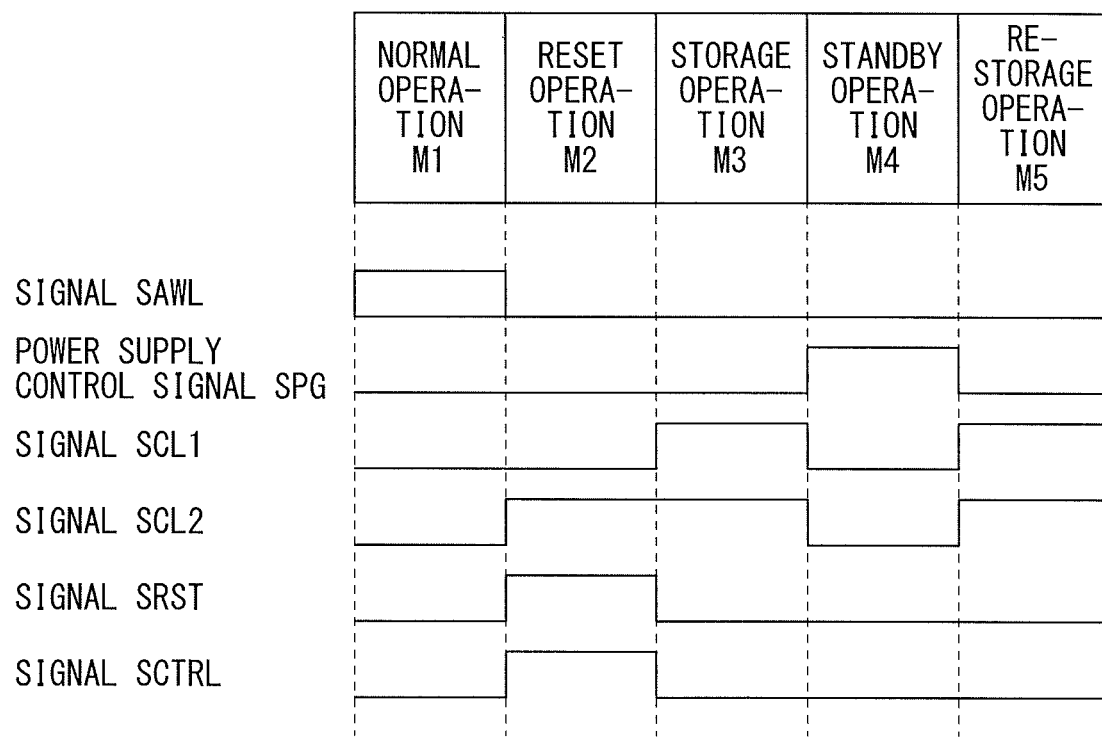
FIG. 5 is a view describing a configuration example of the memory cell illustrated in FIG. 2.
Figure 6A:
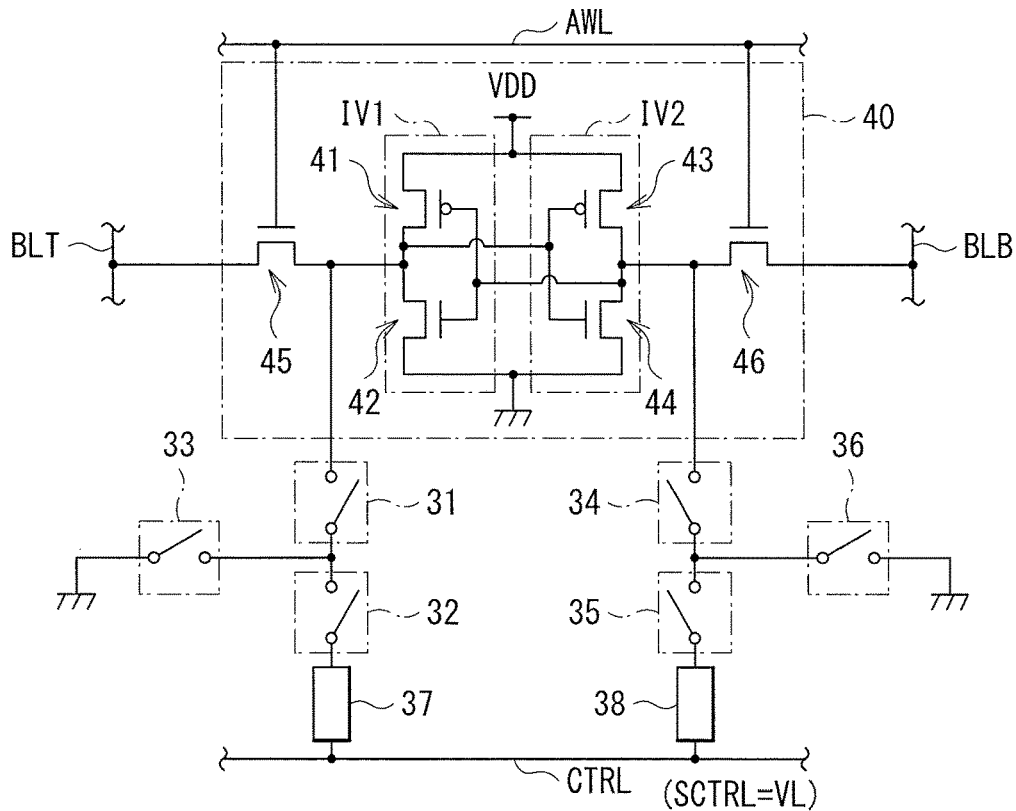
FIG. 6A is a circuit diagram illustrating an operation example of the memory cell illustrated in FIG. 2.
Figure 6B:
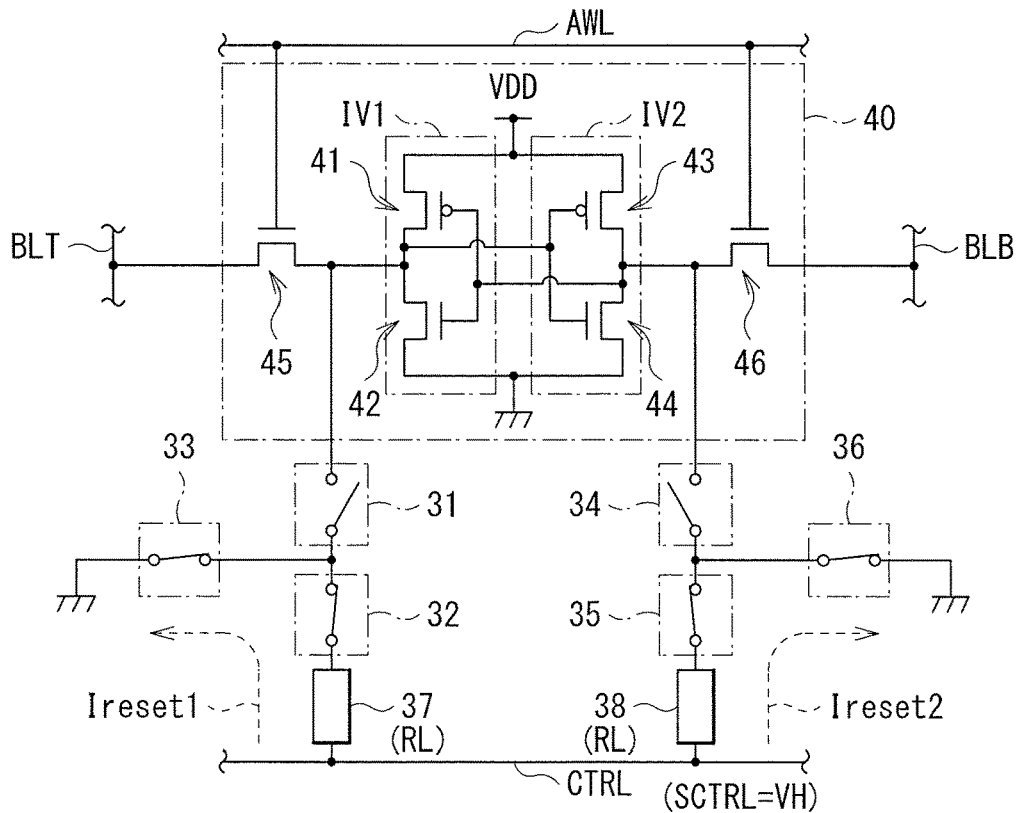
FIG. 6B is another circuit diagram illustrating an operation example of the memory cell illustrated in FIG. 2.
Figure 6C:
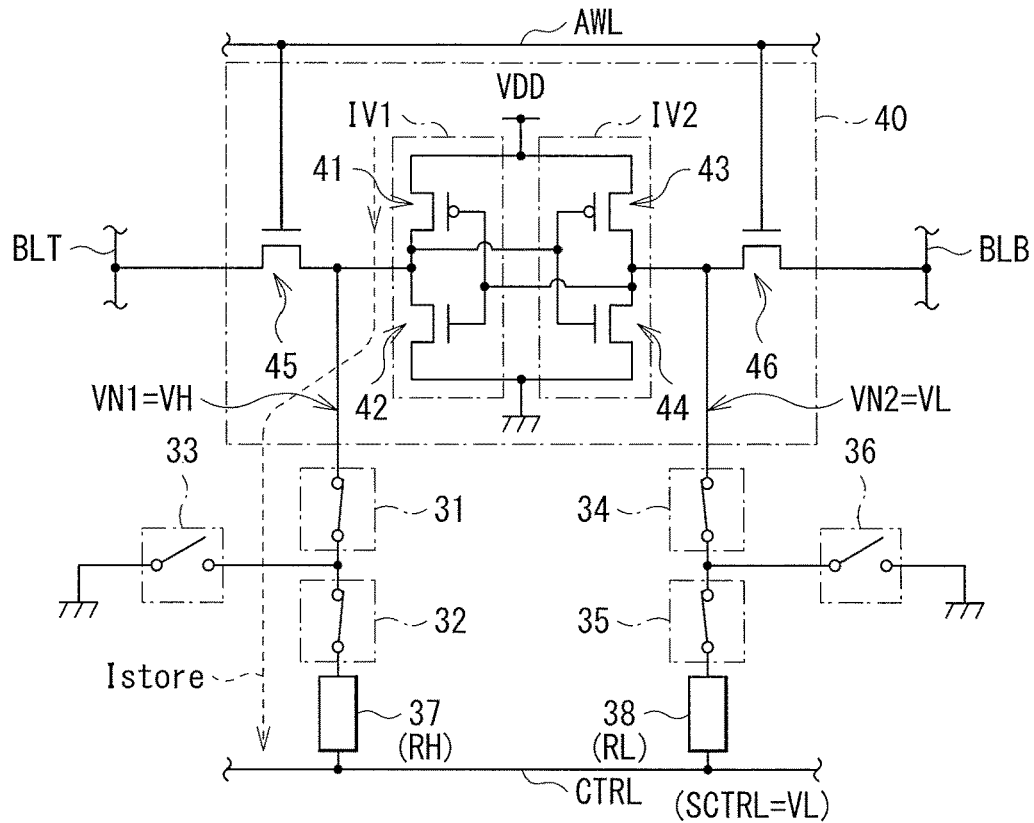
FIG. 6C is another circuit diagram illustrating an operation example of the memory cell illustrated in FIG. 2.
Figure 6D:
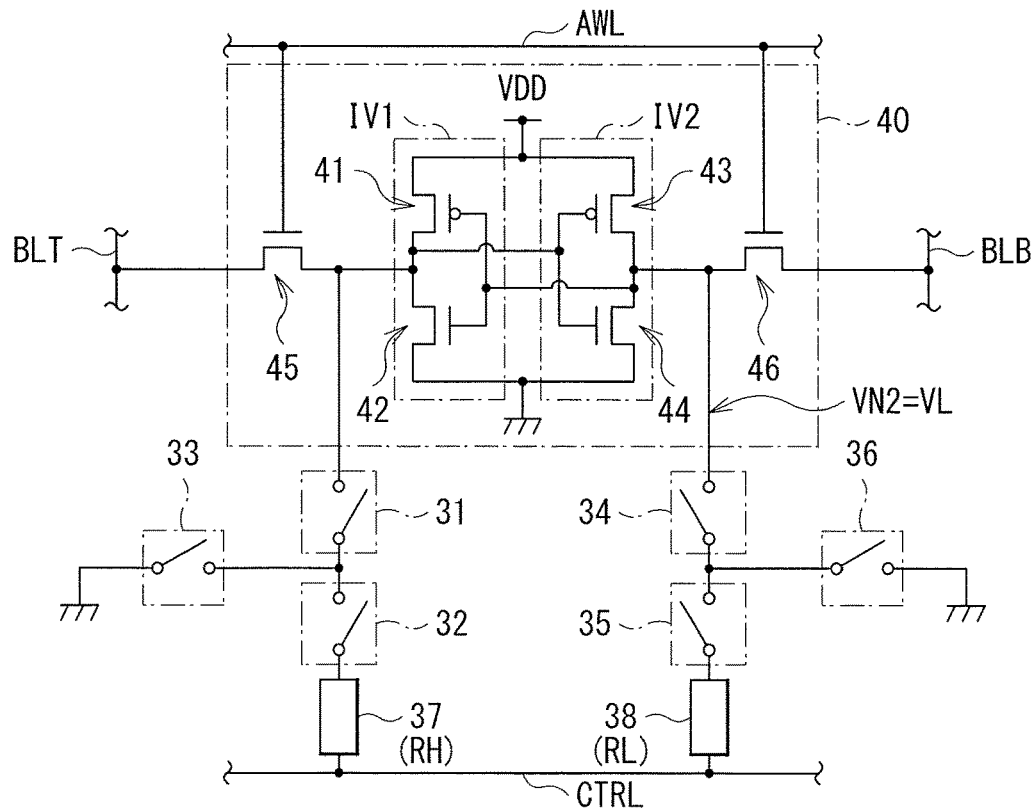
FIG. 6D is another circuit diagram illustrating an operation example of the memory cell illustrated in FIG. 2.
Figure 6E:
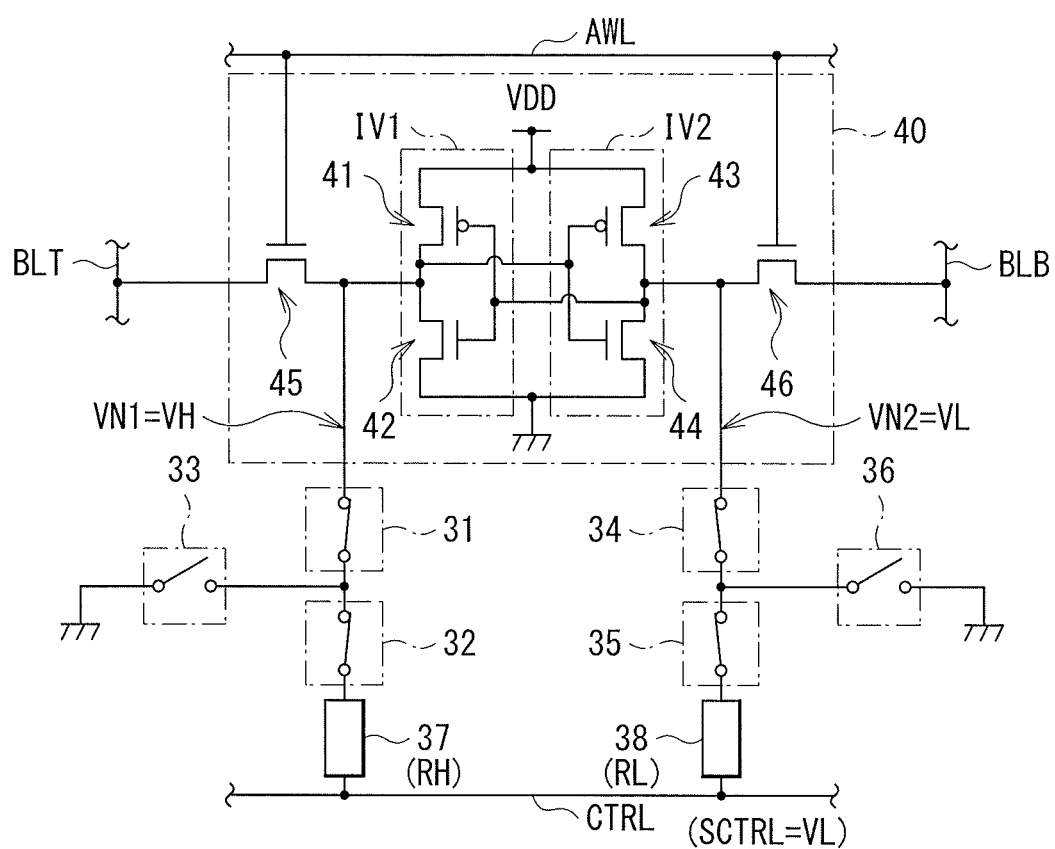
FIG. 6E is another circuit diagram illustrating an operation example of the memory cell illustrated in FIG. 2.

FIG. 5 illustrates an operation example of the memory cell 30 of interest, in the semiconductor circuit 1. FIGS. 6A to 6E illustrate the states of the memory cell 30. FIG. 6A illustrates the state in the normal operation M1. FIG. 6B illustrates the state in the reset operation M2. FIG. 6C illustrates the state in the storage operation M3. FIG. 6D illustrates the state in the standby operation M4. FIG. 6E illustrates the state in the re-storage operation M5. FIGS. 6A to 6E illustrate the transistors 31 to 36 with use of switches corresponding to operation states of the respective transistors 31 to 36.

(Normal Operation M1)

As illustrated in FIG. 5, in the normal operation M1, the controller 11 allows the voltage of the power supply control signal SPG to be a low level. This causes the power supply transistor 12 (FIG. 1) to be turned ON, causing the power supply voltage VDD to be supplied to the memory cell 30. Further, the driver 23 allows the voltages of the signals SCL1, SCL2, and SRST each to be a low level. This causes all of the transistors 31 to 36 to be turned OFF, as illustrated in FIG. 6A. In other words, the SRAM circuit 40 is electrically disconnected from the storage devices 37 and 38. Further, the driver 22 allows the voltage of the signal SCTRL to be a low level VL (a ground level).

In the normal operation M1, the driver 22 writes information in the SRAM circuit 40 of the memory cell 30 or reads information from the SRAM circuit 40. Specifically, in a case where information in the SRAM circuit 40 is written, the driver 22 first allows the voltage of the signal SAWL to be a high level, to thereby turn ON the transistors 45 and 46 of the SRAM circuit 40. Thereafter, the driver 23 applies signals to the bit lines BLT and BLB. The signals have voltage levels that are inverted to each other and depend on information to be written. Further, in a case where the information from the SRAM circuit 40 is read, the driver 23 pre-charges the respective bit lines BLT and BLB to, for example, a high level voltage. Thereafter, the driver 22 allows the voltage of the signal SAWL to be a high level, causing the transistors 45 and 46 to be turned ON. This causes the voltage of one of the bit lines BLT and BLB to change depending on the information stored in the SRAM circuit 40. The driver 23 then detects a difference in the voltages in the bit lines BLT and BLB, to thereby read the information stored in the SRAM circuit 40.

(Reset Operation M2)

The semiconductor circuit 1 performs, in preparation for the storage operation M3, the reset operation M2 to reset the state of the storage devices 37 and 38 to a predetermined resistance state in advance. Specifically, it is possible for the semiconductor circuit 1 to perform the reset operation M2 in parallel with the normal operation M1, for example.

As illustrated in FIG. 5, in the reset operation M2, the driver 23 allows the voltages of the signals SCL2 and SRST each to be a high level and allows the voltage of the signal SCL1 to be a low level. This causes the respective transistors 32, 33, 35, and 36 to be turned ON and causes the respective transistors 31 and 34 to be turned OFF, as illustrated in FIG. 6B. Further, the driver 22 allows the voltage of the signal SCTRL to be a high level VH. This causes a reset current Ireset1 to flow in the storage device 37, the transistor 32, and the transistor 33 in this order, and causes a reset current Ireset2 to flow in the storage device 38, the transistor 35, and the transistor 36 in this order.

At this time, for example, the reset current Ireset1 flows in the storage device 37 from the free layer F to the pinned layer P, which allows the direction of the magnetization FJ of the free layer F to be in the same direction as the direction of the magnetization PJ of the pinned layer P (the parallel state), a result of which the resistance state of the storage device 37 becomes a low resistance state RL. The same also applies to the storage device 38. Owing to the reset current Ireset2, the resistance state of the storage device 38 becomes a low resistance state RL. In such a manner, the reset operation M2 allows both the resistance states of the storage devices 37 and 38 to become the low resistance states RL.

(Storage Operation M3)

Description is given next of a case where the standby operation M4 is performed by turning OFF the power supply transistor 12. In this case, the semiconductor circuit 1 first performs the storage operation M3 to allow the information stored in the SRAM circuit 40 to be stored in the storage devices 37 and 38.

As illustrated in FIG. 5, in the storage operation M3, the driver 23 allows the voltages of the signals SCL1 and SCL2 each to be a high level and allows the voltage of the signal SRST to be a low level. This causes the respective transistors 31, 32, 34, and 35 to be turned ON and causes the respective transistors 33 and 36 to be turned OFF, as illustrated in FIG. 6C. Further, the driver 22 allows the voltage of the signal SCTRL to be the low level VL (a ground level). This allows a current to flow in one of the storage devices 37 and 38 depending on the information stored in the SRAM circuit 40. In this example, an output voltage VN1 of the inverter IV1 is the high level VH, and an output voltage VN2 of the inverter IV2 is the low level VL. Accordingly, a storage current Istore flows in the transistor 41, the transistor 31, the transistor 32, and the storage device 37 in the inverter IV1 in this order.

At this time, the storage current Istore flows in the storage device 37 from the pinned layer P to the free layer F, which allows the direction of the magnetization FJ of the free layer F to be in an opposite direction to the direction of the magnetization PJ of the pinned layer P (antiparallel state), a result of which the resistance state of the storage device 37 becomes the high resistance state RH. In this way, owing to the storage operation M3, the resistance state of one of the storage devices 37 and 38 becomes the high resistance state RH.

(Standby Operation M4)

Thereafter, the semiconductor circuit 1 performs, after the storage operation M3, the standby operation M4 by turning OFF the power supply transistor 12.

As illustrated in FIG. 5, in the standby operation M4, the controller 11 allows the voltage of the power supply control signal SPG to be a high level. This causes the power supply transistor 12 (FIG. 1) to be turned OFF, causing suspension of the power supply to the memory cell 30. This allows the voltages of the signals SCL1, SCL2, and SRST each to be a low level. This causes the transistors 31 to 36 to be turned OFF, as illustrated in FIG. 6D. Further, the voltage of the signal SCTRL becomes the low level VL. At this time, the resistance states of the storage devices 37 and 38 are maintained.

(Re-Storage Operation M5)

Description is given next of a case where the normal operation M1 is performed by turning ON the power supply transistor 12. In this case, the semiconductor circuit 1 first turns ON the power supply transistor 12, and thereafter, performs the re-storage operation M5, to thereby allow the information stored in the storage devices 37 and 38 to be stored in the SRAM circuit 40.

As illustrated in FIG. 5, in the re-storage operation M5, the controller 11 allows the voltage of the power supply control signal SPG to be a low level. This causes the power supply transistor 12 (FIG. 1) to be turned ON, causing the power supply voltage VDD to be supplied to the memory cell 30. Further, the driver 23 allows the voltages of the signals SCL1 and SCL2 each to be a high level and allows the voltage of the signal SRST to be a low level. This causes the respective transistors 31, 32, 34, and 35 to be turned ON and causes the respective transistors 33 and 36 to be turned OFF, as illustrated in FIG. 6E. Further, the driver 22 allows the voltage of the signal SCTRL to be the low level VL (the ground level). This allows the output terminal of the inverter IV1 to be grounded through the storage device 37 and allows the output terminal of the inverter IV2 to be grounded through the storage device 38. At this time, the resistance states of the storage devices 37 and 38 differ from each other, which causes the voltage state in the SRAM circuit 40 to be determined depending on the resistance states of the storage devices 37 and 38. In this example, the resistance state of the storage device 37 is the high resistance state RH, and the resistance state of the storage device 38 is the low resistance state RL. Accordingly, the output terminal of the inverter IV1 is pulled down with the high resistance value, and the output terminal of the inverter IV2 is pulled down with the low resistance value. This causes the output voltage VN1 of the inverter IV1 to be the high level VH and causes the output voltage VN2 of the inverter IV2 to be the low level VL. In this way, the SRAM circuit 40 stores information depending on the information stored in the storage devices 37 and 38 in the memory cell 30.

Thereafter, the semiconductor circuit 1 performs the normal operation M1 as described using FIGS. 5 and 6A.

As described, in the semiconductor circuit 1, in a case where the standby operation M4 is performed by turning OFF the power supply transistor 12, for example, the semiconductor circuit 1 performs the storage operation M3 immediately before turning OFF the power supply transistor 12, to thereby allow the information stored in the SRAM circuit 40 as volatile memory to be stored in the storage devices 37 and 38 as non-volatile memory. Thereafter, in a case where the normal operation M1 is performed by turning ON the power supply transistor 12, for example, the semiconductor circuit 1 performs the re-storage operation M5 immediately after turning ON the power supply transistor 12, to thereby allow the information stored in the storage devices 37 and 38 to be stored in the SRAM circuit 40. This allows the state of each of the memory cells 30 to return to a state before suspension of power supply in a short period of time, after re-starting power supply, in the semiconductor circuit 1.

At this time, in the semiconductor circuit 1, the reset operation M2 is performed prior to the storage operation M3 to thereby reset the states of the storage devices 37 and 38 to a predetermined resistance state in advance, making it possible to stably store written information as compared to a comparative example described below.

COMPARATIVE EXAMPLE

Description is given next of a semiconductor circuit 1R according to a comparative example. The present comparative example involves performing the storage operation M3 without performing the reset operation M2 in advance. Similarly to the semiconductor circuit 1 (FIG. 1) according to the present embodiment, the semiconductor circuit 1R includes a memory circuit 20R. The memory circuit 20R includes a memory cell array 21R, a driver 22R, and a driver 23R.

Figure 7:
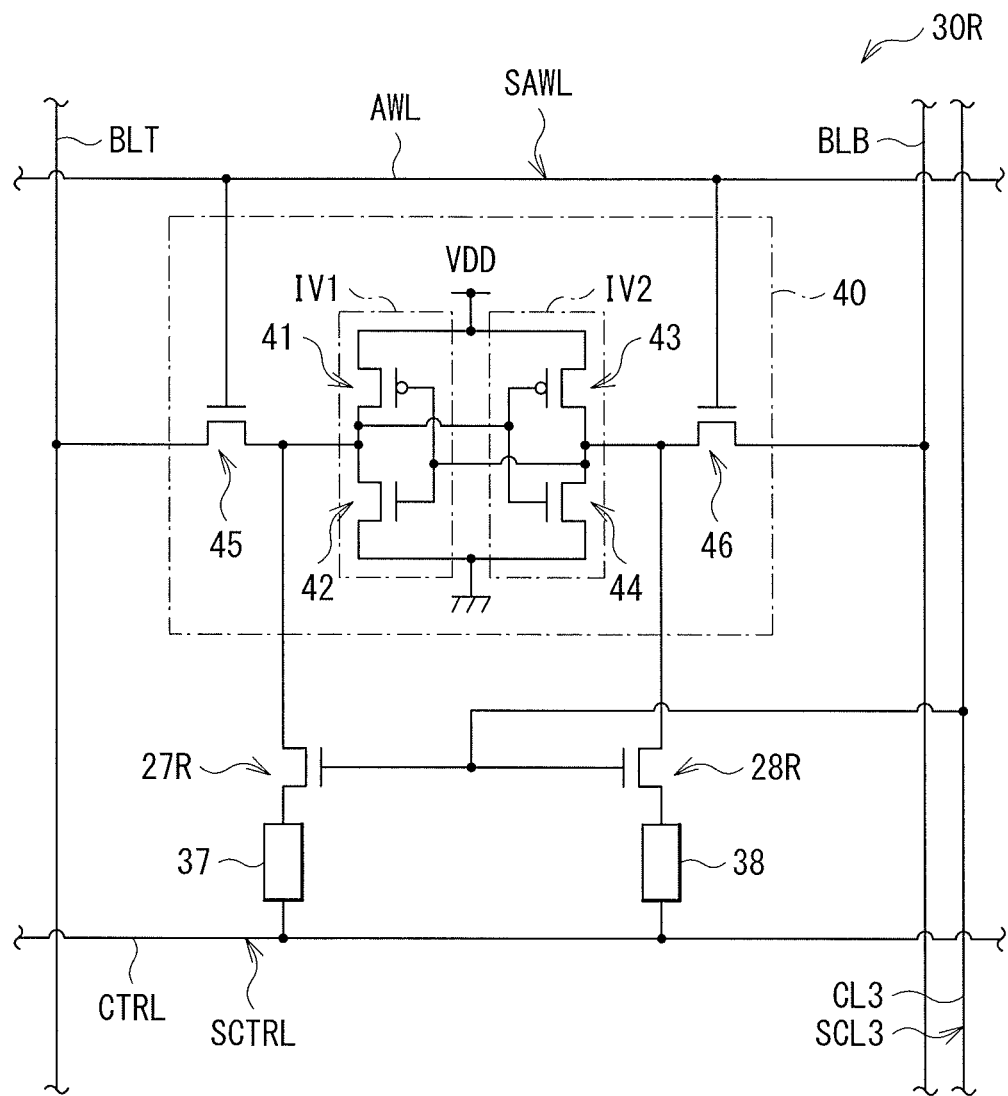
FIG. 7 is a circuit diagram illustrating a configuration example of a memory cell according to a comparative example.

FIG. 7 illustrates a configuration example of a memory cell 30R in the memory cell array 21R. The memory cell array 21R includes the plurality of word lines AWL, the plurality of control lines CTRL, the plurality of bit lines BLT, the plurality of bit lines BLB, and a plurality of control lines CL3. The word lines AWL each include one end coupled to the driver 22R, allowing the driver 22R to apply the signal SAWL to the word lines AWL. The control lines CTRL each include one end coupled to the driver 22R, allowing the driver 22R to apply the signal SCTRL to the control lines CTRL. The bit lines BLT each include one end coupled to the driver 23R, and the bit lines BLB each include one end coupled to the driver 23R. The control lines CL3 each include one end coupled to the driver 23R, allowing the driver 23R to apply a signal SCL3 to the control lines CL3.

The memory cell 30R includes the SRAM circuit 40, transistors 27R and 28R, and the memory devices 37 and 38. The transistors 27R and 28R are the N-type MOS transistors. The transistor 27R includes a gate coupled to the control line CL3, a drain coupled to the drains of the transistors 41, 42, and 45 and the gates of the transistors 43 and 44, and a source coupled to one end of the storage device 37. The transistor 28R includes a gate coupled to the control line CL3, a drain coupled to the drains of the transistors 43, 44, and 46 and the gates of the transistors 41 and 42, and a source coupled to one end of the storage device 38.

The semiconductor circuit 1R causes the SRAM circuit 40 as volatile memory to store information in the normal operation M1. Further, in the case where the standby operation M4 is performed by turning OFF the power supply transistor 12, for example, the semiconductor circuit 1R performs the storage operation M3 immediately before turning OFF the power supply transistor 12, to thereby allow the information stored in the SRAM circuit 40 as volatile memory to be stored in the storage devices 37 and 38 as non-volatile memory.

Figure 8:
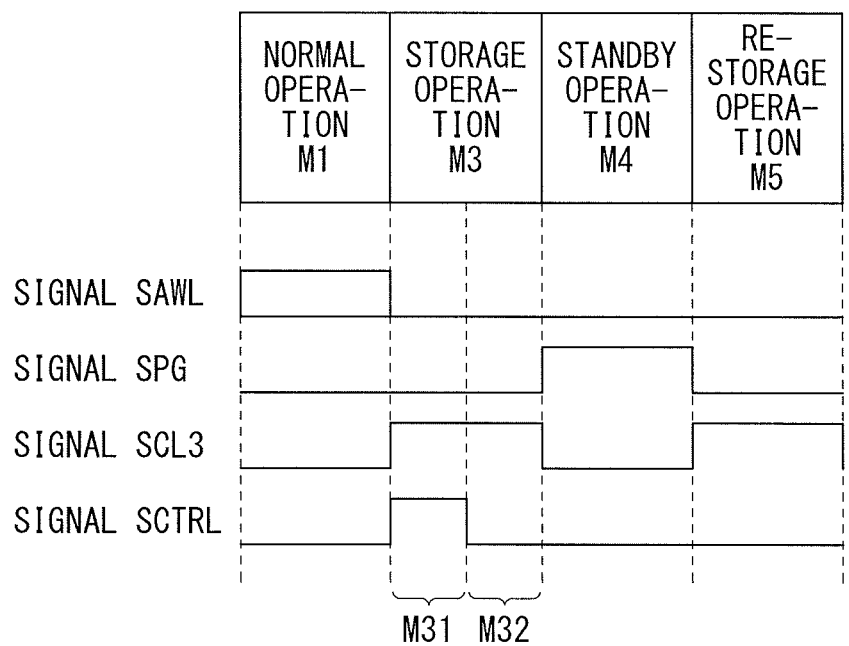
FIG. 8 is a view describing an operation example of the memory cell illustrated in FIG. 7.
Figure 9A:
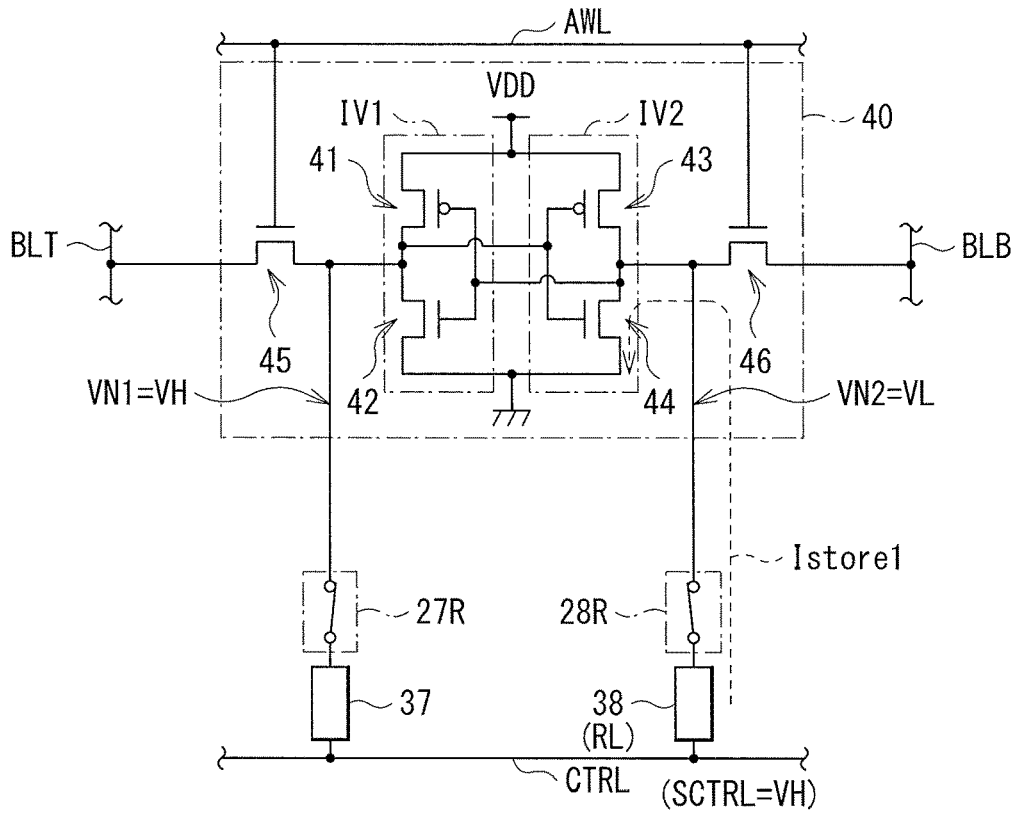
FIG. 9A is a circuit diagram illustrating an operation example of the memory cell illustrated in FIG. 7.
Figure 9B:
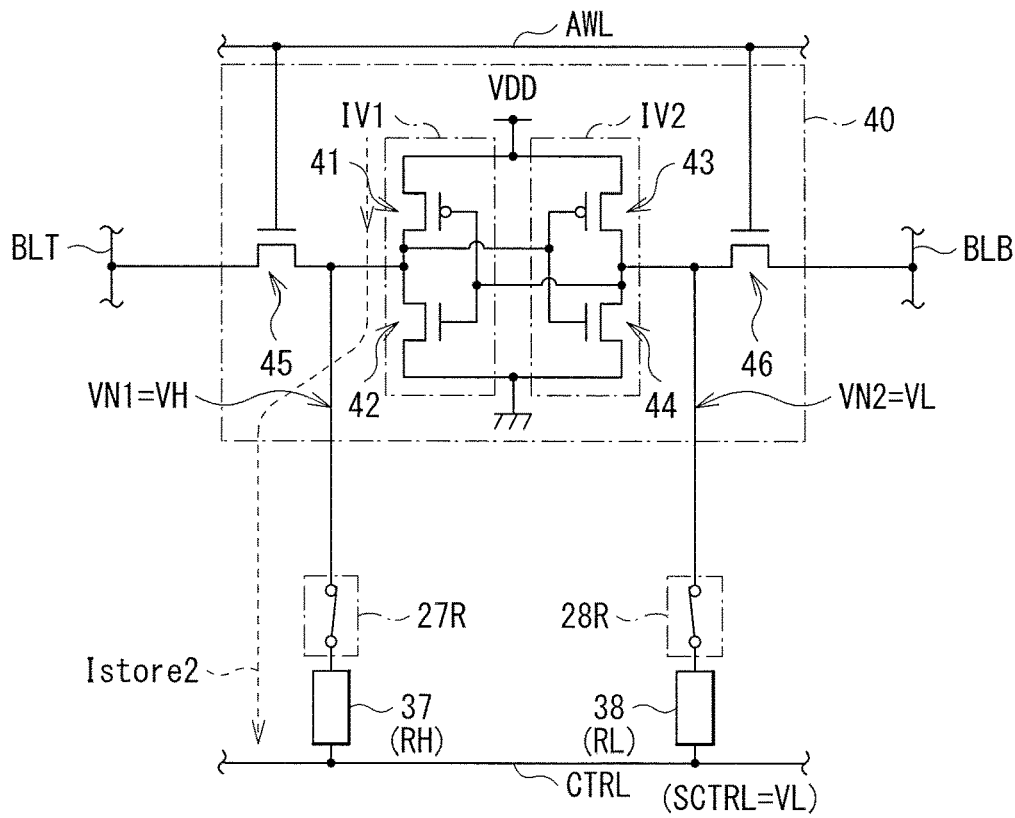
FIG. 9B is another circuit diagram illustrating an operation example of the memory cell illustrated in FIG. 7.

FIG. 8 illustrates an operation example of the memory cell 30R of interest, in the semiconductor circuit 1R. FIGS. 9A and 9B illustrate the states of the storage operation M3. In the semiconductor circuit 1R according to the comparative example, the storage operation M3 is performed in two divided operations M31 and M32. First, as illustrated in FIG. 8, the driver 23R allows the voltage of the signal SCL3 to be a high level, in the storage operation M3 (operations M31 and M32). This causes the transistors 27R and 28R to be turned ON, as illustrated in FIGS. 9A and 9B. Further, the driver 22R allows the voltage of the signal SCTRL to be the high level VH, in the first operation M31 in the storage operation M3. This causes, in the memory cell 30R, as illustrated in FIG. 9A, a current to flow in one of the storage devices 37 and 38, depending on the information stored in the SRAM circuit 40. In this example, the output voltage VN1 of the inverter IV1 is the high level VH, and the output voltage VN2 of the inverter IV2 is the low level VL. Accordingly, a storage current Istore1 flows in the storage device 38, the transistor 28R, and the transistor 44, in this order. At this time, the storage current Istore1 flows in the storage device 38 from the free layer F to the pinned layer P, which allows the direction of the magnetization FJ of the free layer F to be in the same direction as the direction of the magnetization PJ of the pinned layer P (the parallel state), a result of which the resistance state of the storage device 38 becomes the low resistance state RL. Next, the driver 22R allows the voltage of the signal SCTRL to be the low level VL (the ground level) in the subsequent operation M32. This causes, in the memory cell 30R, as illustrated in FIG. 9B, a current to flow in the other one of the storage devices 37 and 38, depending on the information stored in the SRAM circuit 40. In this example, a storage current Istore2 flows in the transistor 41, the transistor 27R, and the storage device 37, in this order. At this time, the storage current Istore2 flows in the storage device 37 from the pinned layer P to the free layer F, which allows the direction of the magnetization FJ of the free layer F to be in the opposite direction to the direction of the magnetization PJ of the pinned layer P (the antiparallel state), a result of which the resistance state of the storage device 37 becomes the high resistance state RH.

In the semiconductor circuit 1R according to the comparative example, the storage operation M3 involves performing the two operations M31 and M32. In this case, the two operations M31 and M32 allow the storage devices 37 and 38 each to store one piece of information. Accordingly, the time period assigned to each of the two operations M31 and M32 becomes short, which may cause insufficient write of information, thus leading to a write error.

In contrast, the semiconductor circuit 1 according to the present embodiment includes the transistors 33 and 36, and the reset operation M2 is performed in advance before the storage operation M3, which makes it possible to perform the storage operation M3 in a single operation. Accordingly, it is possible to ensure write time period to the storage devices 37 and 38, leading to the reduction in the possibility of the occurrence of the write error.

[Effects]

As described, the present embodiment includes the transistors 33 and 36, and the reset operation is performed in advance before the storage operation. Therefore, it is possible to reduce the possibility of the occurrence of the write error.

Modification Example 1-1

Figure 10:
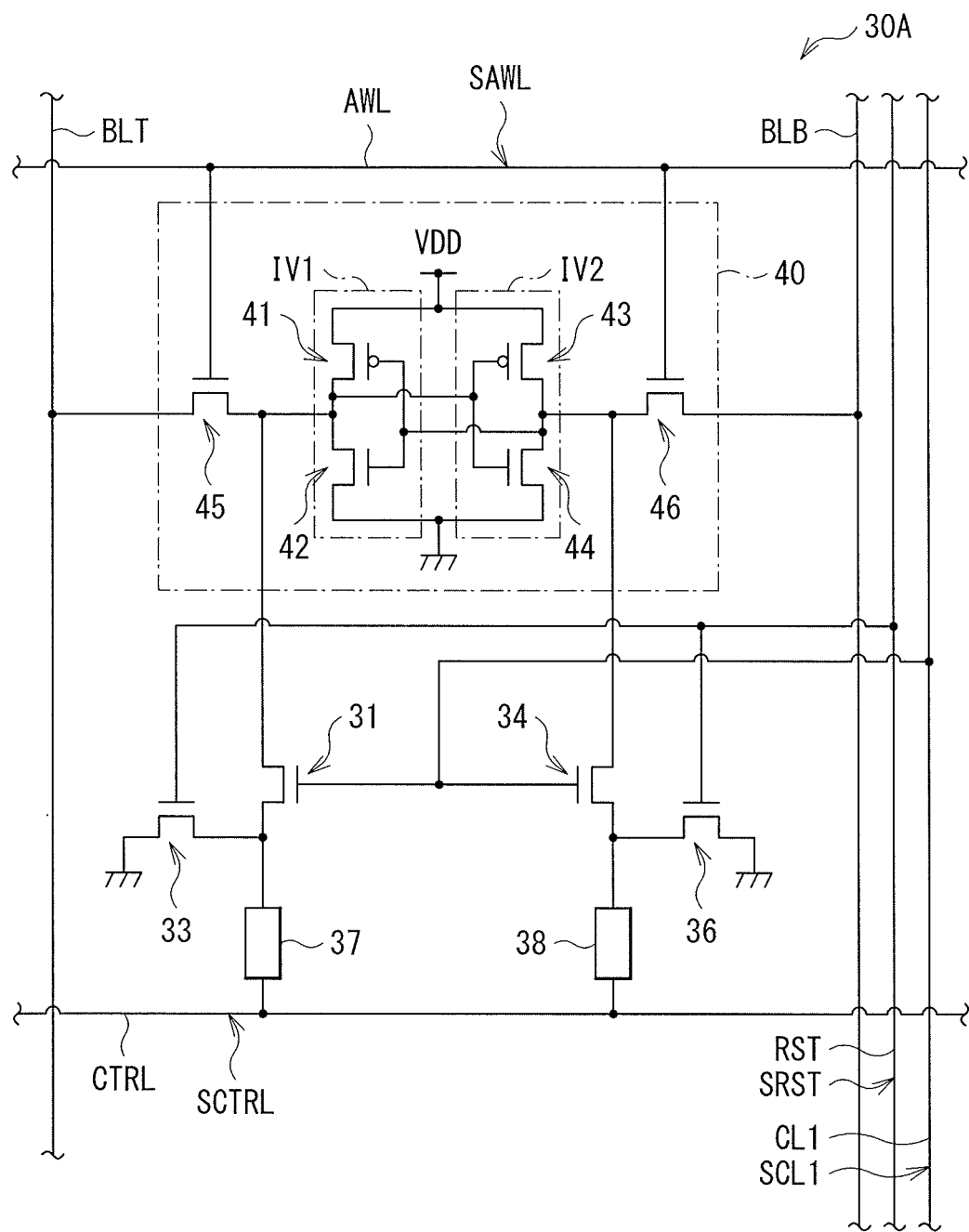
FIG. 10 is a circuit diagram illustrating a configuration example of a memory cell according to a modification example of the first embodiment.
Figure 11:
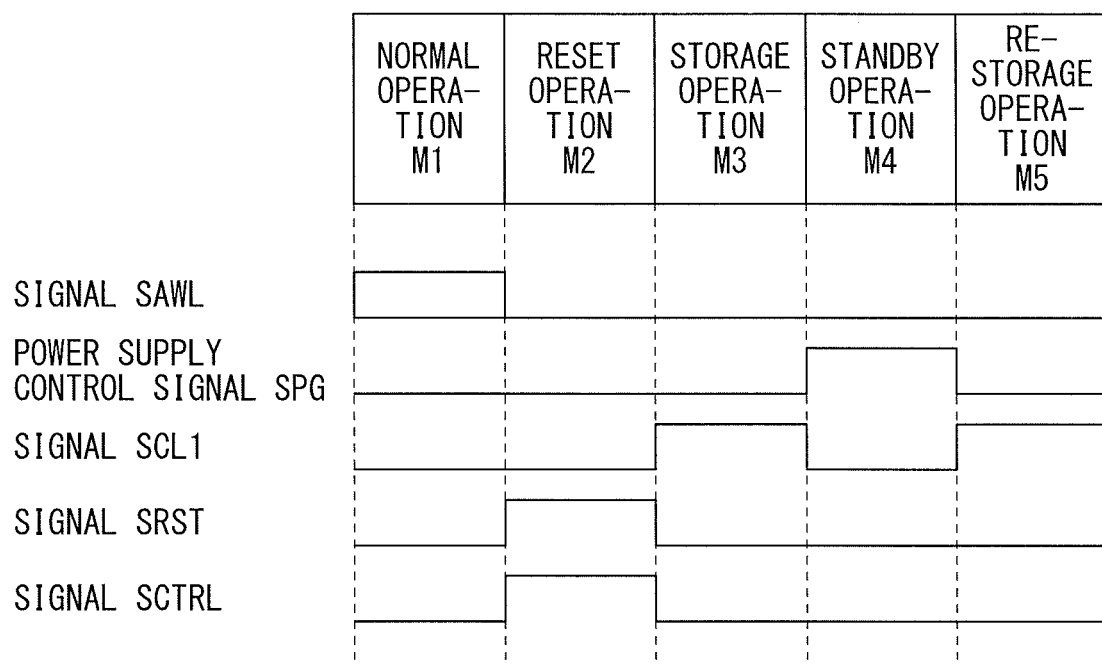
FIG. 11 is a view describing an operation example of the memory cell illustrated in FIG. 10.

In the foregoing embodiment, the transistors 32 and 35 are provided in the memory cell 30 (FIG. 2). However, this is non-limiting. Instead, the transistors 32 and 35 may be omitted, as illustrated in a memory cell 30A of FIG. 10. FIG. 11 illustrates an operation example of the memory cell 30A. This makes it possible to simplify the configuration of the memory cell 30A, leading to the reduction in area of the memory cell 30A.

In contrast, the memory cell 30 of the foregoing embodiment includes the transistors 32 and 35, which makes it possible to reduce leakage current. This allows, for example, the information written in the storage devices 38 and 38 to be stably maintained.

Modification Example 1-2

Figure 12:
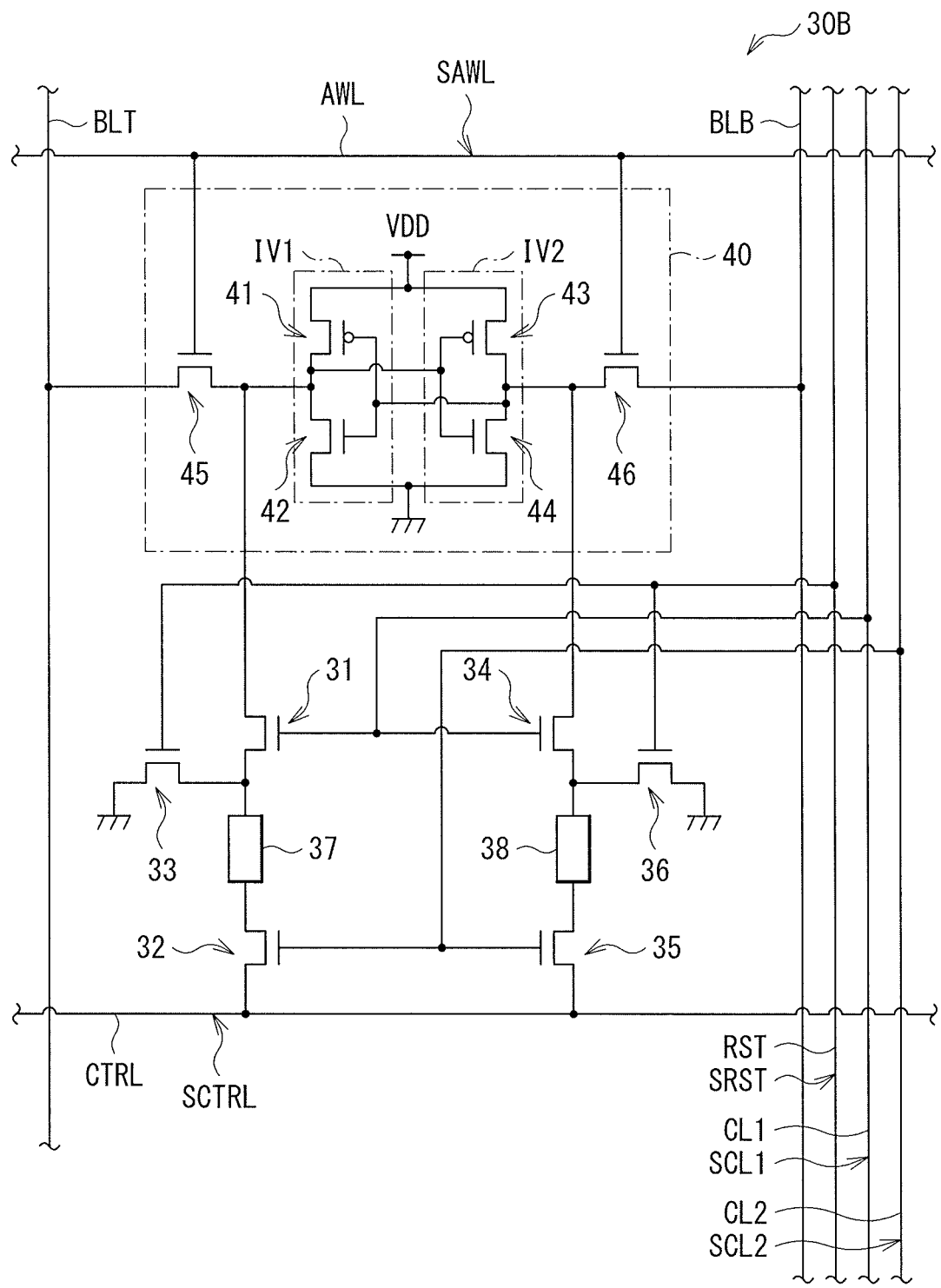
FIG. 12 is a circuit diagram illustrating another configuration example of a memory cell according to another modification example of the first embodiment.

In the foregoing embodiment, the other ends of the storage devices 37 and 38 each are coupled to corresponding one of the control lines CTRL in the memory cell 30 (FIG. 2). However, this is non-limiting. Instead, as illustrated in the memory cell 30B of FIG. 12, the location of the transistor 32 may be replaced with the location of the storage device 37 and the location of the transistor 35 may be replaced with the location of the storage device 38 in the memory cell 30 (FIG. 2). In this example, the storage device 37 includes one end coupled to the source of the transistor 31 and the drain of the transistor 33, and the other end coupled to the drain of the transistor 32. The transistor 32 includes the gate coupled to the control line CL2, the drain coupled to the other end of the storage device 37, and the source coupled to the control line CTRL. The storage device 38 includes one end coupled to the source of the transistor 34 and the drain of the transistor 36 and the other end coupled to the drain of the transistor 35. The transistor 35 includes the gate coupled to the control line CL2, the drain coupled to the other end of the storage device 38, and the source coupled to the control line CTRL.

Modification Example 1-3

Figure 13:
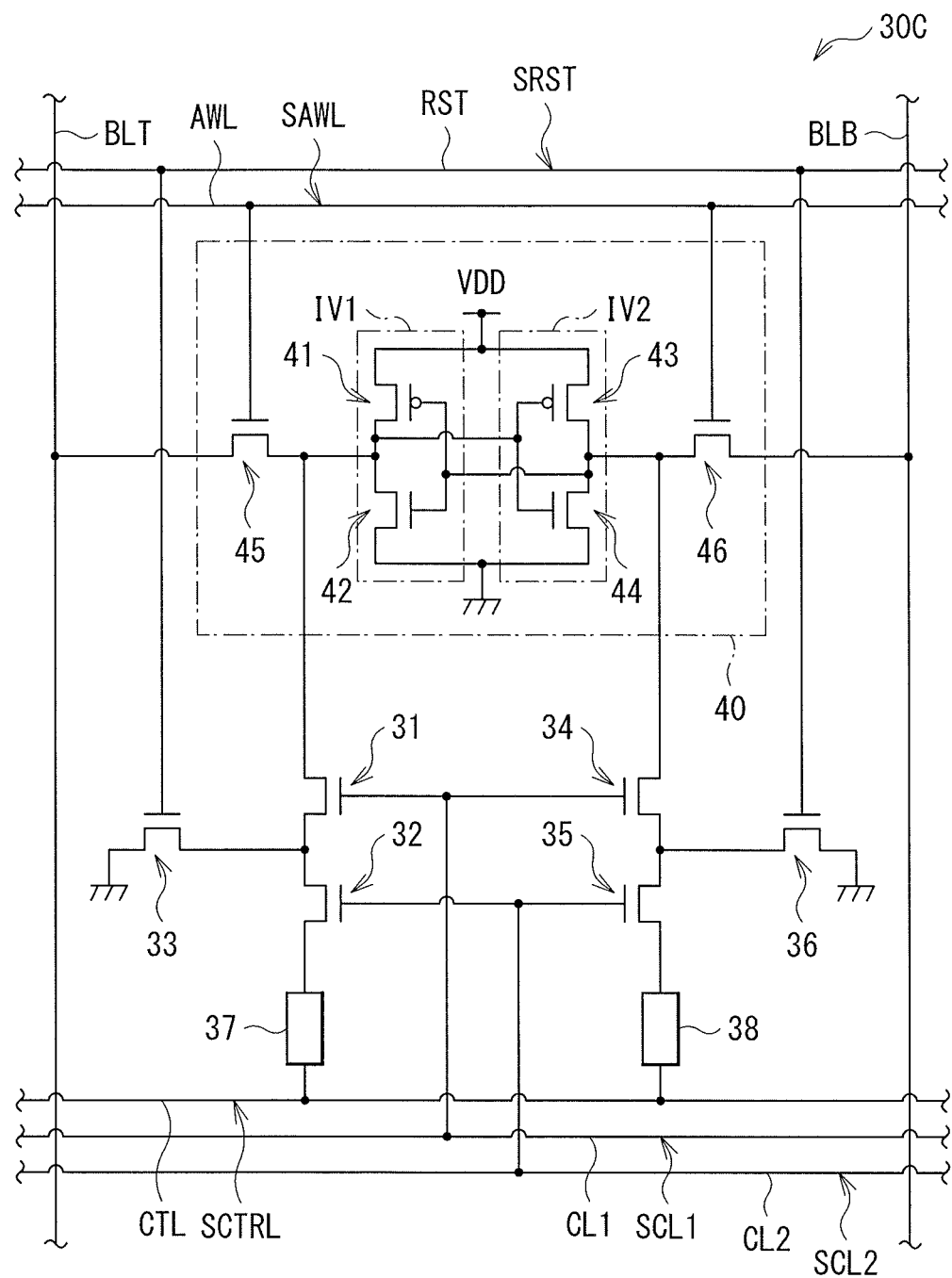
FIG. 13 is a circuit diagram illustrating a configuration example of a memory cell according to another modification example of the first embodiment.

In the foregoing embodiment, the word lines AWL and the control lines CTRL extend in the lateral direction in FIGS. 2 and 3, and the bit lines BLT and BLB and the control lines RST, CL1, and CL2 extend in the vertical direction in FIGS. 2 and 3. However, this is non-limiting. For example, a memory cell 30C as illustrated in FIG. 13 may be provided. A memory cell array 21C including the memory cell 30 according to the present modification example includes the word lines AWL, the control lines CTRL, the control lines RST, CL1, and CL2, and the bit lines BLT and BLB. In this example, the control lines RST extend in the lateral direction in FIG. 13. The control lines RST each include one end coupled to the driver 22C according to the present modification example. The control lines CL1 extend in the lateral direction in FIG. 13. The control lines CL1 each include one end coupled to the driver 22C. The control lines CL2 extend in the lateral direction in FIG. 13. The control lines CL2 each include one end coupled to the driver 22C.

Modification Example 4

In the foregoing embodiment, the storage devices 37 and 38 are used which have the bottom pin structures in which the free layer F, the tunnel barrier layer I, and the pinned layer P are stacked in this order from the top. However, this is non-limiting. In the following, description is given of the present modification example.

Figure 14:
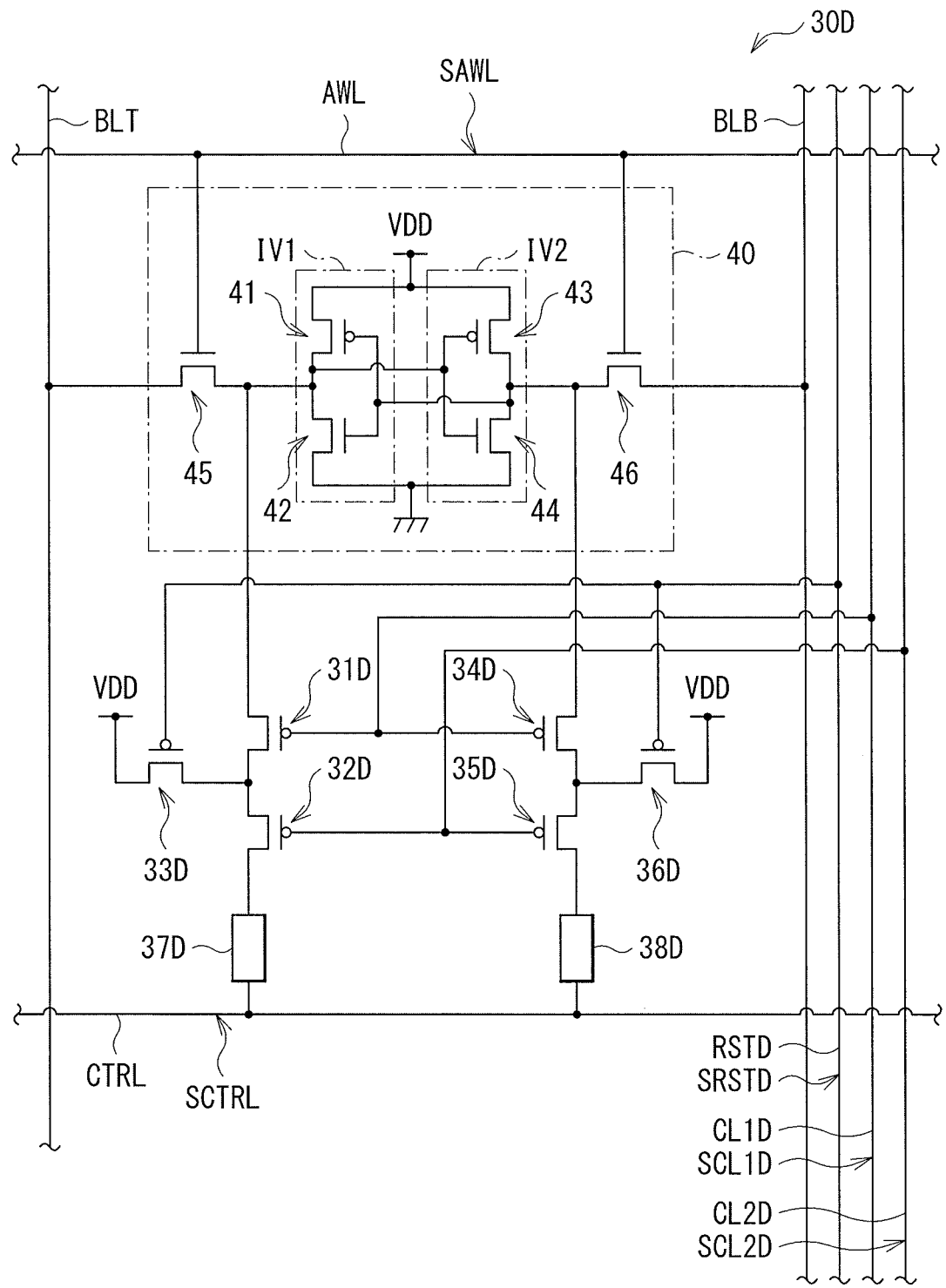
FIG. 14 is a circuit diagram illustrating a configuration example of a memory cell according to another modification example of the first embodiment.

FIG. 14 illustrates a configuration example of a memory cell 30D according to the present modification example. A memory cell array 21D including the memory cell 30D includes the word lines AWL, the control lines CTRL, the bit lines BLT, the bit lines BLB, control lines RSTD, control lines CL1D, and control lines CL2D. The memory cell 30D includes the SRAM circuit 40, transistors 31D to 36D, and storage devices 37D and 38D.

The transistors 31D to 36D are the P-type MOS transistors. The transistors 31D to 36D respectively correspond to the transistors 31 to 36 according to the foregoing embodiment. The transistors 33D and 36D each include a source to which the power supply voltage VDD is supplied.

Figure 15:
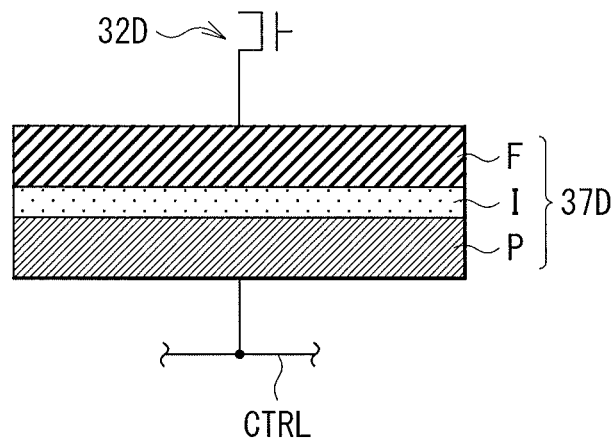
FIG. 15 is a view describing a configuration example of a storage device illustrated in FIG. 14.

FIG. 15 illustrates a configuration example of the storage device 37D. The storage device 37D includes the pinned layer P, the tunnel barrier layer I, and the free layer F. In this example, the free layer F is coupled to the transistor 32D that is disposed on lower layer side. The pinned layer P is coupled to the control line CTRL that is disposed on upper-layer side. In other words, the storage device 37D has the so-called top pin structure in which the pinned layer P, the tunnel barrier layer I, and the free layer F are stacked in this order from the top. It is to be noted that the storage device 37D is exemplified above for description and that the same also applies to the storage device 38D.

This configuration also makes it possible to obtain a similar effect to the effect derived from the case of the foregoing embodiment.

Modification Example 1-5

Figure 16:
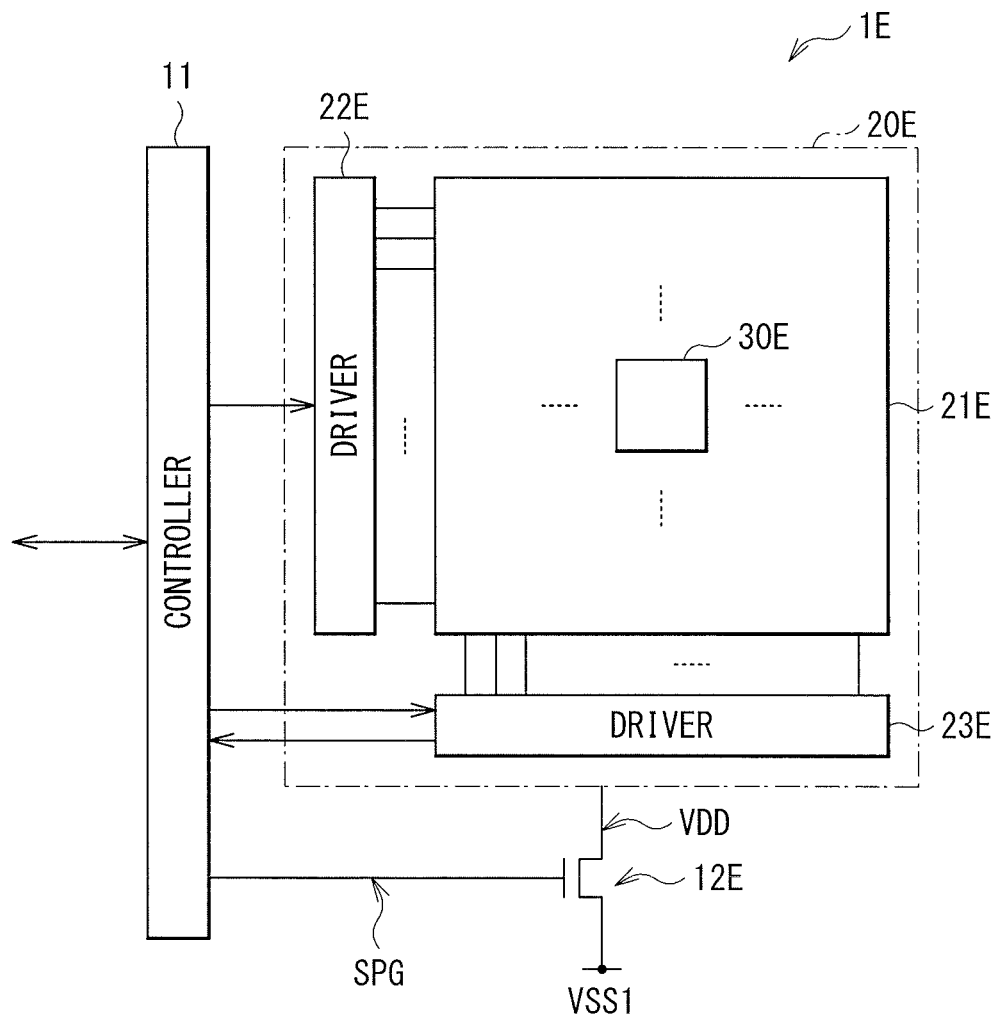
FIG. 16 is a block diagram illustrating a configuration example of a semiconductor circuit according to another modification example of the first embodiment.

In the foregoing embodiment, the power supply transistor 12 is configured with use of the P-type MOS transistor. However, this is non-limiting. Instead, for example, a power transistor with use of the N-type MOS transistor may be provided, as illustrated in a semiconductor circuit 1E of FIG. 16. The semiconductor circuit 1E includes a power supply transistor 12E and a memory circuit 20E. In this example, the power supply transistor 12E is the N-type MOS transistor. The power supply transistor 12E includes a gate to which the power supply control signal SPG is supplied, a drain coupled to the memory circuit 20E, and a source to which a ground voltage VSS1 is supplied. With this configuration, in a case where the memory circuit 20E is used in the semiconductor circuit 1E, the power supply transistor 12E is turned ON to supply the ground voltage VSS1 as the ground voltage VSS to the memory circuit 20E. Further, in a case where the memory circuit 20E is not used in the semiconductor circuit 1E, the power supply transistor 12E is turned OFF. The memory circuit 20E includes a memory cell array 21E and drivers 22E and 23E. The memory cell array 21E includes a plurality of memory cells 30E. In a case where a storage device having the bottom pin structure is used in the memory cell 30E, for example, a configuration may be used in which the storage devices 37D and 38D in the memory cell 30D illustrated in FIG. 14 are respectively replaced with the storage devices 37 and 38 each having the bottom pin structure, for example. Further, in a case where a storage device having the top pin structure is used in the memory cell 30E, for example, a configuration may be used in which the storage devices 37 and 38 in the memory cell 30 illustrated in FIG. 2 are respectively replaced with the storage devices 37D and 38D each having the top pin structure.

Modification Example 1-6

Figure 17:
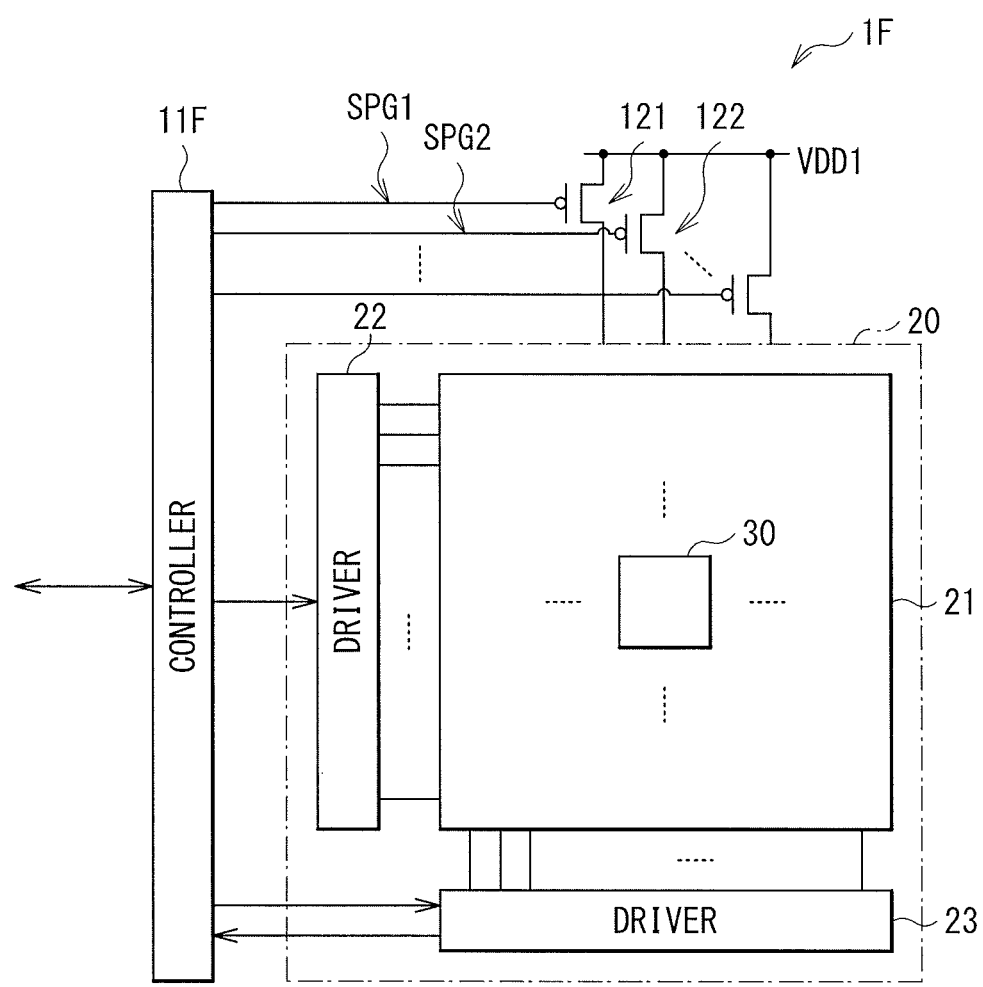
FIG. 17 is a block diagram illustrating a configuration example of a semiconductor circuit according to another modification example of the first embodiment.

In the foregoing embodiment, a single power supply transistor 12 is provided. However, this is non-limiting. Instead, as illustrated in a semiconductor circuit 1F of FIG. 17, a plurality of power supply transistors may be provided. The semiconductor circuit 1F includes a plurality of transistors 121, 122 . . . etc. A controller 11F supplies the power supply control signals SPG1, SPG2 . . . etc. to the power supply transistors 121, 122 . . . etc. respectively, to turn ON or OFF the power supply transistors 121, 122 . . . etc., to thereby control power supply to the memory circuit 20. The plurality of the power supply transistors 121, 122 . . . etc. are provided so as to correspond to a plurality of respective banks in the memory circuit 20. This makes it possible to control power supply, with a bank unit of the memory circuit 20, in the semiconductor circuit 1F.

Modification Example 1-7

In the foregoing embodiment, the storage devices 37 and 38 are configured with use of the magnetic tunnel junction device of the spin transfer torque. However, this is non-limiting. Any device may be used so long as the device makes a reversible change in the resistance state that depends on the direction of the current flowing therein. Examples may include a ferroelectric memory device, and a memory device that is configured by stacking an ion source layer and a resistance variable layer and that is used in an ARAM (atomic random access memory).

OTHER MODIFICATION EXAMPLES

Furthermore, two or more of the modification examples may be combined.

2. Second Embodiment

Description is given next of a semiconductor circuit 2 according to a second embodiment. The present embodiment differs from the foregoing first embodiment in the method of the storage operation M3. It is to be noted that substantially the same components as those of the semiconductor circuit 1 according to the foregoing first embodiment are denoted by the same reference characters, and description thereof is omitted as appropriate.

As illustrated in FIG. 1, the semiconductor circuit 2 includes a memory circuit 50. The memory circuit 50 includes a memory cell array 51, a driver 52, and a driver 53.

The memory cell array 51 includes memory cells 60 disposed in a matrix.

Figure 18:
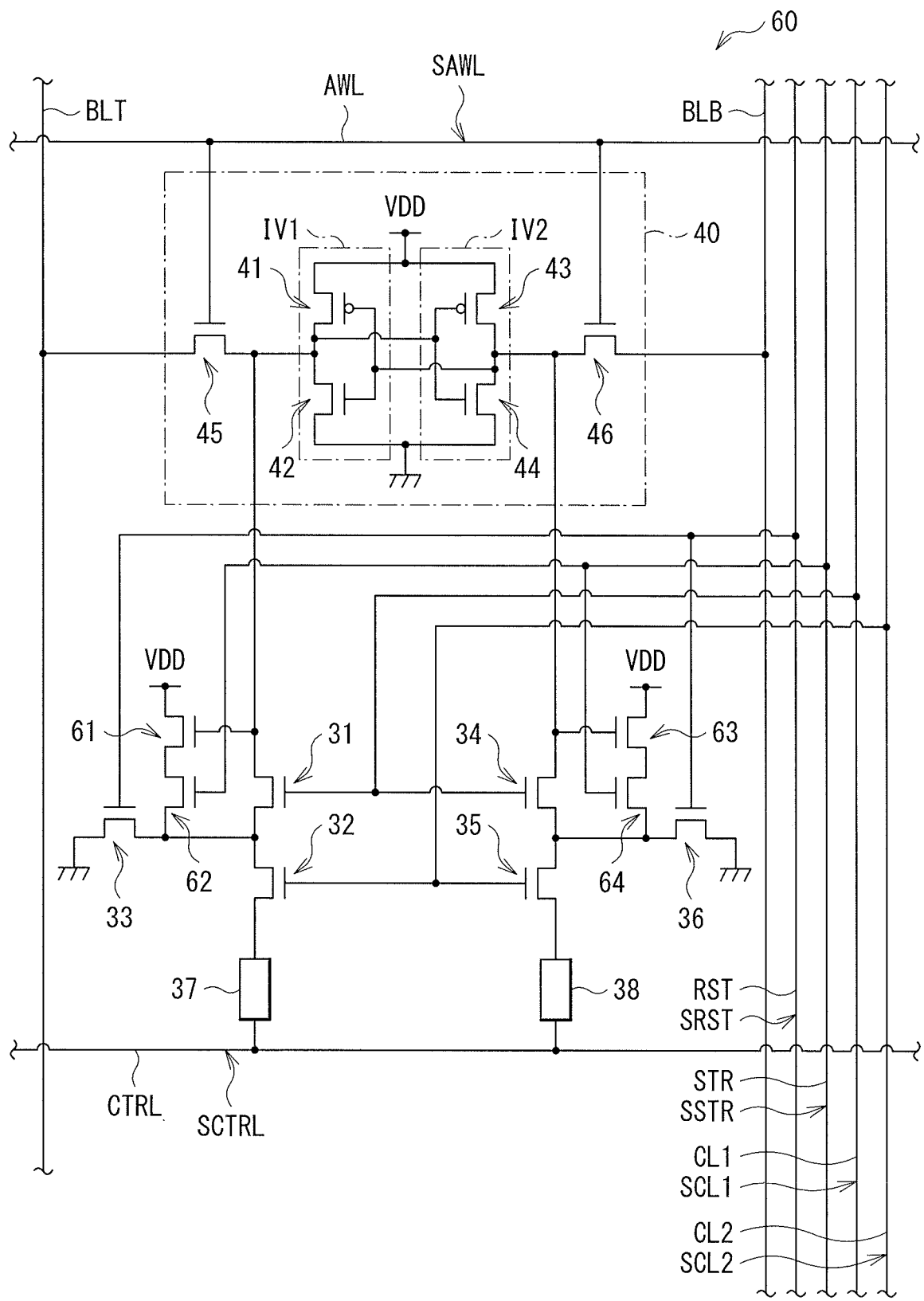
FIG. 18 is a circuit diagram illustrating a configuration example of a memory cell according to a second embodiment.
Figure 19:
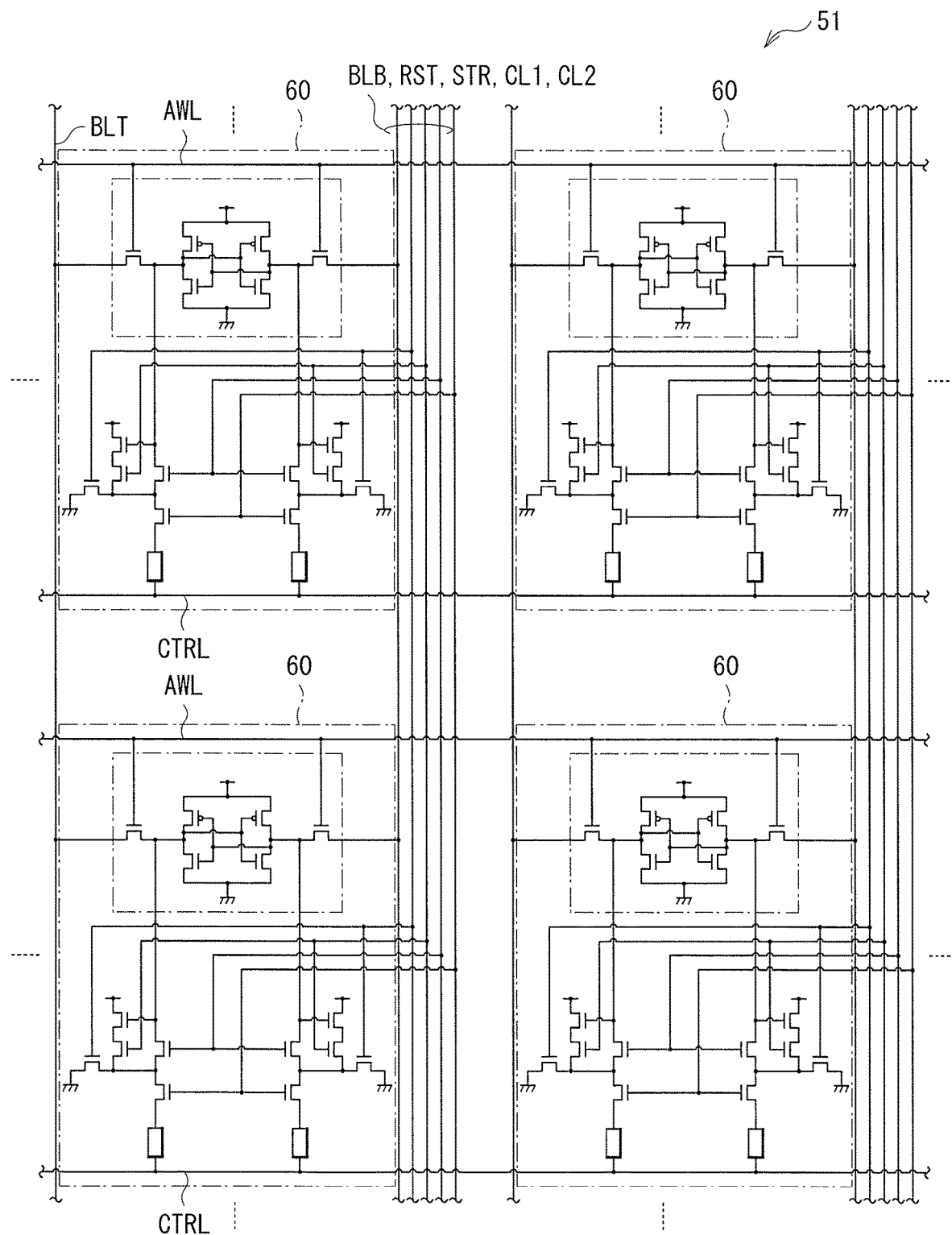
FIG. 19 is a circuit diagram illustrating a configuration example of a memory cell array including the memory cell illustrated in FIG. 18.

FIG. 18 illustrates a configuration example of the memory cell 60. FIG. 19 illustrates a configuration example of the memory cell array 51. The memory cell array 51 includes the plurality of word lines AWL, the plurality of control lines CTRL, the plurality of bit lines BLT, the plurality of bit lines BLB, the plurality of control lines RST, a plurality of control lines STR, the plurality of control lines CL1, and the plurality of control lines CL2. The control lines STR extend in the vertical direction in FIGS. 18 and 19. The control lines STR each include one end coupled to a driver 53, allowing the driver 53 to apply a signal SSTR to the control lines STR.

The memory cell 60 includes the SRAM circuit 40, the transistors 31 to 36, transistors 61 to 64, and the storage devices 37 and 38. The transistors 61 to 64 are the N-type MOS transistors. The transistor 61 includes a gate coupled to the drains of the transistors 41, 42, 45, and 31 and the gates of the transistors 43 and 44, a drain to which the power supply voltage VDD is supplied, and a source coupled to a drain of the transistor 62. The transistor 62 includes a gate coupled to the control line STR, the drain coupled to the source of the transistor 61, and a source coupled to the source of the transistor 31 and the drains of the transistors 32 and 33. The transistor 63 includes a gate coupled to the drains of the transistors 43, 44, 46, and 34 and the gates of the transistors 41 and 42, a drain to which the power supply voltage VDD is supplied, a source coupled to a drain of the transistor 64. The transistor 64 includes a gate coupled to the control line STR, the drain coupled to the source of the transistor 63, and a source coupled to the source of the transistor 34 and the drains of the transistors 35 and 36.

The driver 52 applies the signal SAWL to the word line AWL and applies the signal SCTRL to the control line CTRL on the basis of the control signal supplied from the controller 11.

The driver 53 applies the signal SRST to the control line RST, the signal SSTR to the control line STR, the signal SCL1 to the control line CL, and the signal SCL2 to the control line CL2, on the basis of the control signal supplied from the controller 11. Further, the driver 53 writes information in the memory cell array 51 through the bit lines BLT and BLB on the basis of the control signal and data supplied from the controller 11. Further, the driver 53 reads information from the memory cell array 51 through the bit lines BLT and BLB on the basis of the control signal supplied from the controller 11, to thereby supply the information thus read to the controller 11.

Here, the transistor 61 corresponds to a specific example of a "third transistor" in the disclosure. The transistor 62 corresponds to a specific example of a "fourth transistor" in the disclosure.

Figure 20:
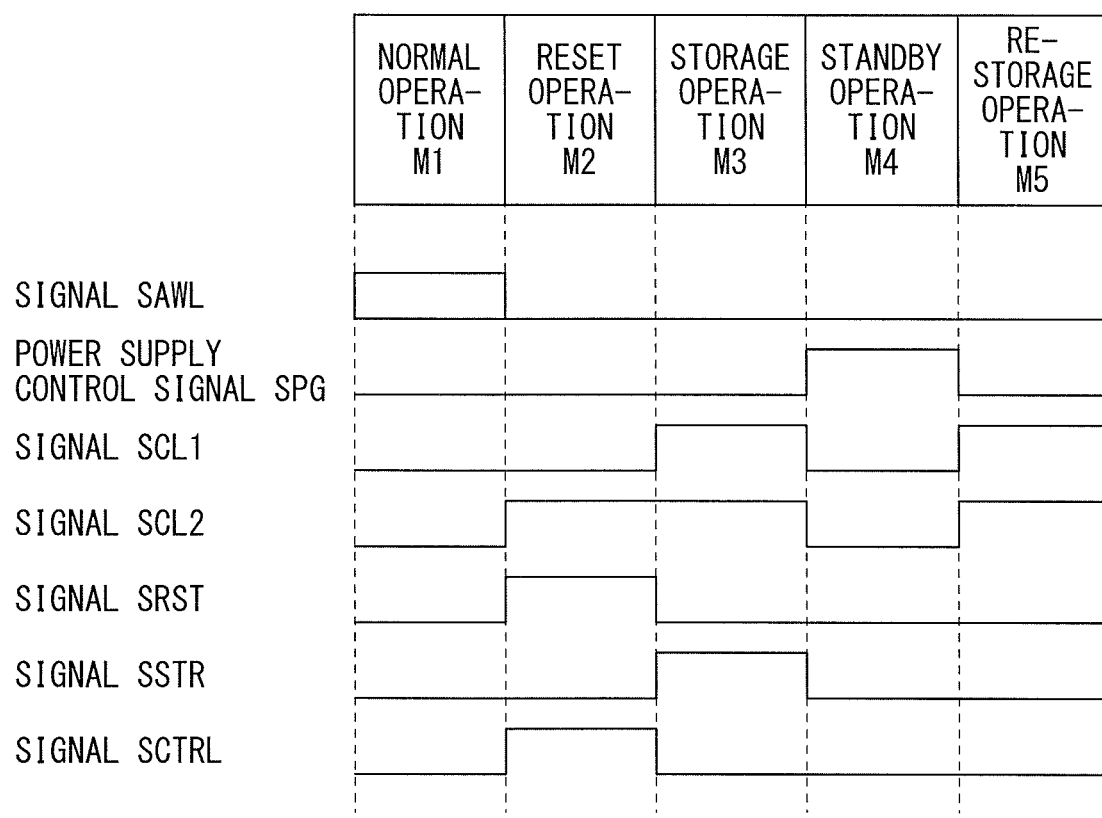
FIG. 20 is a view describing an operation example of the memory cell illustrated in FIG. 18.
Figure 21A:
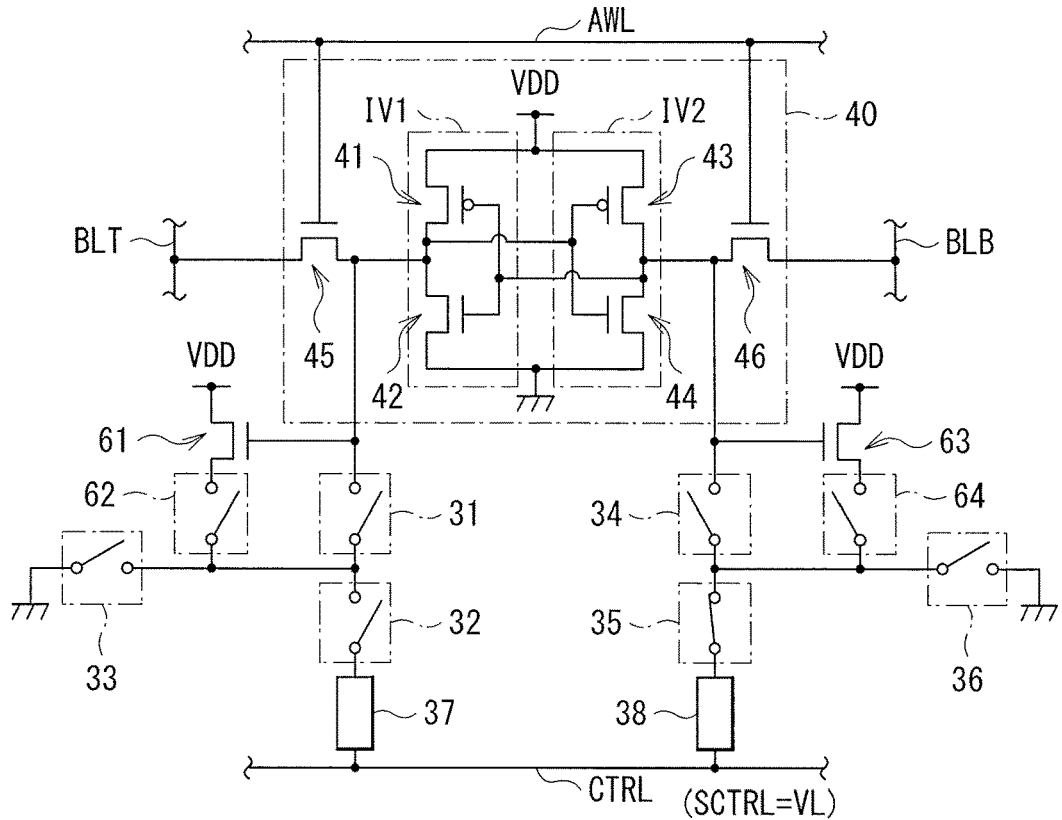
FIG. 21A is a circuit diagram illustrating an operation example of the memory cell illustrated in FIG. 18.
Figure 21B:
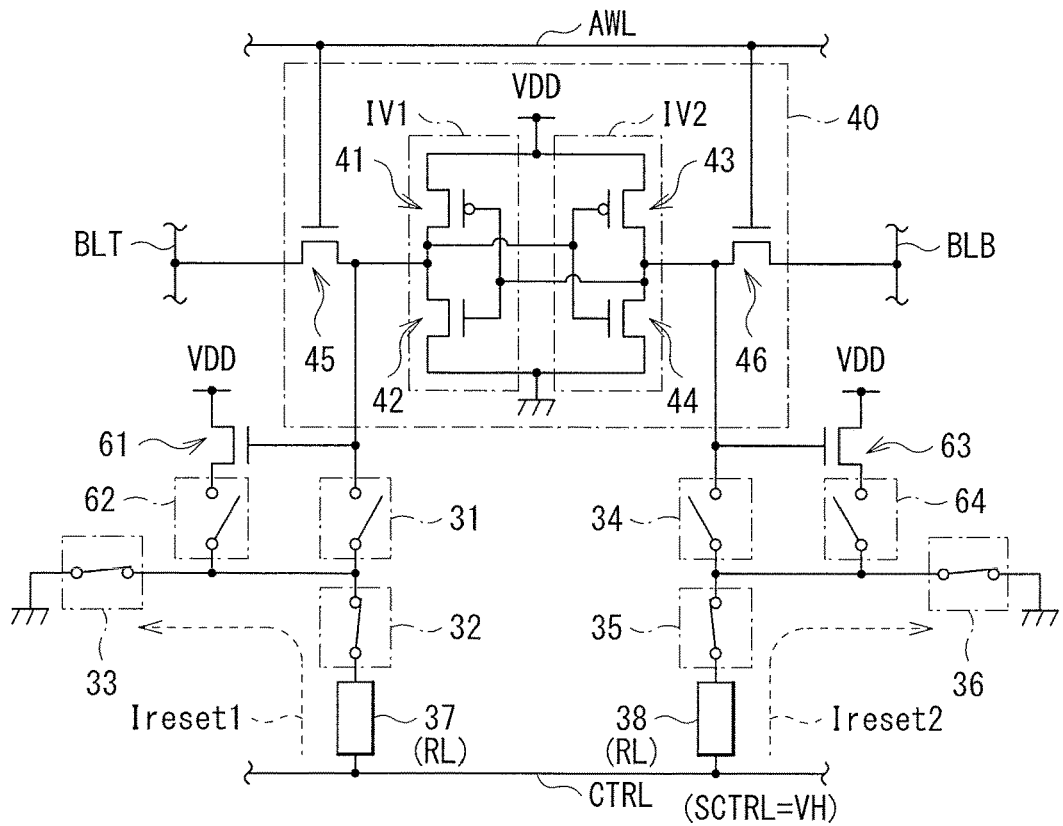
FIG. 21B is another circuit diagram illustrating an operation example of the memory cell illustrated in FIG. 18.
Figure 21C:
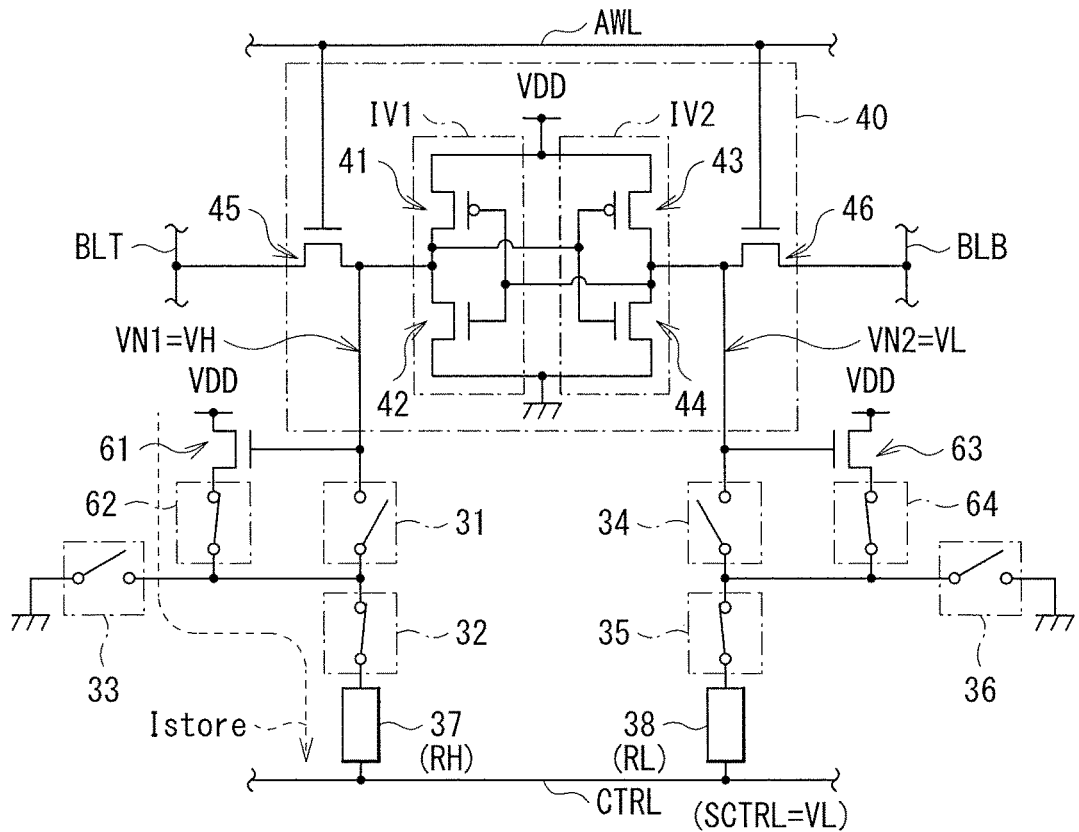
FIG. 21C is another circuit diagram illustrating an operation example of the memory cell illustrated in FIG. 18.
Figure 21D:
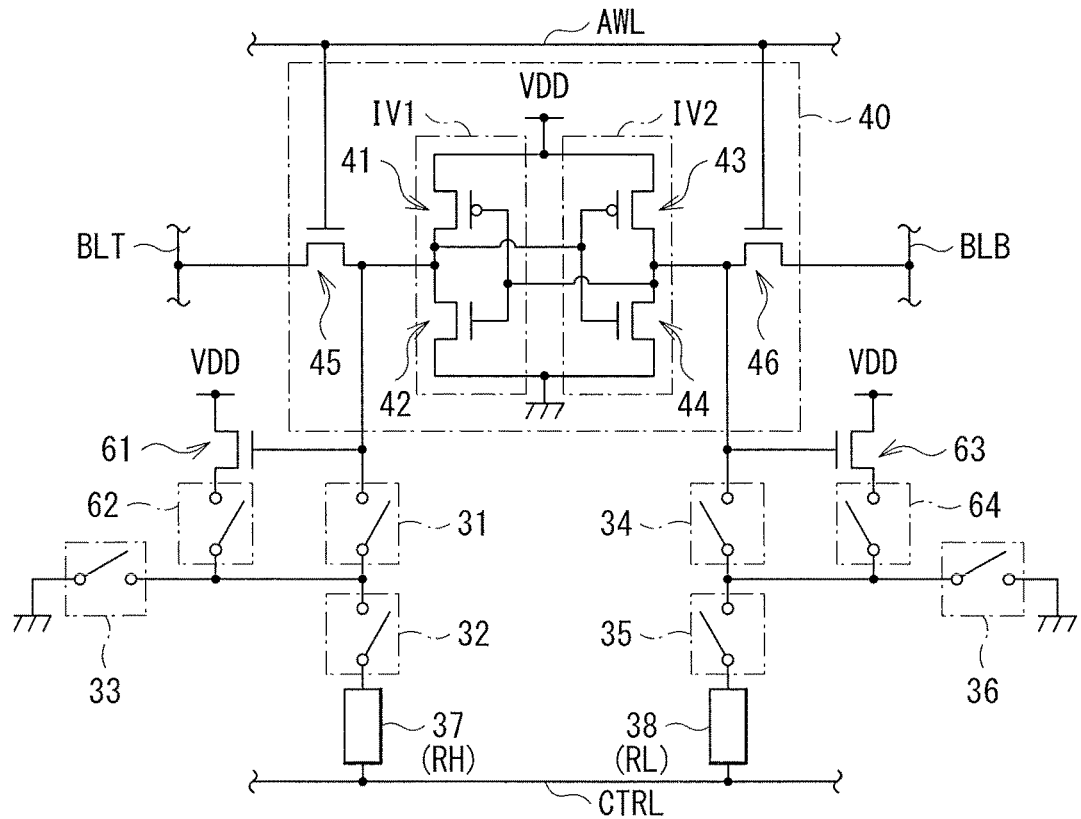
FIG. 21D is another circuit diagram illustrating an operation example of the memory cell illustrated in FIG. 18.
Figure 21E:
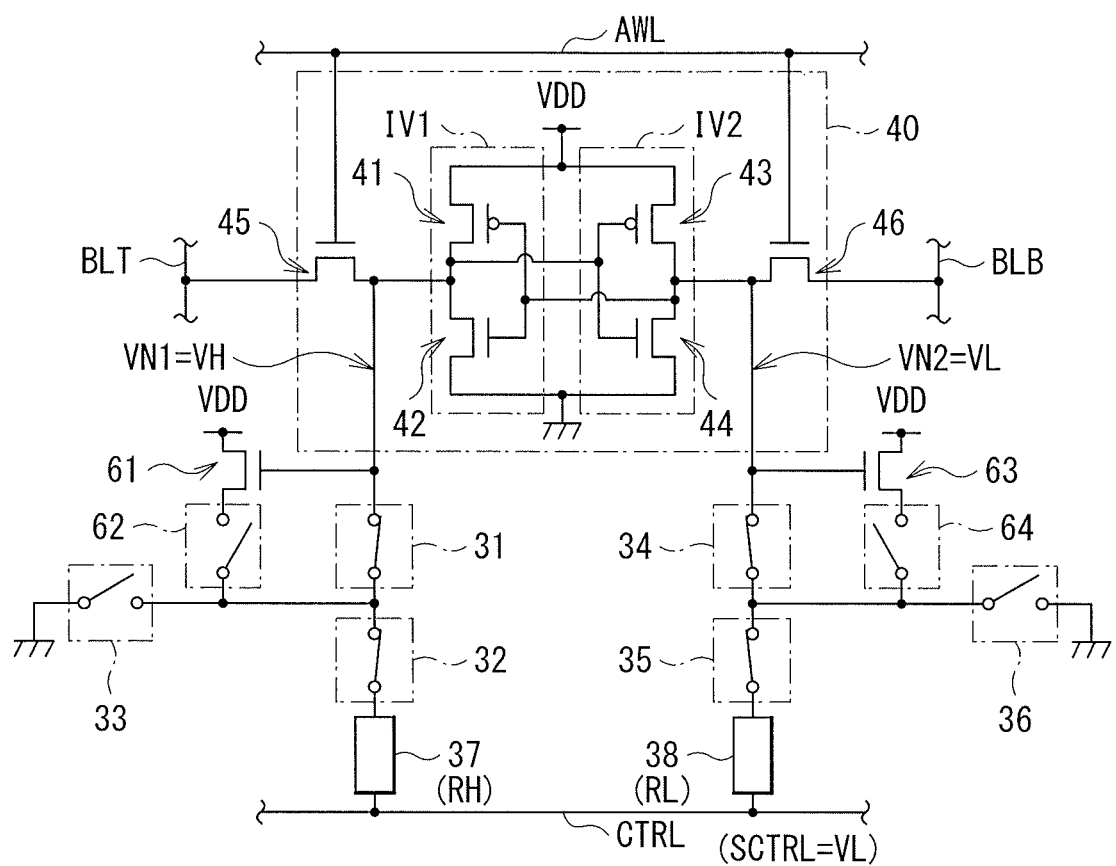
FIG. 21E is another circuit diagram illustrating an operation example of the memory cell illustrated in FIG. 18.

FIG. 20 illustrates an operation example of the memory cell 60 of interest, in the semiconductor circuit 2. FIGS. 21A to 21E illustrate the states of the memory cell 60. FIG. 21A illustrates the state in the normal operation M1. FIG. 21B illustrates the state in the reset operation M2. FIG. 21C illustrates the state in the storage operation M3. FIG. 21D illustrates the state in the standby operation M4. FIG. 21E illustrates the state in the re-storage operation M5.

As illustrated in FIG. 20, in the normal operation M1, the controller 11 allows the voltage of the power supply control signal SPG to be a low level. This causes the power supply transistor 12 (FIG. 1) to be turned ON, causing the power supply voltage VDD to be supplied to the memory cell 60. Further, the driver 53 allows the voltages of the signals SCL1, SCL2, SRST, and SSTR each to be a low level. This causes all of the transistors 31 to 36, 62, and 64 to be turned OFF, as illustrated in FIG. 21A. Further, the driver 52 allows the voltage of the signal SCTRL to be the low level VL (the ground level).

As illustrated in FIG. 20, in the reset operation M2, the driver 53 allows the voltages of the signals SCL2 and SRST each to be a high level and allows the voltages of the signals SCL1 and SSTR each to be a low level. This causes the respective transistors 32, 33, 35, and 36 to be turned ON and causes the respective transistors 31, 34, 62, and 64 to be turned OFF, as illustrated in FIG. 21B. Further, the driver 52 allows the voltage of the signal SCTRL to be the high level VH. This causes the reset current Ireset1 to flow in the storage device 37, the transistor 32, and the transistor 33 in this order, and causes the reset current Ireset2 to flow in the storage device 38, the transistor 35, and the transistor 36 in this order. This allows both of the resistance states of the storage devices 37 and 38 to become the low resistance state RL.

As illustrated in FIG. 20, in the storage operation M3, the driver 53 allows the voltages of the signals SCL2 and SSTR each to be a high level and allows the voltages of the signals SCL1 and SRST each to be a low level. This causes the respective transistors 32, 35, 62, and 64 to be turned ON and causes the respective transistors 31, 33, 34, and 36 to be turned OFF, as illustrated in FIG. 21C. Further, the driver 52 allows the voltage of the signal SCTRL to be the low level VL (the ground level). This allows the current to flow in one of the storage devices 37 and 38, depending on the information stored in the SRAM circuit 40. In this example, the output voltage VN1 of the inverter IV1 is the high level VH, and the output voltage VN2 of the inverter IV2 is the low level VL. Accordingly, the storage current Istore flows in the transistor 61, the transistor 62, the transistor 32, and the storage device 37 in this order. As a result, the resistance state of the storage device 37 becomes the high resistance state RH.

As illustrated in FIG. 20, in the standby operation M4, the controller 11 allows the voltage of the power supply control signal SPG to be a high level. This causes the power supply transistor 12 (FIG. 1) to be turned OFF, causing suspension of the power supply to the memory cell 30. This allows the voltages of the signals SCL1, SCL2, SRST, and SSTR each to be a low level. This causes the respective transistors 31 to 36, 62, and 64 to be turned OFF, as illustrated in FIG. 21D. Further, the voltage of the signal SCTRL becomes the low level VL. At this time, the resistance states of the storage devices 37 and 38 are maintained.

As illustrated in FIG. 20, in the re-storage operation M5, the controller 11 allows the voltage of the power supply signal SPG to be a low level. This causes the power supply transistor 12 (FIG. 1) to be turned ON, allowing the power supply voltage VDD to be supplied to the memory cell 30. Further, the driver 53 allows the voltages of the signals SCL1 and SCL2 each to be a high level and allows the voltages of the signals SRST and SSTR each to be a low level. This causes the respective transistors 31, 32, 34, and 35 to be turned ON and causes the respective transistors 33, 36, 62, and 64 to be turned OFF, as illustrated in FIG. 21E. Further, the driver 52 allows the voltage of the signal SCTRL to be the low level VL (the ground level). This causes the voltage state in the SRAM circuit 40 to be determined depending on the resistance states of the storage devices 37 and 38. In this example, the resistance state of the storage device 37 is the high resistance state RH. The resistance state of the storage device 38 is the low resistance state RL. Accordingly, the output voltage VN1 of the inverter IV1 becomes the high level VH, and the output voltage VN2 of the inverter IV2 becomes the low level VL.

As described, the transistors 61 to 64 are provided in the semiconductor circuit 2, and, in a case where the storage operation M3 is performed, the transistors 62 and 64 are turned ON to thereby allow the store current Istore to flow in the storage devices 37 and 38, as illustrated in FIG. 21C. This makes it possible to reduce possibility of occurrence of disturb in the semiconductor circuit 2. In other words, in the semiconductor circuit 1 according to the first embodiment, for example, in a case where the storage operation M3 is performed, as illustrated in FIG. 6C, the SRAM circuit 40 supplies the storage current Istore. Therefore, if the storage current Istore has a large current value, the information stored in the SRAM circuit 40 may be lost, leading to the occurrence of so-called disturb. Further, in a case where the size of each transistor in the SRAM circuit 40 is made large in order to avoid this, the area of the semiconductor circuit 1 may also be made large. In contrast, in the semiconductor circuit 2 according to the present embodiment, in a case where the storage operation M3 is performed, the transistors 61 and 63 supplies the store current Istore, as illustrated in FIG. 21C. This makes it possible to reduce possibility of the occurrence of disturb in the semiconductor circuit 2. Further, it is possible to make the size of each transistor in the SRAM circuit 40 small, which also makes it possible to make the area of the semiconductor circuit 2 small.

In the present embodiment as described above, the transistors 61 to 64 are provided, and, in the case where the storage operation M3 is performed, the transistors 62 and 64 are turned ON to thereby allow the store current Istore to flow in the storage device. This makes it possible to reduce possibility of the occurrence of disturb and to make the size of the semiconductor small. Other effects are also exerted similarly to the effects in the foregoing first embodiment.

Modification Example 2-1

Figure 22:
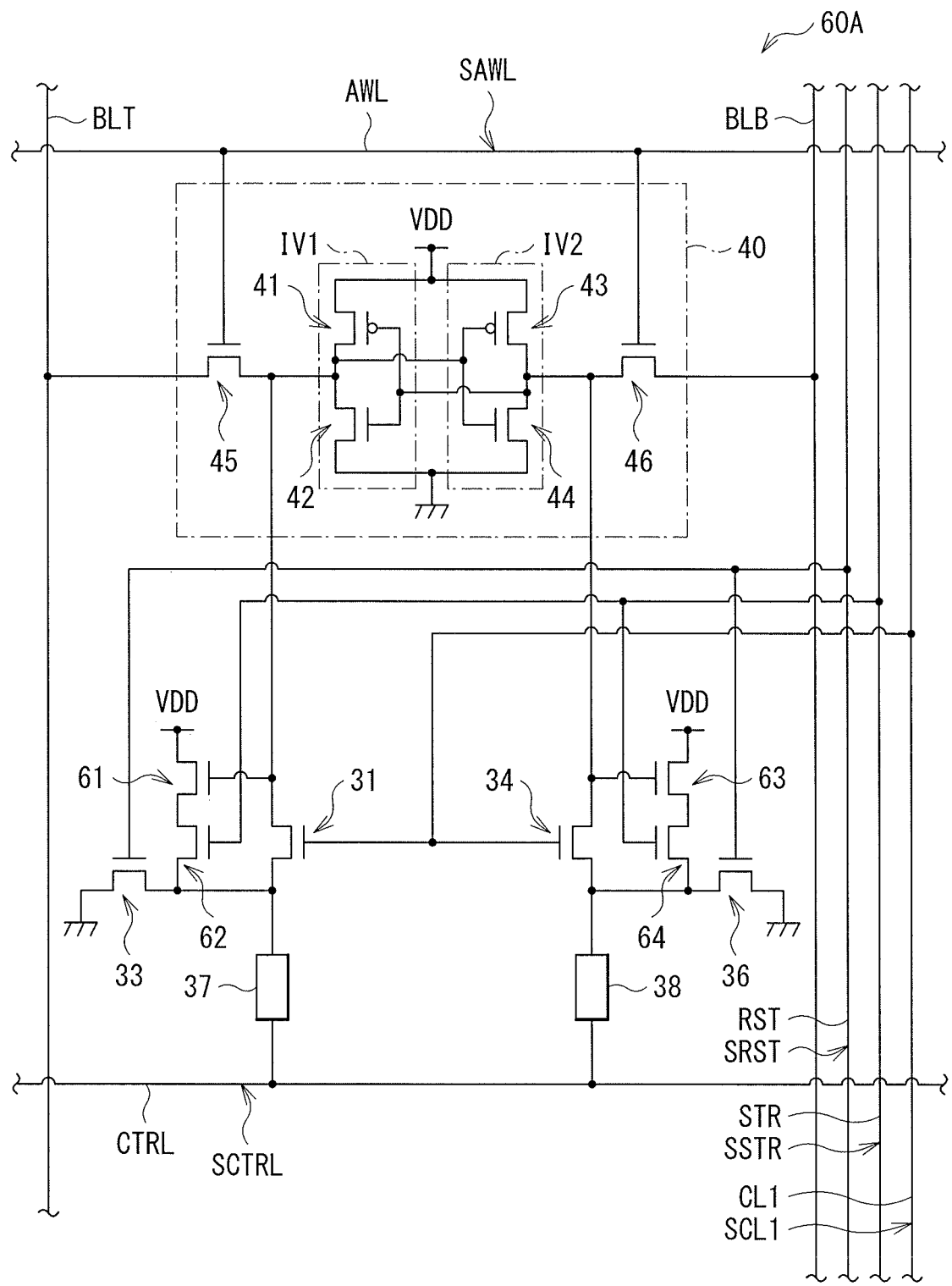
FIG. 22 is a circuit diagram illustrating a configuration example of a memory cell according to a modification example of the second embodiment.
Figure 23:
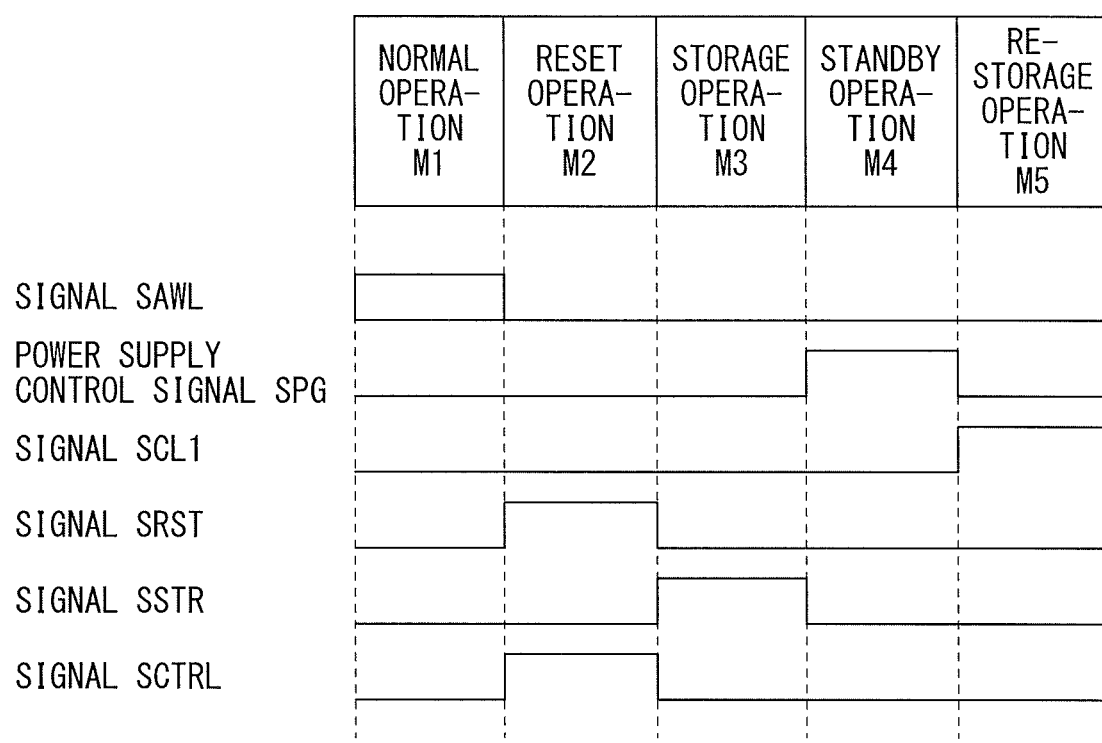
FIG. 23 is a view describing an operation example of the memory cell illustrated in FIG. 22.

In the foregoing embodiment, the transistors 32 and 35 are provided in the memory cell 60 (FIG. 18). However, this is non-limiting. Instead, the transistors 32 and 35 may be omitted, as illustrated in the memory cell 60A of FIG. 22, for example. FIG. 23 illustrates an operation example of the memory cell 60A. This makes it possible to simplify the configuration of the memory cell 60A, leading to the reduction in area of the memory cell 60A.

Modification Example 2-2

Figure 24:
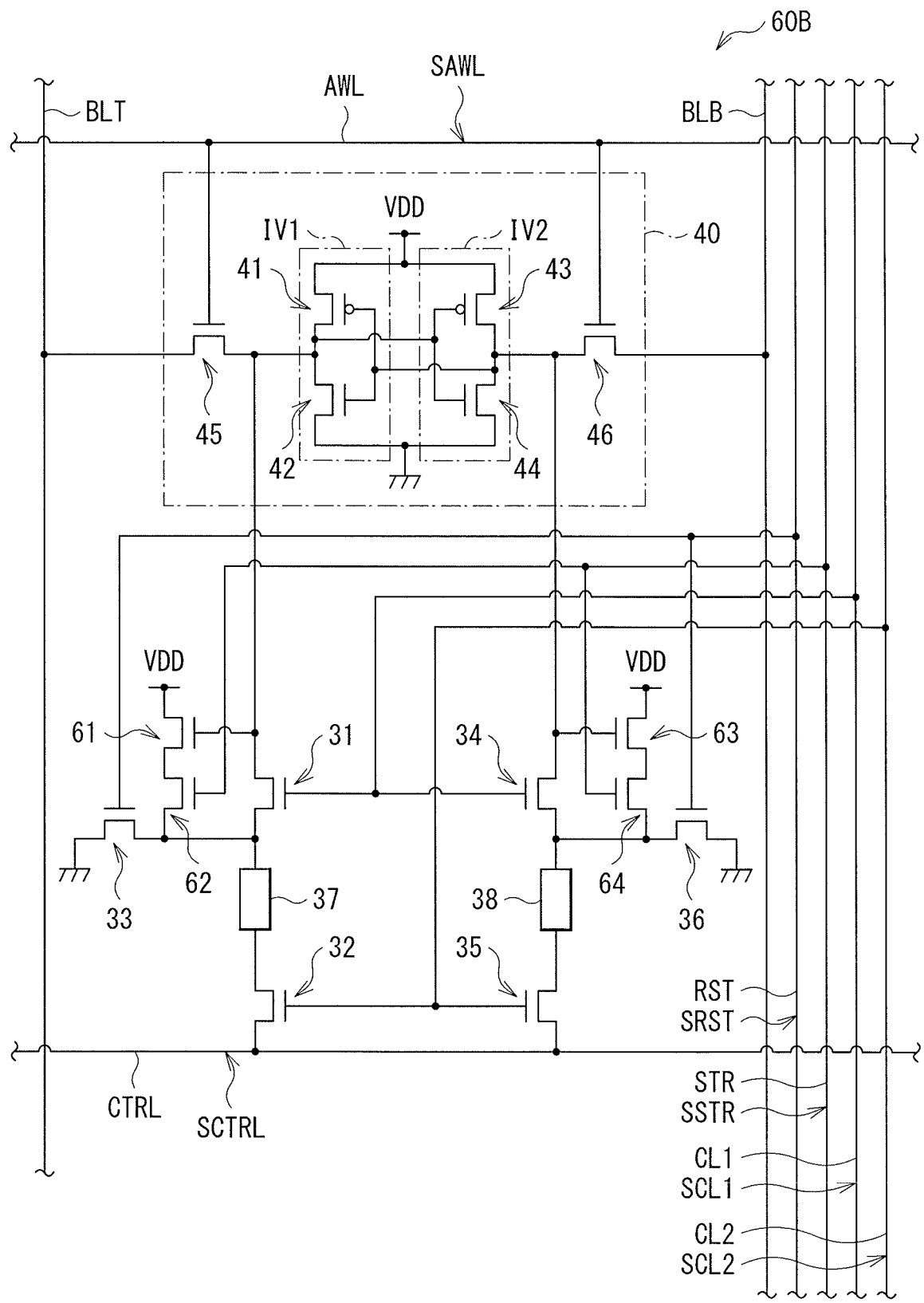
FIG. 24 is a circuit diagram illustrating a configuration example of a memory cell according to another modification example of the second embodiment.

In the foregoing embodiment, the other ends of the storage devices 37 and 38 are coupled to the control lines CTRL in the memory cell 60 (FIG. 18). However, this is non-limiting. Instead, as illustrated in the memory cell 60B of FIG. 24, the location of the transistor 32 may be replaced with the location of the storage device 37 and the location of the transistor 35 may be replaced with the location of the storage device 38 in the memory cell 60 (FIG. 18). In this example, the storage device 37 includes one end coupled to the sources of the transistors 31 and 62 and the drain of the transistor 33, and the other end coupled to the drain of the transistor 32. The transistor 32 includes the gate coupled to the control line CL2, the drain coupled to the other end of the storage device 37, and the source coupled to the control line CTRL. The storage device 38 includes one end coupled to the sources of the transistors 34 and 64 and the drain of the transistor 36 and the other end coupled to the drain of the transistor 35. The transistor 35 includes the gate coupled to the control line CL2, the drain coupled to the other end of the storage device 38, and the source coupled to the control line CTRL.

Modification Example 2-3

Figure 25:
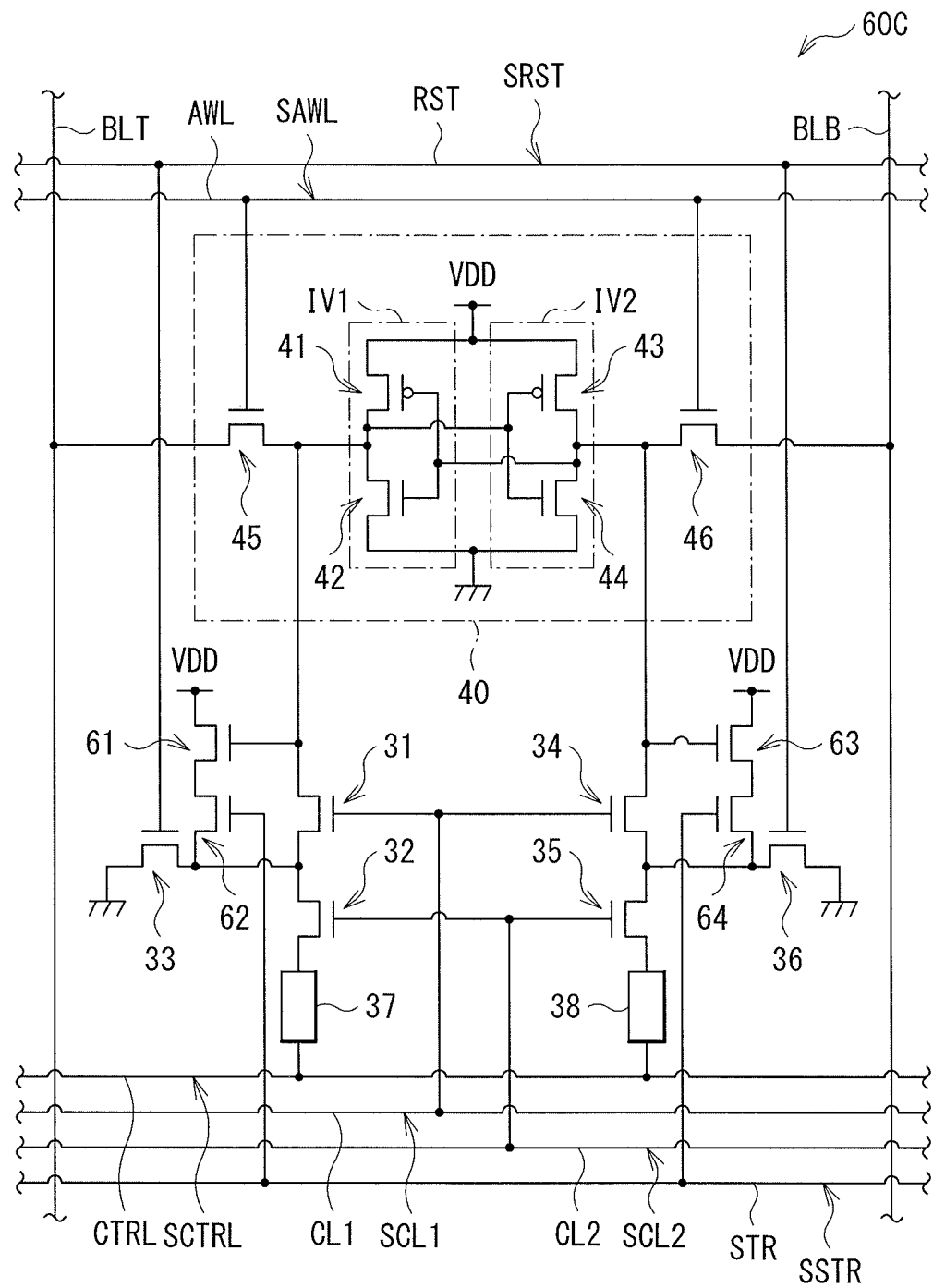
FIG. 25 is a circuit diagram illustrating a configuration example of a memory cell according to another modification example of the second embodiment.

In the foregoing embodiment, the word lines AWL and the control lines CTRL extend in the lateral direction in FIGS. 18 and 19, and the bit lines BLT and BLB and the control lines RST, STR, CL1, and CL2 extend in the vertical direction in FIGS. 18 and 19. However, this is non-limiting. For example, a memory cell 60C as illustrated in FIG. 25 may be provided. A memory cell array 51C including the memory cell 60C according to the present modification example includes the word lines AWL, the control lines CTRL, the control lines RST, STR, CL1, and CL2, and the bit lines BLT and BLB. In this example, the control lines RST extend in the lateral direction in FIG. 25. The control lines RST each include one end coupled to a driver 52C according to the present modification example. The control lines STR extend in the lateral direction in FIG. 25. The control lines STR each include one end coupled to the driver 52C. The control lines CL1 extend in the lateral direction in FIG. 25. The control lines CL1 each include one end coupled to the driver 52C. The control lines CL2 extend in the lateral direction in FIG. 25. The control lines CL2 each include one end coupled to the driver 52C.

Modification Example 2-4

Figure 26:
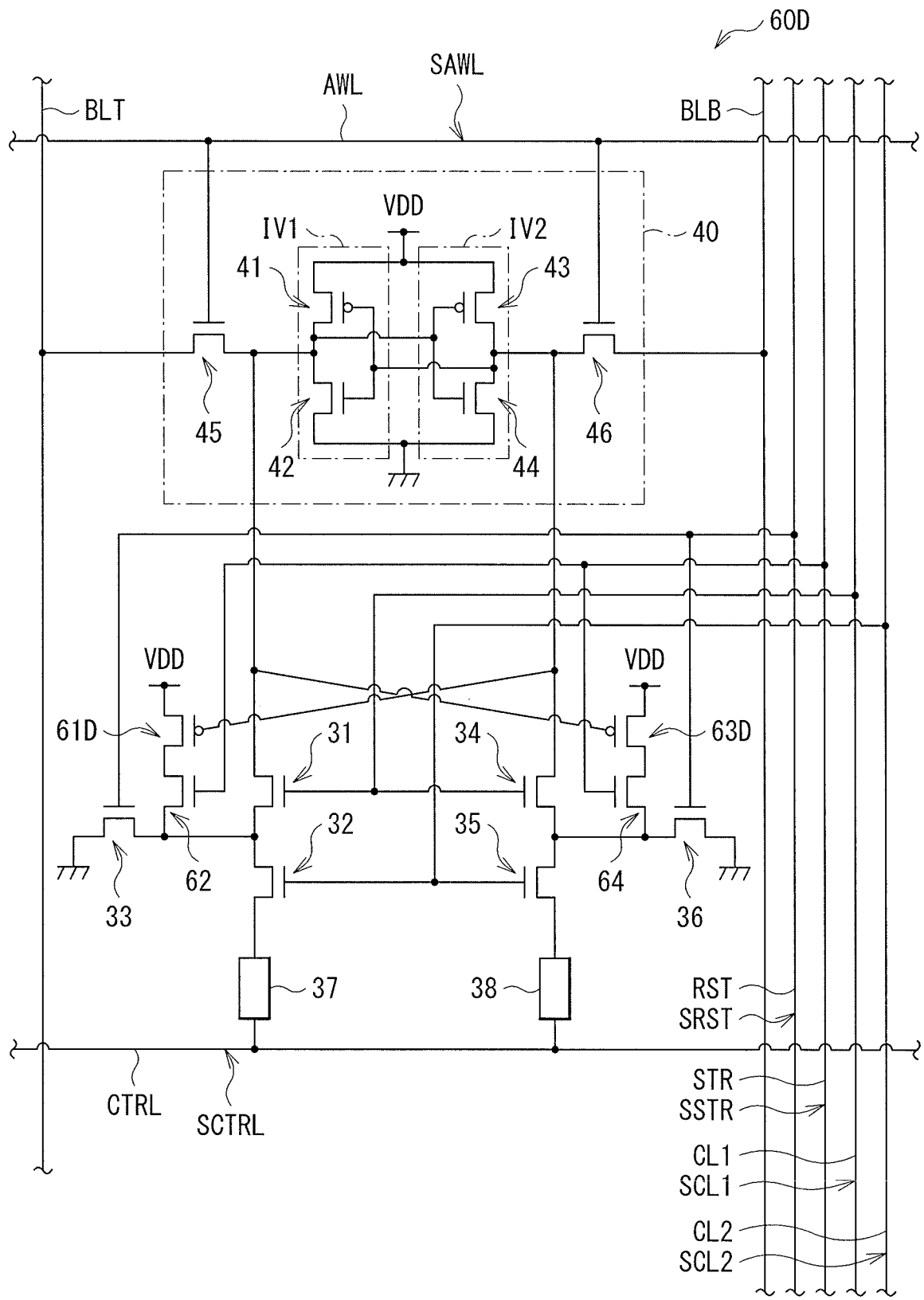
FIG. 26 is a circuit diagram illustrating a configuration example of a memory cell according to another modification example of the second embodiment.

In the foregoing embodiment, the transistors 61 and 63 are configured with use of the N-type MOS transistor. However, this is non-limiting. Instead, for example, transistors 61D and 63D with use of the P-type MOS transistors may be provided, as illustrated in a memory cell 60D of FIG. 26. The transistor 61D includes a gate coupled to the drains of the transistors 43, 44, 46, and 34 and the gates of the transistors 41 and 42, a source to which the power supply voltage VDD is supplied, and a drain coupled to the drain of the transistor 62. The transistor 63D includes a gate coupled to the drains of the transistors 41, 42, 45, and 31 and the gates of the transistors 43 and 44, a source to which the power supply voltage VDD is supplied, and a drain coupled to the drain of the transistor 64. In other words, the transistors 61D and 63D are configured with use of the P-type MOS transistors, and, in consideration that the output signal of the inverter IV1 and the output signal of the inverter IV2 are inverted to each other, the output signal of the inverter IV2 is applied to the gate of the transistor 61D, and the output signal of the inverter IV1 is applied to the gate of the transistor 63D.

Modification Example 2-5

Figure 27:
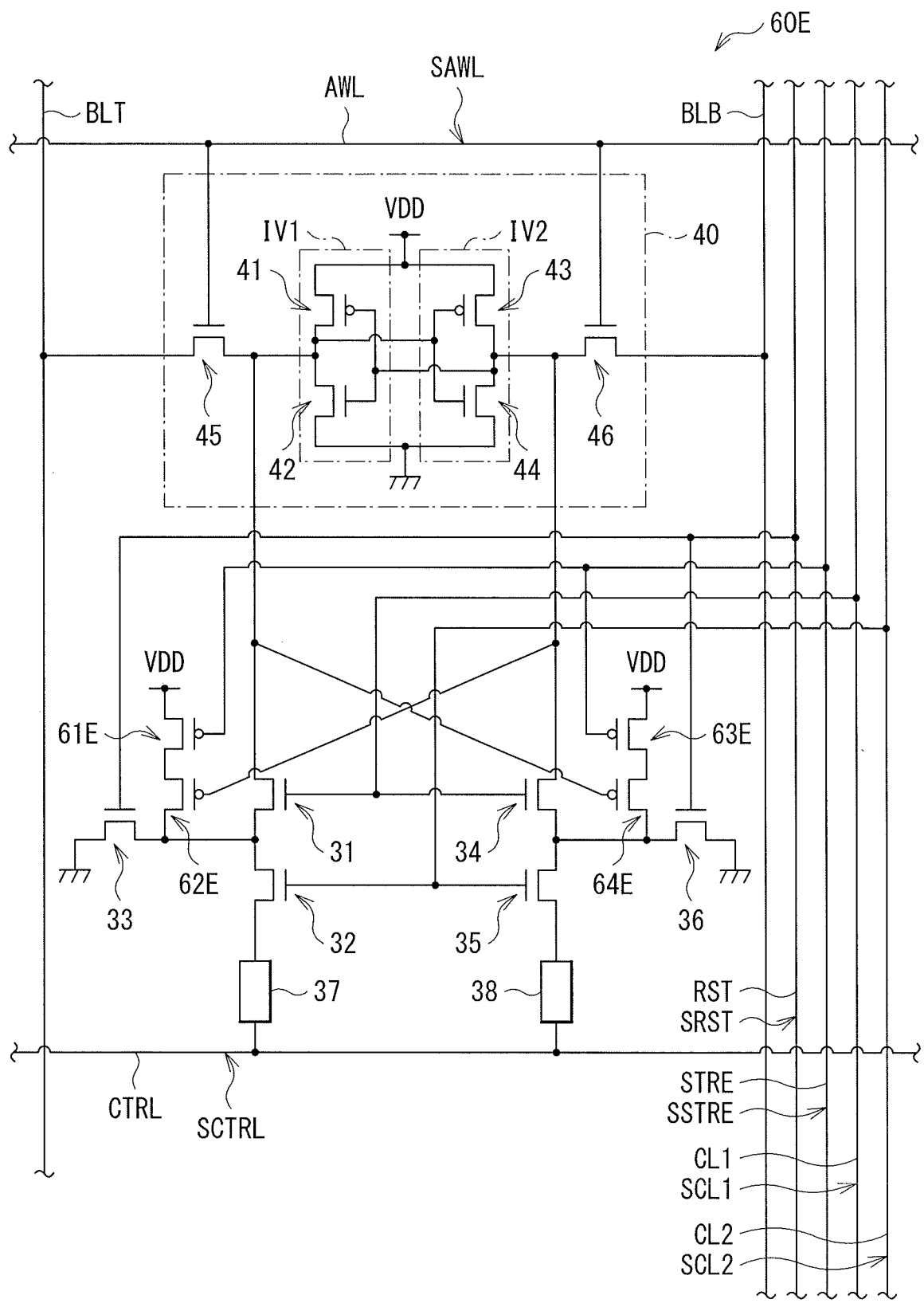
FIG. 27 is a circuit diagram illustrating a configuration example of a memory cell according to another modification example of the second embodiment.

In the foregoing embodiment, the transistor 62 coupled to the transistor 32, of the transistors 61 and 62, is caused to operate as a switch. The transistor 64 coupled to the transistor 35, of the transistors 63 and 64, is caused to operate as a switch. However, this is non-limiting. Instead, for example, a memory cell 60E as illustrated in FIG. 27 may be provided. A memory cell array 51E including the memory cell 60E includes the word lines AWL, the control lines CTRL, the bit lines BLT, the bit lines BLB, the control lines RST, control lines STRE, the control lines CL1, and the control lines CL2. The memory cell 60E includes transistors 61E to 64E. The transistors 61E to 64E are the P-type MOS transistors. The transistor 61E includes a gate coupled to the control line STRE, a source to which the power supply voltage VDD is supplied, and a drain coupled to a source of the transistor 62E. The transistor 62E includes a gate coupled to the drains of the transistors 43, 44, 46, and 34 and the gates of the transistors 41 and 42, the source coupled to the drain of the transistor 61E, and a drain coupled to the source of the transistor 31 and the drains of the transistors 32 and 33. The transistor 63E includes a gate coupled to the control line STRE, a source to which the power supply voltage VDD is supplied, and a drain coupled to a source of the transistor 64E. The transistor 64E includes a gate coupled to the drains of the transistors 41, 42, 45, and 31 and the gates of the transistors 43 and 44, the source coupled to the drain of the transistor 63E, and a drain coupled to the source of the transistor 34 and the drains of the transistors 35 and 36.

Modification Example 2-6

In the foregoing embodiment, the storage devices 37 and 38 each having the bottom pin structure are used. However, this is non-limiting. Instead, for example, as illustrated in a memory cell 60F of FIG. 28, the storage devices 37D and 38D having the top pin structure may be used. The memory cell 60F is based on application of the present modification example to the memory cell 60E (FIG. 27) according to the foregoing modification examples 2 to 5. A memory cell array 51F including the memory cell 60F includes the word lines AWL, the control lines CTRL, the bit lines BLT, the bit lines BLB, control lines RSTF, control lines STRF, control lines CLF, and control lines CL2F. The memory cell 60F includes the SRAM circuit 40, the transistors 31D to 36D, and the storage devices 37D and 38D. Transistors 31F to 36F are the P-type MOS transistors. The transistors 31F to 36F respectively correspond to the transistors 31 to 36 of the memory cell 60E (FIG. 27). The transistors 33F and 36F each include a source to which the power supply voltage VDD is supplied. Transistors 61F to 64F are the N-type MOS transistors. The transistors 61F to 64F respectively correspond to the transistors 61E to 64E of the memory cell 60E (FIG. 27). Drains of the transistors 61F and 63F are grounded.

Modification Example 2-7

Figure 28:
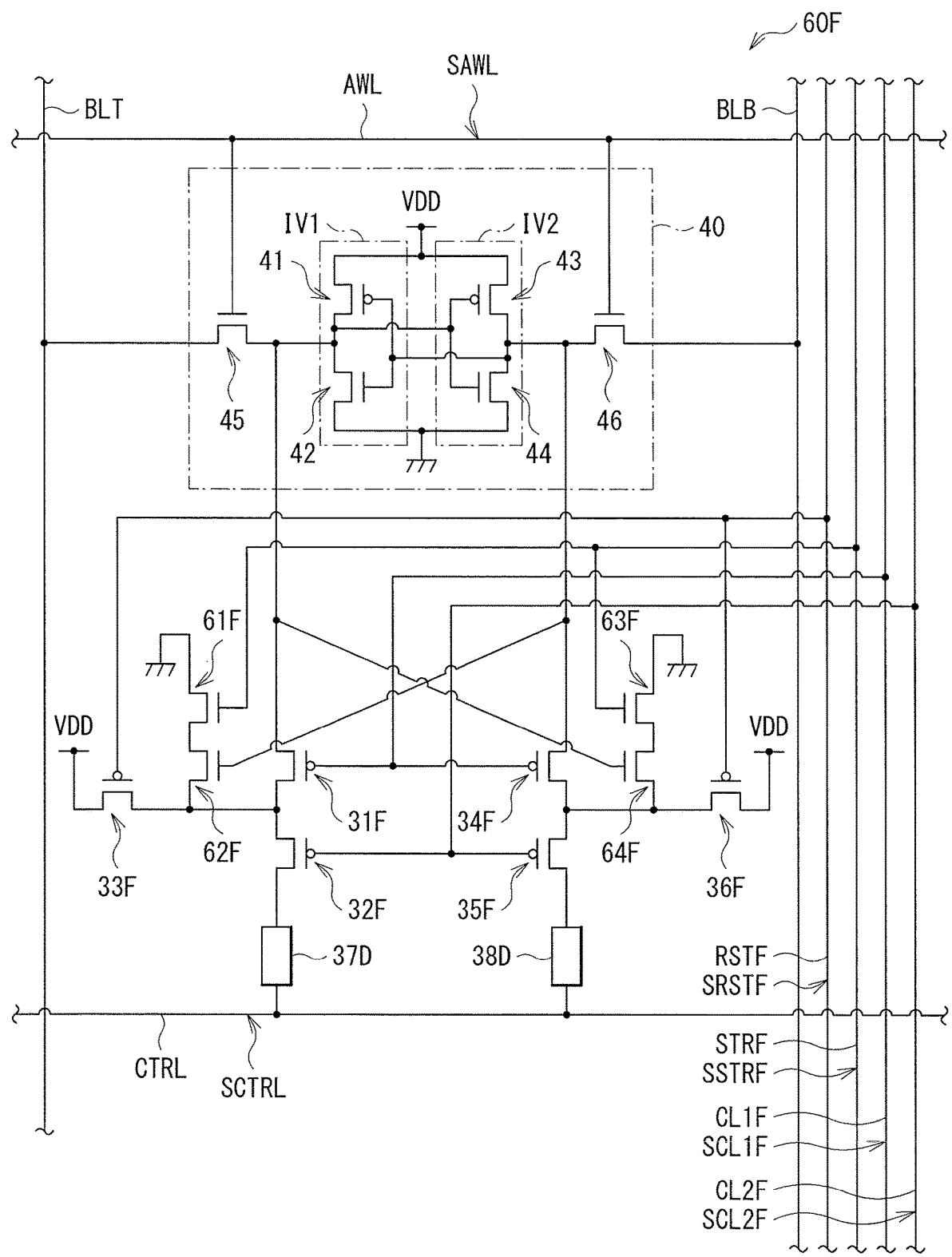
FIG. 28 is a circuit diagram illustrating a configuration example of a memory cell according to another modification example of the second embodiment.

In the foregoing embodiment, the power supply transistor 12 is configured with use of the P-type MOS transistor. However, this is non-limiting. Instead, similarly to the semiconductor circuit 1E (FIG. 16) according to modification example 1-5, the power supply transistor may be configured with use of the N-type MOS transistor. For example, in a case where the storage device having the bottom pin structure is used, a memory cell may be used which includes a configuration in which, for example, the storage devices 37D and 38D in the memory cell 60F illustrated in FIG. 28 are respectively replaced with the storage devices 37 and 38 each having the bottom pin structure. Further, in a case where the storage device having the top pin structure is used, for example, a memory cell may be used which includes a configuration in which, for example, the storage devices 37 and 38 in the memory cell 60E illustrated in FIG. 27 are respectively replaced with the storage devices 37D and 38D each having the top pin structure.

Modification Example 2-8

In the memory cell 60E according to the foregoing modification example 2-5, the transistors 61E and 63E are provided in the memory cell 60E. However, this is non-limiting. In the following, detailed description is given of a memory cell 60G according to the present modification example.

Figure 29:
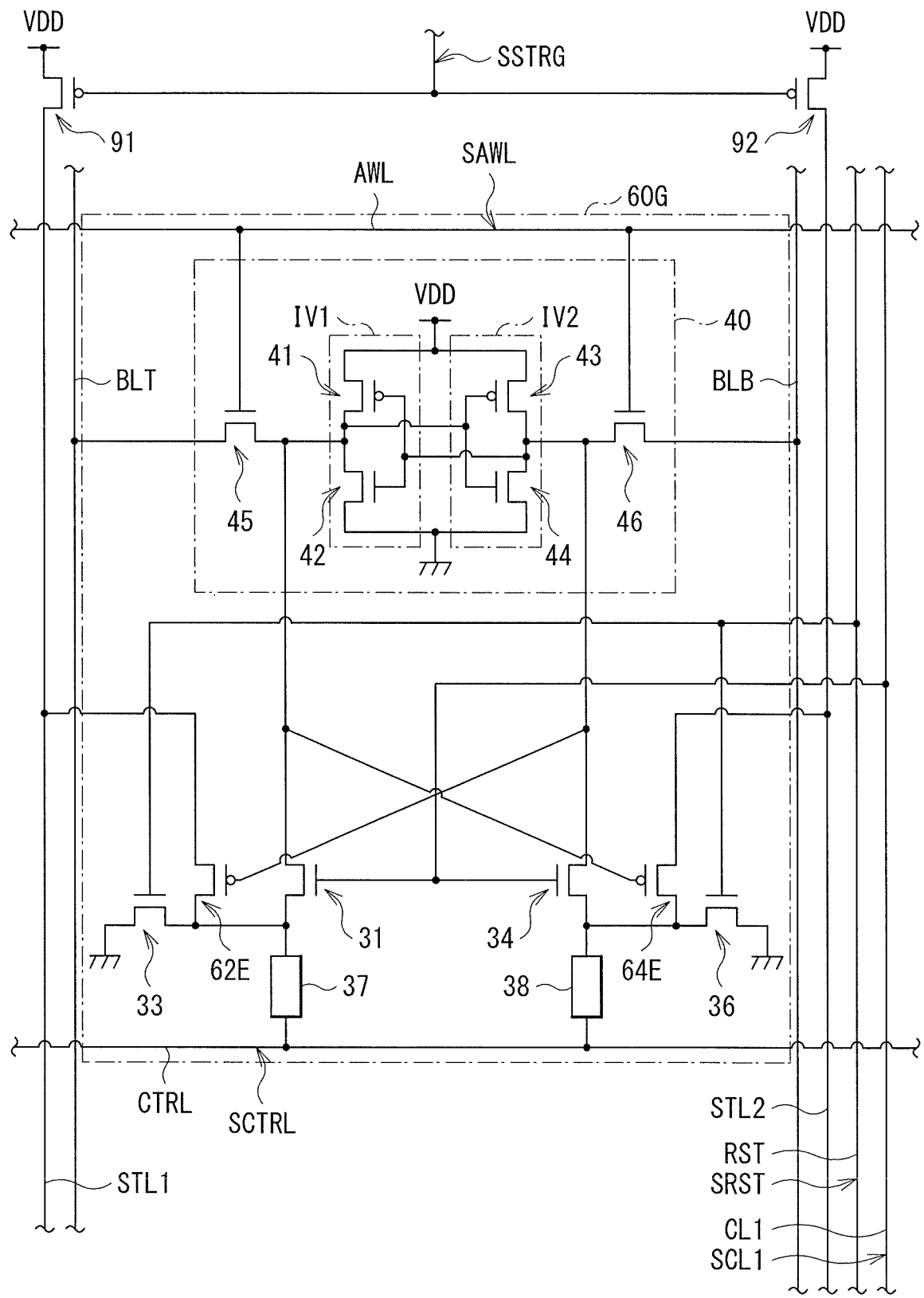
FIG. 29 is a circuit diagram illustrating a configuration example of a memory cell according to another modification example of the second embodiment.
Figure 30:
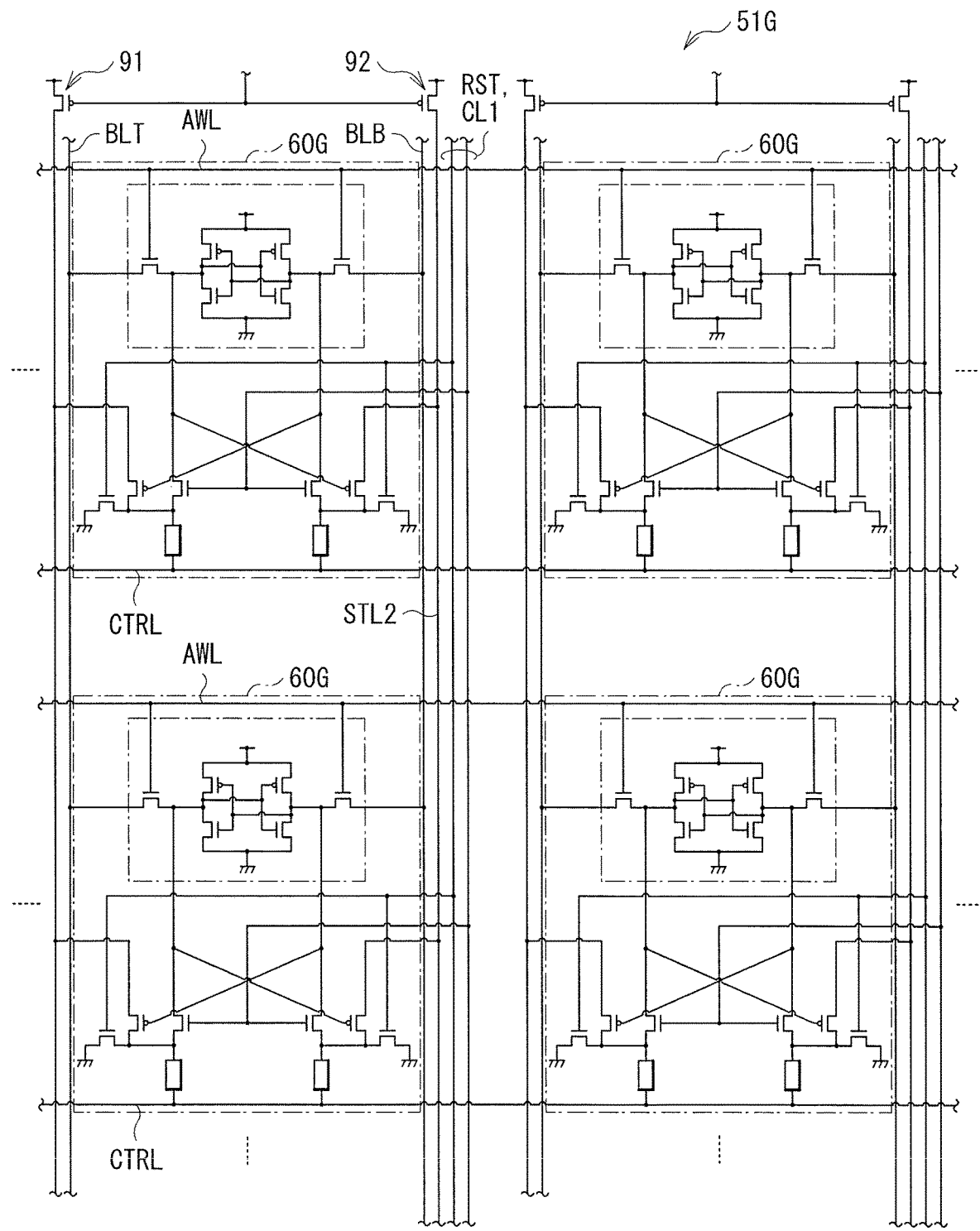
FIG. 30 is a circuit diagram illustrating a configuration example of a memory cell array including the memory cell illustrated in FIG. 29.
Figure 31A:
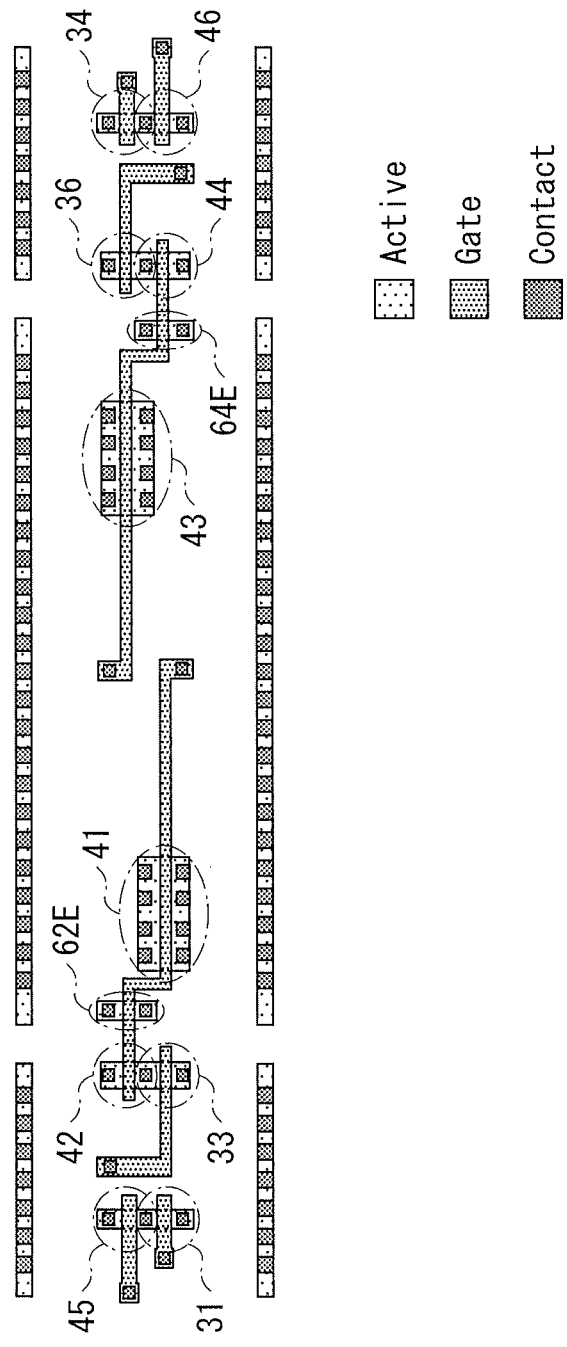
FIG. 31A is a layout diagram illustrating a configuration example of the memory cell illustrated in FIG. 29.
Figure 31B:
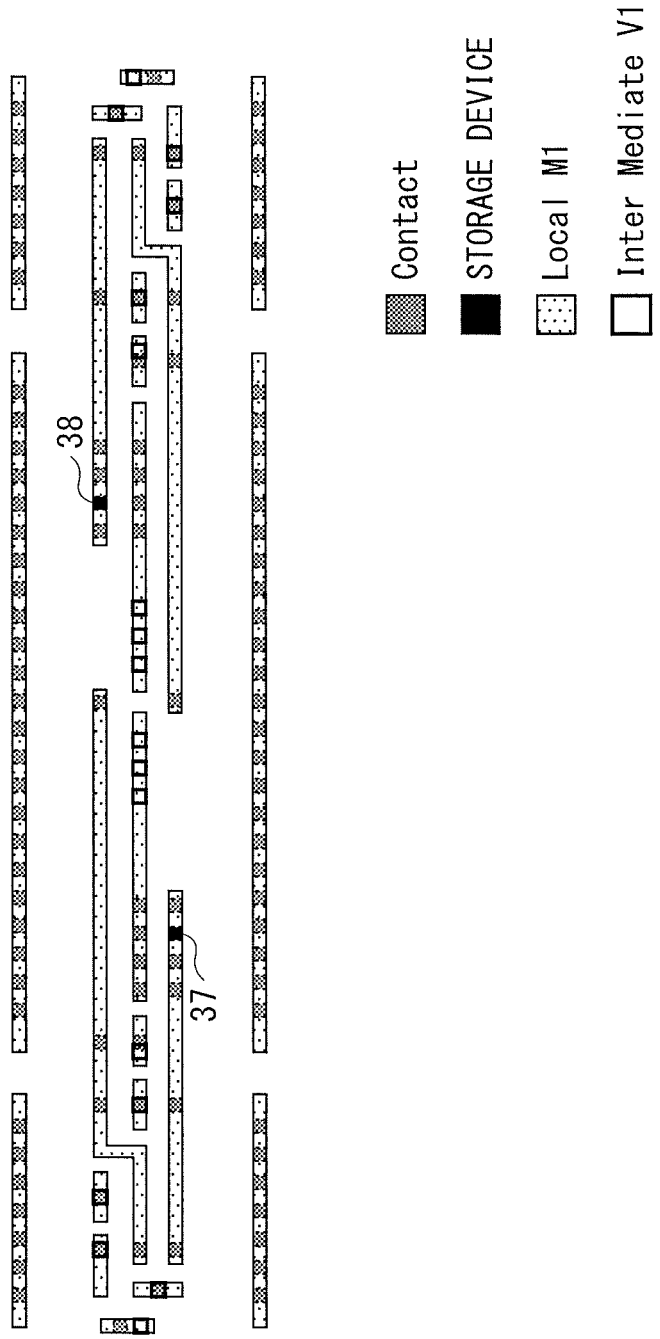
FIG. 31B is another layout diagram illustrating a configuration example of the memory cell illustrated in FIG. 29.
Figure 31C:
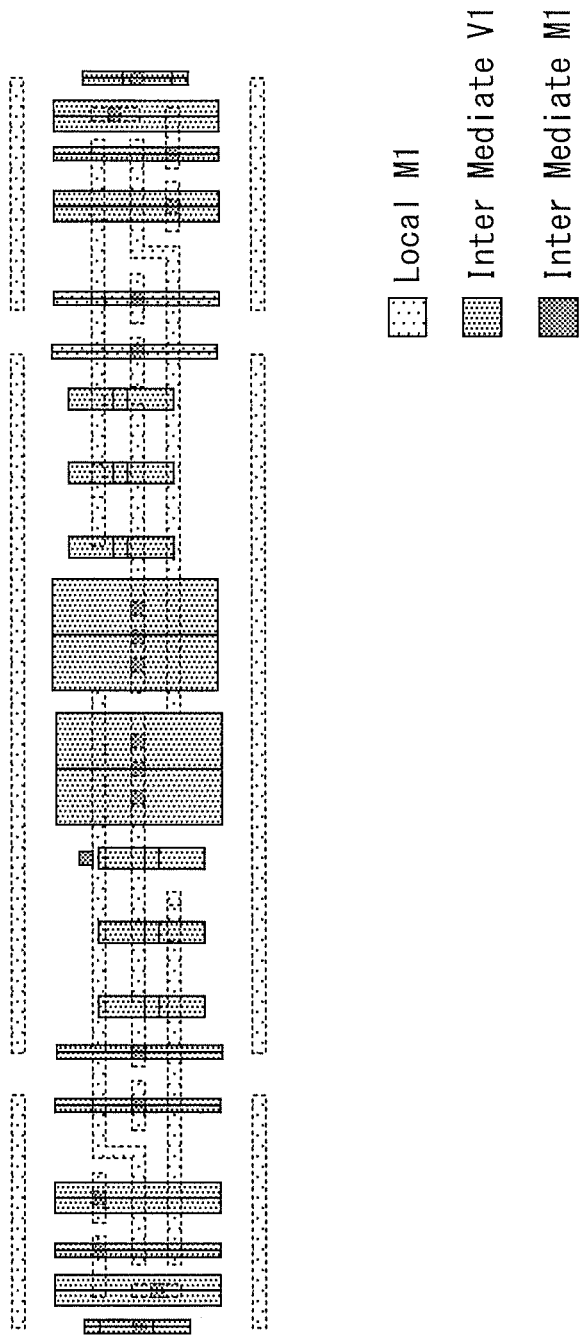
FIG. 31C is another layout diagram illustrating a configuration example of the memory cell illustrated in FIG. 29.
Figure 31D:
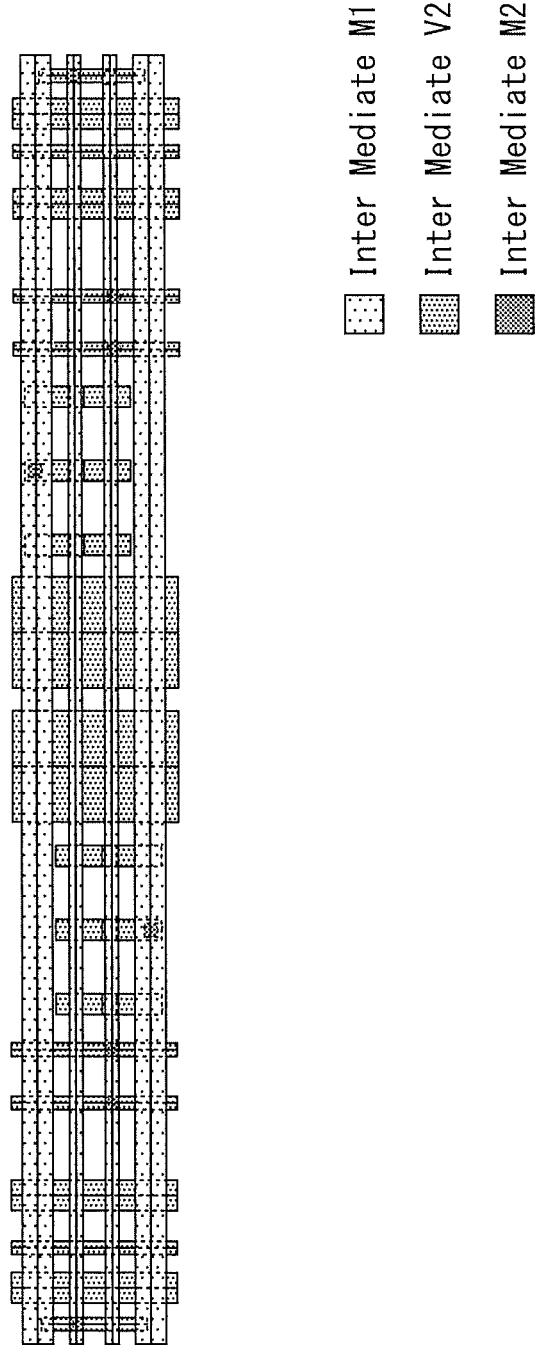
FIG. 31D is another layout diagram illustrating a configuration example of the memory cell illustrated in FIG. 29.

FIG. 29 illustrates a configuration example of the memory cell 60G FIG. 30 illustrates a configuration example of a memory cell array 51G including the memory cells 60G FIGS. 31A to 31D each illustrate an example of a layout of the memory cell 60G FIG. 31A illustrates a layout of each layer of Active, Gate, and Contact, from lower layer side. FIG. 31B illustrates a layout of each layer of Contact, Storage device, LocalM1, and InterMediateV1, from lower layer side. FIG. 31C illustrates a layout of each layer of LocalM1, InterMediateV1, and InterMediateM1 from lower layer side. FIG. 31D illustrates a layout of each layer of InterMediateM1, InterMediateV2, and InterMediateM2, from lower layer side.

The memory cell array 51G includes the plurality of word lines AWL, the plurality of control lines CTRL, the plurality of bit lines BLT, the plurality of bit lines BLB, a plurality of control lines STLl1, a plurality of control lines STL2, the plurality of control lines RST, the plurality of control lines CL1, the plurality of control lines CL2, and transistors 91 and 92. The control lines STL1 each extend in the vertical direction in FIGS. 29 and 30. The control lines STL1 each include one end coupled to a drain of the transistor 91. The control lines STL2 each extend in the vertical direction in FIGS. 29 and 30. The control lines STL2 each include one end coupled to a drain of the transistor 92. The transistors 91 and 92 are the P-type MOS transistors. The transistors 91 and 92 respectively correspond to the transistors 61E and 63E in the memory cell 60E according to the foregoing modification example 2-5. The transistor 91 includes a gate to which a signal SSTRG is supplied, a source to which the power supply voltage VDD is supplied, and the drain coupled to the control line STL. The transistor 92 includes a gate to which the signal SSTRG is supplied, a source to which the power supply voltage VDD is supplied, and the drain coupled to the control line STL2.

The memory cell 60G includes the SRAM circuit 40, the transistors 31, 33, 34, 36, 62E, and 64E, and the storage devices 37 and 38. It is to be noted that modification example 2-1 is applied to the memory cell 60E according to the foregoing modification example 2-5, to thereby omit the transistors 32 and 35. The transistor 62E includes the source coupled to the control line STL1. The transistor 64E includes the source coupled to the control line STL2.

In this example, the two transistors 91 and 92 are provided in the memory cell array 51G. However, this is non-limiting. In the following, detailed description is given of a memory cell 60H according to the present modification example.

Figure 32:
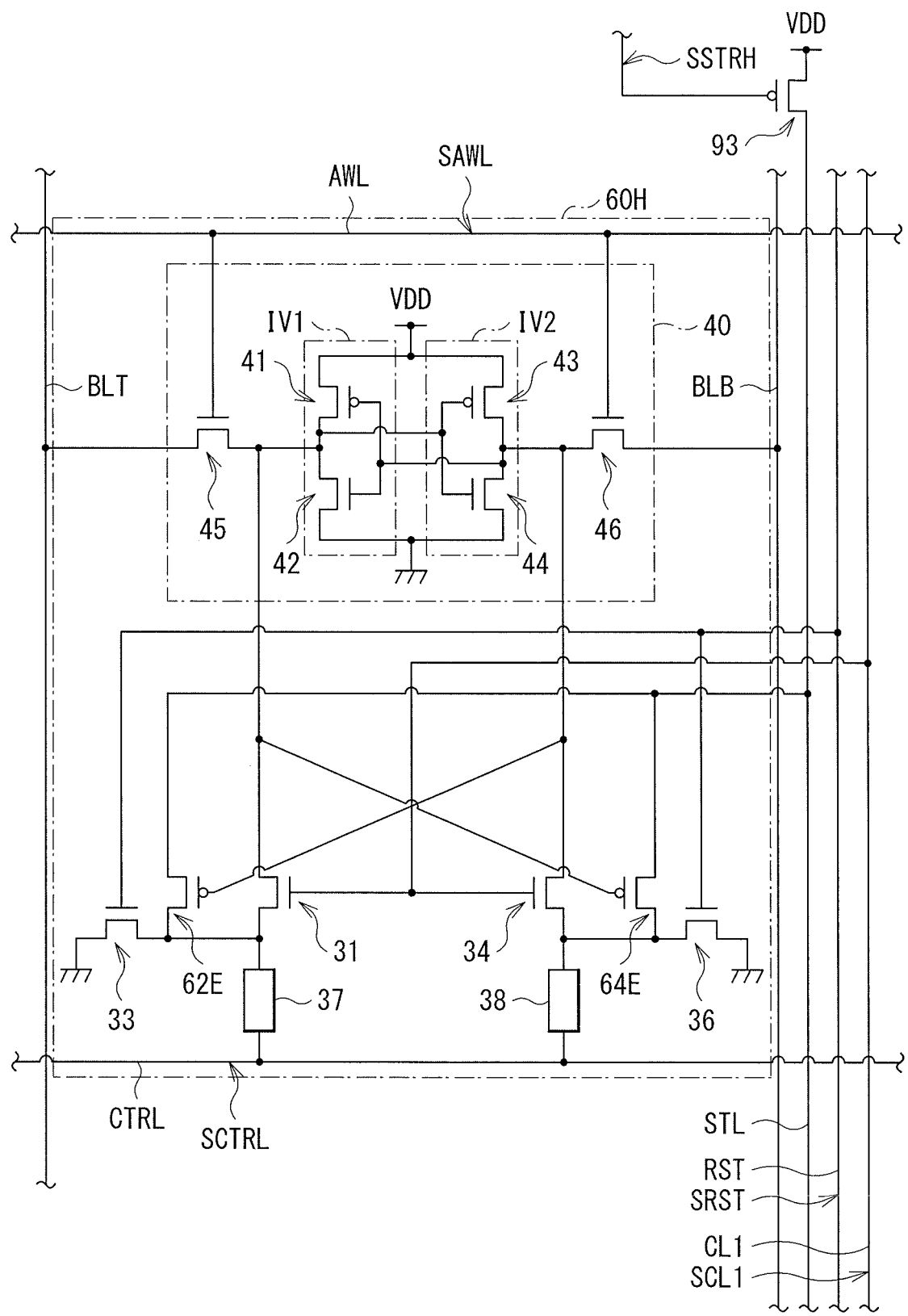
FIG. 32 is a circuit diagram illustrating a configuration example of a memory cell according to another modification example of the second embodiment.
Figure 33:
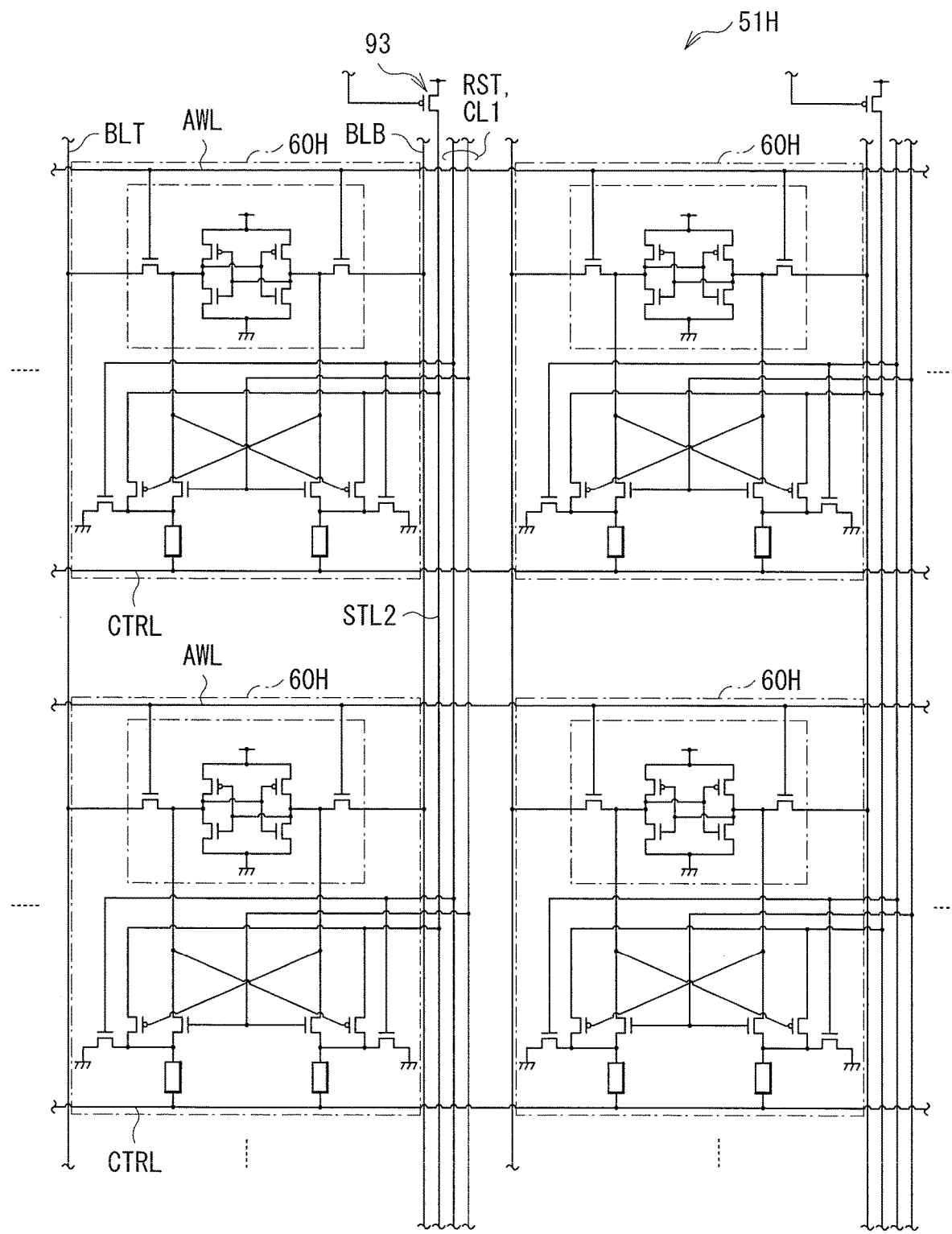
FIG. 33 is a circuit diagram illustrating a configuration example of a memory cell array including the memory cell illustrated in FIG. 32.
Figure 34A:
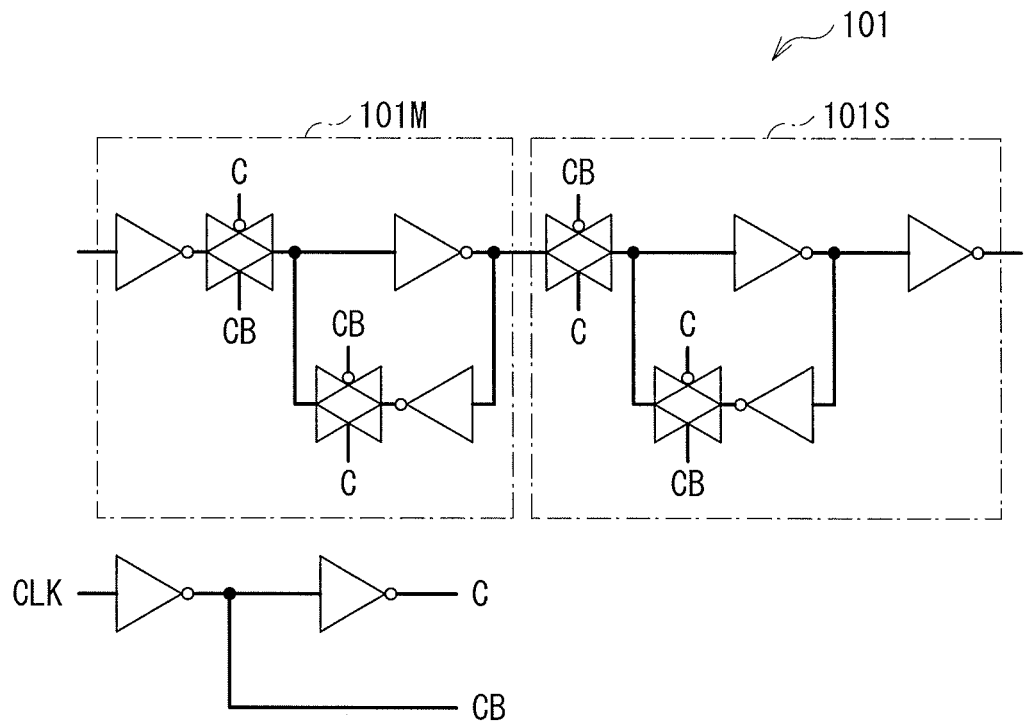
FIG. 34A is a circuit diagram illustrating a configuration example of a flip flop circuit.
Figure 34B:
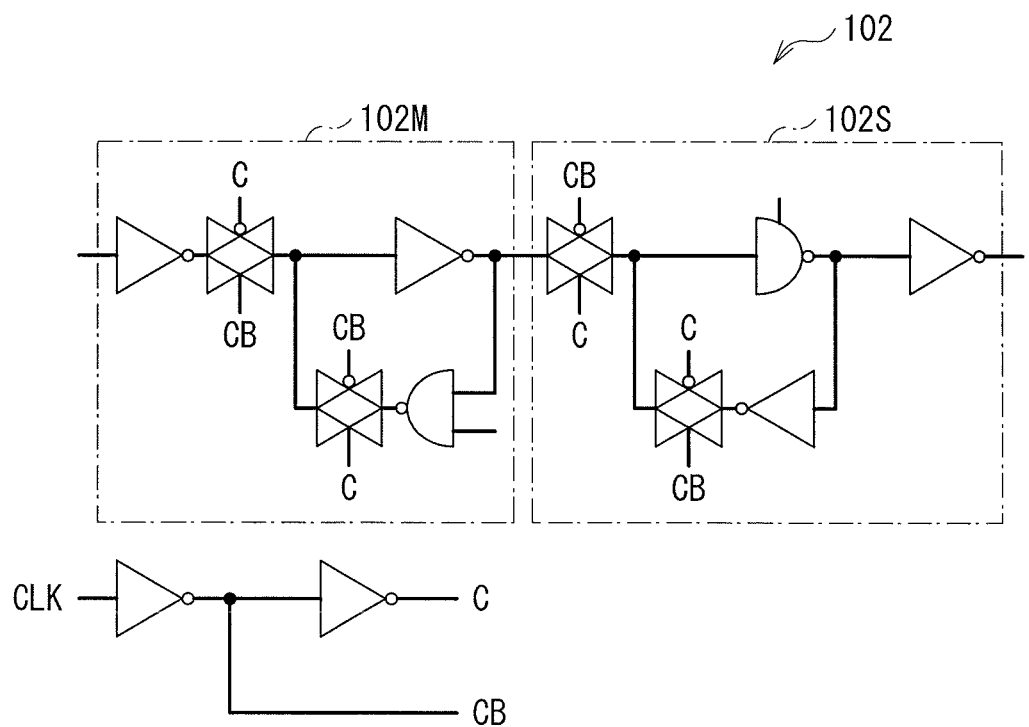
FIG. 34B is a circuit diagram illustrating another configuration example of the flip flop circuit.
Figure 34C:
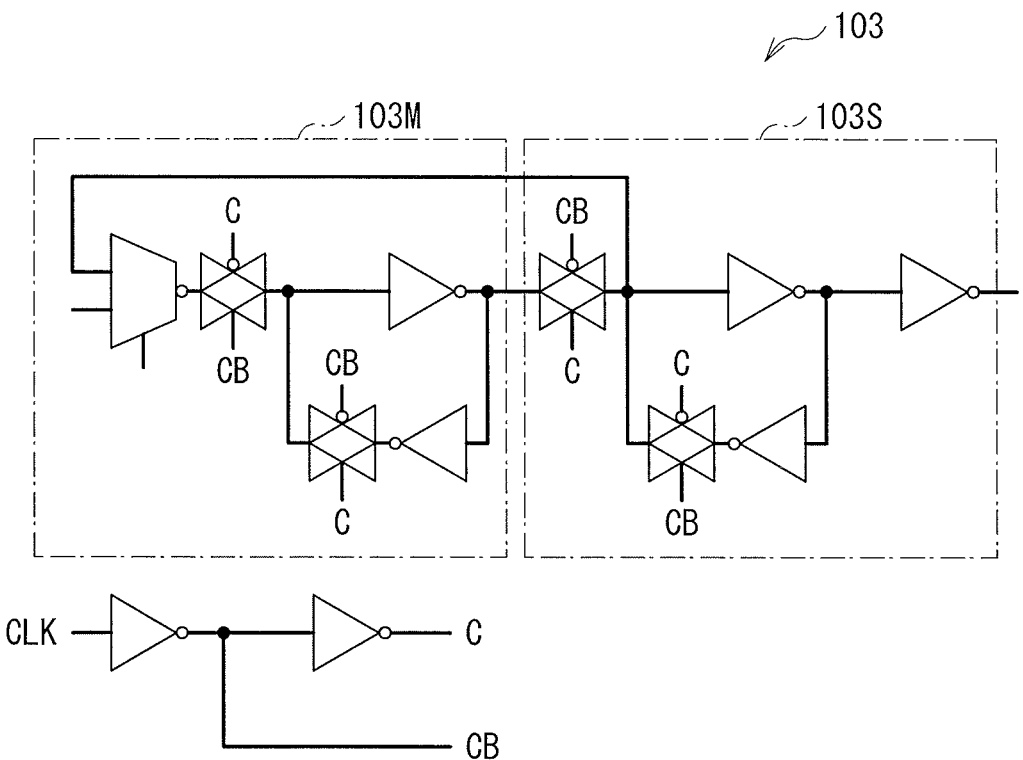
FIG. 34C is a circuit diagram illustrating another configuration example of the flip flop circuit.
Figure 34D:
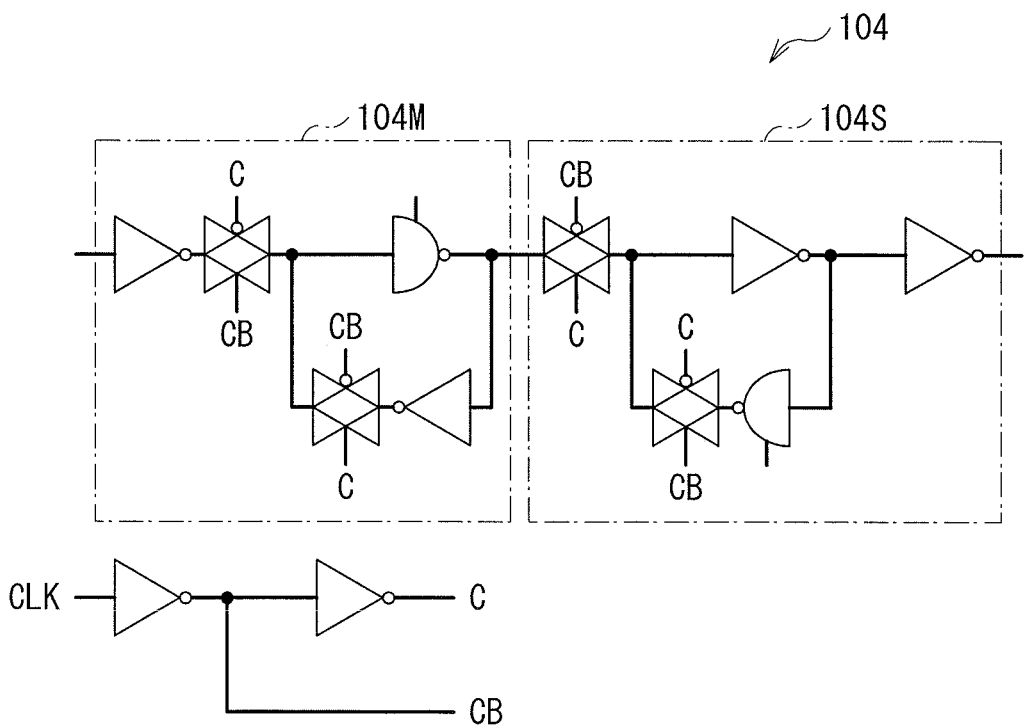
FIG. 34D is a circuit diagram illustrating another configuration example of the flip flop circuit.

FIG. 32 illustrates a configuration example of the memory cell 60H. FIG. 33 illustrates a configuration example of a memory cell array 51H including the memory cells 60H. The memory cell array 51H includes the plurality of word lines AWL, the plurality of control lines CTRL, the plurality of bit lines BLT, the plurality of bit lines BLB, a plurality of control lines STL, the plurality of control lines RST, the plurality of control lines CL1, the plurality of control lines CL2, and a transistor 93. The control lines STL each extend in the vertical direction in FIGS. 32 and 33. The control lines STL each include one end coupled to a drain of the transistor 93. The transistor 93 is the P-type MOS transistor. The transistor 93 corresponds to the transistors 91 and 92 in the foregoing memory cell 60G The transistor 93 includes a gate to which a signal SSTRH is supplied, a source to which the power supply voltage VDD is supplied, and the drain coupled to the control line STL.

The memory cell 60H includes the SRAM circuit 40, the transistors 31, 33, 34, 36, 62E, and 64E, and the storage devices 37 and 38. The transistor 62E includes the source coupled to the control line STL. The transistor 64E includes the source coupled to the control line STL.

Modification Example 2-9

In the foregoing embodiment, the storage devices 37 and 38 are configured with use of the magnetic tunnel junction device of the spin transfer torque. However, this is non-limiting. Any device may be used so long as the device makes a reversible change in the resistance state that depends on the direction of the current flowing therein. Examples may include a ferroelectric memory device, and a memory device that is configured by stacking an ion source layer and a resistance variable layer and that is used in an ARAM (atomic random access memory).

OTHER MODIFICATION EXAMPLES

Furthermore, two or more of the modification examples may be combined.

3. Applied Examples and Application Examples

Description is given next of applied examples of the technology described in the embodiments and the modification examples as mentioned above, and application examples to electronic apparatuses.

APPLIED EXAMPLES

In the foregoing embodiments, the technology is applied to the SRAM circuit 40. However, this is non-limiting. For example, the technology may be applied to flip flop circuits 101 to 104 illustrated in FIGS. 34A to 34D, for example. The flip flop circuit 101 is a so-called master-slave D-type flip flop circuit including a master latch circuit 101M and a slave latch circuit 101S. The same also applies to the flip flop circuits 102 to 104.

Figure 35:
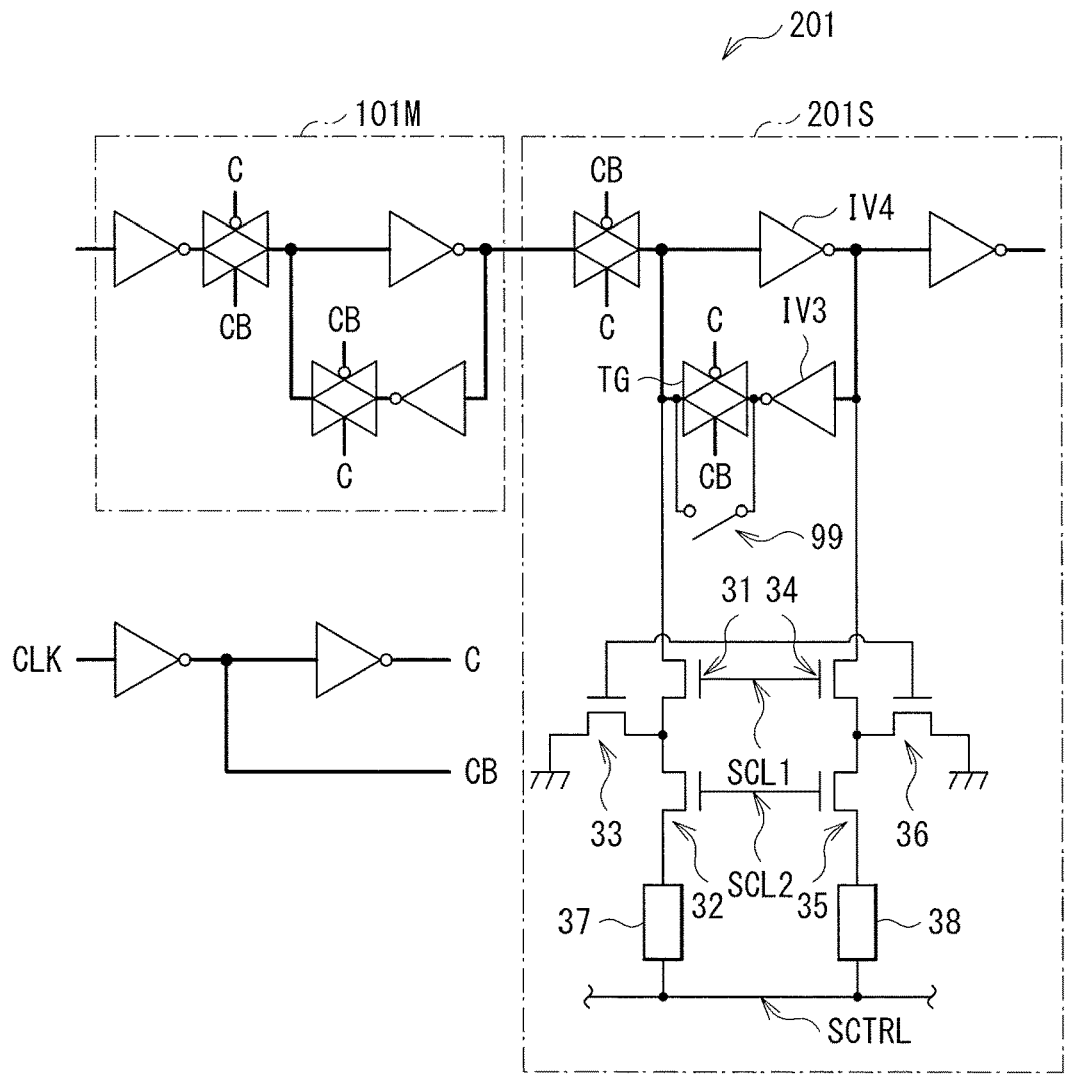
FIG. 35 is a circuit diagram illustrating a configuration example of the flip flop circuit to which an embodiment is applied.

FIG. 35 illustrates a configuration example of a flip flop circuit 201 according to the applied example. The flip flop circuit 201 is based on application of the technology according to the first embodiment to the flip flop circuit 101 illustrated in FIG. 34A. The flip flop circuit 201 includes the master latch circuit 101M and a slave latch circuit 201S. The technology according to the first embodiment is applied to the slave latch circuit 201S. The slave latch circuit 201S includes inverters IV3 and IV4, a transmission gate TG, a switch 99, the transistors 31 to 36, and the storage devices 37 and 38. The inverter IV3 includes an input terminal coupled to an output terminal of the inverter IV4 and the drain of the transistor 34, and an output terminal coupled to one end of the transmission gate TG and one end of the switch 99. The inverter IV4 includes an input terminal coupled to the other end of the transmission gate TG the other end of the switch 99, and the drain of the transistor 31, and the output terminal coupled to the input terminal of the inverter IV3 and the drain of the transistor 34. The switch 99 is turned OFF in a case where the normal operation M1 is performed. The switch 99 is turned ON in a case where the storage operation M3 and the re-storage operation M5 are performed.

It is to be noted that, in this example, the technology according to the first embodiment is applied to the slave latch circuit. However, this is non-limiting. Instead, the technology according to the second embodiment may be applied to the slave latch circuit, for example. Further, the technology according to the first embodiment of the master latch circuit may be applied.

Application Examples to Electronic Apparatuses

Figure 36:
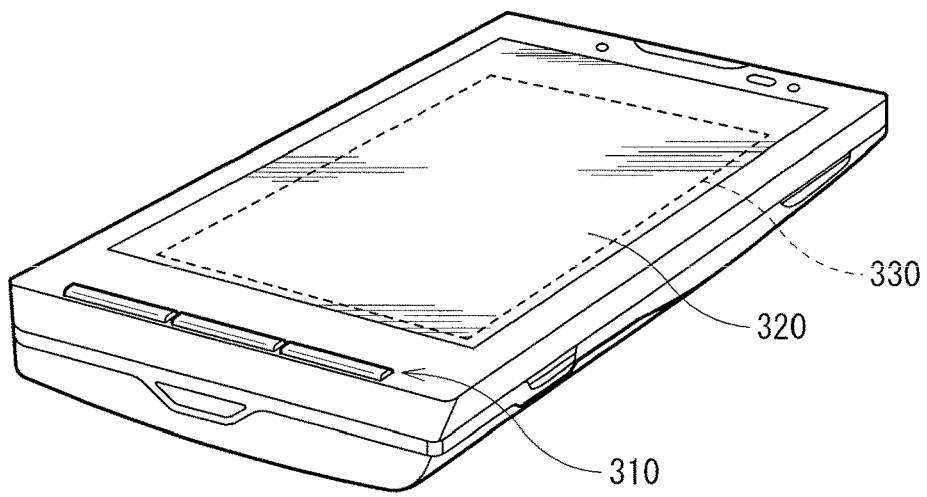
FIG. 36 is a perspective view of an external appearance and a configuration of a smartphone to which an embodiment is applied.

FIG. 36 illustrates an external appearance of a smartphone to which the semiconductor circuits according to the foregoing embodiment, etc. are applied. The smartphone includes, for example, a main body unit 310, a display unit 320, and a battery 330.

The semiconductor circuits according to the foregoing embodiment, etc. are applicable to electronic apparatuses in various fields, such as a digital camera, a notebook personal computer, a portable game machine, and a video camera, besides the smartphone as mentioned above. In particular, the technology is effectively applied to a mobile electronic apparatus including a battery.

Although description has been given for some embodiments and the modification examples, and their specific applied examples and the application examples to the electronic apparatuses as mentioned above, the technology are not limited to the foregoing embodiment, etc. and may be modified in a variety of ways.

For example, in the foregoing embodiment, etc., performing the reset operation M2 allows the resistance states of the storage devices 37 and 38 to be the low resistance state RL. However, this is non-limiting. Instead, performing the reset operation M2 may allow the resistance states of the storage devices 37 and 38 to be the high resistance state RH.

Furthermore, for example, in the foregoing applied examples, the technology is applied to the D-type flip flop circuit. However, this is non-limiting. The technology may be applied to, for example, other flip flop circuits, or alternatively, the technology may be applied to a latch circuit.

It is to be noted that effects described herein are merely exemplified and not limitative, and may further include other effects.

Further, for example, the disclosure may have the following configurations.

(1)

A semiconductor circuit including:

a first circuit that is able to generate, on the basis of a voltage at a first node, an inverted voltage of the voltage at the first node, and apply the inverted voltage to a second node;

a second circuit that is able to generate, on the basis of a voltage at the second node, an inverted voltage of the voltage at the second node, and apply the inverted voltage to the first node;

a first transistor that is turned ON to couple the first node to a third node;

a second transistor that is turned ON to supply a first direct-current voltage to the third node; and a first storage section that is coupled to the third node and includes a first storage device that is able to take a first resistance state or a second resistance state.

(2)

The semiconductor circuit according to (1), further including:

a third transistor that includes a drain, a source, and a gate coupled to the first node or the second node, and in which a second direct-current voltage is supplied to one of the drain and the source; and a fourth transistor that is turned ON to couple the other of the drain and the source of the third transistor to the third node.

(3)

The semiconductor circuit according to (1), further including:

a third transistor that includes a drain, a source, and a gate coupled to the first node or the second node, and in which one of the drain and the source is coupled to the third node; and a fourth transistor that is turned ON to supply a second direct-current voltage to the other of the drain and the source of the third transistor.

(4)

The semiconductor circuit according to (3), further including:

a third circuit that is able to generate, on the basis of a voltage at a fourth node, an inverted voltage of the voltage at the fourth node, and apply the inverted voltage to a fifth node;

a fourth circuit that is able to generate, on the basis of a voltage at the fifth node, an inverted voltage of the voltage at the fifth node, and apply the inverted voltage to the fourth node;

a fifth transistor that is turned ON to couple the fourth node to a sixth node; a sixth transistor that is turned ON to supply the first direct-current voltage to the sixth node;

a second storage section that is coupled to the sixth node and includes a second storage device that is able to take the first resistance state or the second resistance state; and a seventh transistor that includes a drain, a source, and a gate coupled to the fourth node or the fifth node, and in which one of the drain and the source is coupled to the sixth node, in which the fourth transistor is turned ON to supply the second direct-current voltage to the other of the drain and the source of the seventh transistor.

(5)

The semiconductor circuit according to any one of (2) to (4), further including a driver, in which the first storage section includes a first terminal coupled to the third node and a second terminal to which a control voltage is supplied, in which, in a first period, the driver sets the control voltage to a first voltage level that is different from a voltage level of the first direct-current voltage, turns ON the second transistor, and turns OFF the first transistor and the fourth transistor, to thereby allow a resistance state of the first storage device to be the first resistance state, and in which, in a second period that is after the first period, the driver sets the control voltage to a second voltage level, turns ON the fourth transistor, and turns OFF the first transistor and the second transistor, to thereby allow the resistance state of the first storage device to be a resistance state that depends on the voltage at the first node.

(6)

The semiconductor circuit according to (5), in which, in a third period that is after the second period, the driver sets the control voltage to the second voltage level, turns ON the first transistor, and turns OFF the second transistor and the fourth transistor, to thereby set the voltage at the first node to a voltage that depends on the resistance state of the first storage device.

(7)

The semiconductor circuit according to (1), further including a driver, in which the first storage section includes a first terminal coupled to the third node and a second terminal to which a control voltage is supplied, in which, in a first period, the driver sets the control voltage as a first voltage level that is different from a voltage level of the first current voltage, turns ON the second transistor, and turns OFF the first transistor, to thereby allow a resistance state of the first storage device to be the first resistance state, and, in which, in a second period that is after the first period, the driver sets the control voltage to a second voltage level, turns ON the first transistor, and turns OFF the second transistor, to thereby allow the resistance state of the first storage device to be a resistance state that depends on the voltage at the first node.

(8)

The semiconductor circuit according to any one of (1) to (7), in which the first storage device includes a first terminal and a second terminal to which a control voltage is supplied, and the first storage section includes an eighth transistor that is turned ON to couple the third node to the first terminal of the first storage device.

(9)

The semiconductor circuit according to any one of (1) to (7), in which the first storage device includes a first terminal coupled to the third node and a second terminal, and the first storage section includes an eighth transistor that is turned ON to supply a control voltage to the second terminal of the first storage device.

(10)

The semiconductor circuit according to any one of (1) to (7), in which the first storage device includes a first terminal coupled to the third node and a second terminal to which a control voltage is supplied.

(11)

The semiconductor circuit according to any one of (1) to (10), further including:

a ninth transistor that is turned ON to couple the second node to a seventh node;

a tenth transistor that is turned ON to supply the first direct-current voltage to the seventh node; and a third storage section that is coupled to the seventh node and includes a third storage device that is able to take the first resistance state or the second resistance state.

(12)

The semiconductor circuit according to any one of (1) to (11), further including an eleventh transistor that is turned ON to supply a power supply voltage or a ground voltage to the first circuit and the second circuit.

(13)

The semiconductor circuit according to any one of (1) to (12), in which the first resistance state is a state that is lower in resistance value than the second resistance state.

(14)

The semiconductor circuit according to any one of (1) to (12), in which the first resistance state is a state that is higher in resistance value than the second resistance state.

(15)

The semiconductor circuit according to any one of (1) to (14), in which the first storage device includes a first terminal and a second terminal, and stores information with use of a reversible change in a resistance state that depends on a direction of a current flowing between the first terminal and the second terminal.

(16)

The semiconductor circuit according to (15), in which the first storage device comprises a spin transfer torque storage device.

(17)

The semiconductor circuit according to any one of (1) to (16), including an SRAM circuit, in which the SRAM circuit includes the first circuit and the second circuit.

(18)

The semiconductor circuit according to any one of (1) to (3), including a latch circuit, in which the latch circuit includes the first circuit and the second circuit.

(19)

The semiconductor circuit according to any one of (1) to (3), including a flip flop circuit including a master latch circuit and a slave latch circuit, in which the slave latch circuit includes the first circuit and the second circuit.

(20)

A driving method, performed on a semiconductor circuit that includes a first circuit, a second circuit, a first transistor, a second transistor, and a first storage section, the first circuit being able to generate, on the basis of a voltage at a first node, an inverted voltage of the voltage at the first node, and apply the inverted voltage to a second node, the second circuit being able to generate, on the basis of a voltage at the second node, an inverted voltage of the voltage at the second node, and apply the inverted voltage to the first node, the first transistor being turned ON to couple the first node to a third node, the second transistor being turned ON to supply a first direct-current voltage to the third node, and the first storage section including a first terminal coupled to the third node and a second terminal to which a control voltage is supplied and including a first storage device that is able to take a first resistance state or a second resistance state, the method including:

performing a first drive in a first period, the first drive setting the control voltage to a first voltage level that is different from a voltage level of the first direct-current voltage, turning ON the second transistor, and turning OFF the first transistor, to thereby allow a resistance state of the first storage device to be the first resistance state; and performing a second drive in a second period that is after the first period, the second drive setting the control voltage to a second voltage level, to thereby allow the resistance state of the first storage device to be a resistance state that depends on the voltage at the first node.

(21)

The driving method according to (20), in which the semiconductor circuit further includes:

a third transistor that includes a drain, a source, and a gate coupled to the first node or the second node, and in which a second direct-current voltage is supplied to one of the drain and the source;

a fourth transistor that is turned ON to couple the other of the drain and the source of the third transistor to the third node, in which the first drive is performed through further turning OFF the fourth transistor in the first period, and in which the second drive is performed through turning ON the fourth transistor and turning OFF the first transistor and the second transistor in the second period.

(22)

The driving method according to (20), in which the semiconductor circuit further includes:

a third transistor that includes a drain, a source, and a gate coupled to the first node or the second node, and in which one of the drain and the source is coupled to the third node;

a fourth transistor that is turned ON to supply a second direct-current voltage to the other of the drain and the source of the third transistor, in which the first drive is performed through further turning OFF the fourth transistor in the first period, and in which the second drive is performed through turning ON the fourth transistor and turning OFF the first transistor and the second transistor in the second period.

(23)

The driving method according to (21) or (22), including:

performing a third drive through setting the control voltage to the first voltage level, turning ON the first transistor, and turning OFF the second transistor and the fourth transistor, in a third period that is after the second period.

(24)

The driving method according to (20), wherein the second drive is performed through turning ON the first transistor and turning OFF the second transistor in the second period.

(25)

The driving method according to (24), including:

performing a third drive through setting the control voltage to the first voltage level, turning ON the first transistor, and turning OFF the second transistor, in a third period that is after the second period.

(26)

An electronic apparatus with a semiconductor circuit and a battery that supplies a power supply voltage to the semiconductor circuit, the semiconductor circuit including:

a first circuit that is able to generate, on the basis of a voltage at a first node, an inverted voltage of the voltage at the first node, and apply the inverted voltage to a second node;

a second circuit that is able to generate, on the basis of a voltage at the second node, an inverted voltage of the voltage at the second node, and apply the inverted voltage to the first node;

a first transistor that is turned ON to couple the first node to a third node;

a second transistor that is turned ON to supply a first direct-current voltage to the third node; and a first storage section that is coupled to the third node and includes a first storage device that is able to take a first resistance state or a second resistance state.

The application claims the benefit of Japanese Priority Patent Application JP2016-6423 filed with the Japan Patent Office on Jan. 15, 2016, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A semiconductor circuit, comprising:
a first circuit that is able to generate, on a basis of a voltage at a first node, an inverted voltage of the voltage at the first node, and apply the inverted voltage to a second node;
a second circuit that is able to generate, on a basis of a voltage at the second node, an inverted voltage of the voltage at the second node, and apply the inverted voltage to the first node;
a first transistor that is turned ON to couple the first node to a third node;
a second transistor that is turned ON to supply a first direct-current voltage to the third node;
a first storage section that is coupled to the third node and includes a first storage device that is able to take a first resistance state or a second resistance state; and
a driver;
wherein the first storage section includes a first terminal coupled to the third node and a second terminal to which a control voltage is supplied,
wherein, in a first period, the driver sets the control voltage to a first voltage level that is different from a voltage level of the first direct-current voltage, turns ON the second transistor, and turns OFF the first transistor, to thereby allow a resistance state of the first storage device to be the first resistance state, and,
wherein, in a second period that is after the first period, the driver sets the control voltage to a second voltage level to thereby allow the resistance state of the first storage device to be a resistance state that depends on the voltage at the first node.

2. The semiconductor circuit according to claim 1, further comprising:
a third transistor that includes a drain, a source, and a gate coupled to the first node or the second node, and in which a second direct-current voltage is supplied to one of the drain and the source; and
a fourth transistor that is turned ON to couple the other of the drain and the source of the third transistor to the third node.

3. The semiconductor circuit according to claim 2,
wherein, in the first period, the driver sets the control voltage to the first voltage level that is different from the voltage level of the first direct-current voltage, turns ON the second transistor, and turns OFF the first transistor and the fourth transistor, to thereby allow the resistance state of the first storage device to be the first resistance state, and
wherein, in the second period that is after the first period, the driver sets the control voltage to the second voltage level to thereby allow the resistance state of the first storage device to be the resistance state that depends on the voltage at the first node.

4. The semiconductor circuit according to claim 3, wherein, in a third period that is after the second period, the driver sets the control voltage to the second voltage level, turns ON the first transistor, and turns OFF the second transistor and the fourth transistor, to thereby set the voltage at the first node to the voltage that depends on the resistance state of the first storage device.

5. The semiconductor circuit according to claim 3, wherein in the second period, the driver turns ON the fourth transistor, and turns OFF the first transistor and the second transistor.

6. The semiconductor circuit according to claim 1, further comprising:
a third transistor that includes a drain, a source, and a gate coupled to the first node or the second node, and in which one of the drain and the source is coupled to the third node; and
a fourth transistor that is turned ON to supply a second direct-current voltage to the other of the drain and the source of the third transistor.

7. The semiconductor circuit according to claim 6, further comprising:
a third circuit that is able to generate, on a basis of a voltage at a fourth node, an inverted voltage of the voltage at the fourth node, and apply the inverted voltage to a fifth node;
a fourth circuit that is able to generate, on a basis of a voltage at the fifth node, an inverted voltage of the voltage at the fifth node, and apply the inverted voltage to the fourth node;
a fifth transistor that is turned ON to couple the fourth node to a sixth node;
a sixth transistor that is turned ON to supply the first direct-current voltage to the sixth node;
a second storage section that is coupled to the sixth node and includes a second storage device that is able to take the first resistance state or the second resistance state; and
a seventh transistor that includes a drain, a source, and a gate coupled to the fourth node or the fifth node, and in which one of the drain and the source is coupled to the sixth node, wherein the fourth transistor is turned ON to supply the second direct-current voltage to the other of the drain and the source of the seventh transistor.

8. The semiconductor circuit according to claim 1, wherein
the first storage section includes an eighth transistor that is turned ON to couple the third node to the first terminal of the first storage device.

9. The semiconductor circuit according to claim 1, wherein
the first storage section includes an eighth transistor that is turned ON to supply the control voltage to the second terminal of the first storage device.

10. The semiconductor circuit according to claim 1, further comprising:
a ninth transistor that is turned ON to couple the second node to a seventh node;
a tenth transistor that is turned ON to supply the first direct-current voltage to the seventh node; and
a third storage section that is coupled to the seventh node and includes a third storage device that is able to take the first resistance state or the second resistance state.

11. The semiconductor circuit according to claim 1, further comprising
an eleventh transistor that is turned ON to supply a power supply voltage or a ground voltage to the first circuit and the second circuit.

12. The semiconductor circuit according to claim 1, wherein the first resistance state is a state that is lower in resistance value than the second resistance state.

13. The semiconductor circuit according to claim 1, wherein the first resistance state is a state that is higher in resistance value than the second resistance state.

14. The semiconductor circuit according to claim 1, wherein the first storage device stores information with use of a reversible change in a resistance state that depends on a direction of a current flowing between the first terminal and the second terminal.

15. The semiconductor circuit according to claim 14, wherein the first storage device comprises a spin transfer torque storage device.

16. The semiconductor circuit according to claim 1, comprising
an SRAM circuit,
wherein the SRAM circuit includes the first circuit and the second circuit.

17. The semiconductor circuit according to claim 1, comprising
a latch circuit,
wherein the latch circuit includes the first circuit and the second circuit.

18. The semiconductor circuit according to claim 1, comprising a flip flop circuit including a master latch circuit and a slave latch circuit, wherein the slave latch circuit includes the first circuit and the second circuit.

19. The semiconductor circuit according to claim 1, wherein in the second period, the driver turns ON the first transistor and turns OFF the second transistor.

20. A driving method, performed on a semiconductor circuit that includes a first circuit, a second circuit, a first transistor, a second transistor, and a first storage section, the first circuit being able to generate, on a basis of a voltage at a first node, an inverted voltage of the voltage at the first node, and apply the inverted voltage to a second node, the second circuit being able to generate, on a basis of a voltage at the second node, an inverted voltage of the voltage at the second node, and apply the inverted voltage to the first node, the first transistor being turned ON to couple the first node to a third node, the second transistor being turned ON to supply a first direct-current voltage to the third node, and the first storage section including a first terminal coupled to the third node and a second terminal to which a control voltage is supplied and including a first storage device that is able to take a first resistance state or a second resistance state, the method comprising:
- performing a first drive in a first period, the first drive setting the control voltage to a first voltage level that is different from a voltage level of the first direct-current voltage, turning ON the second transistor, and turning OFF the first transistor, to thereby allow a resistance state of the first storage device to be the first resistance state; and
- performing a second drive in a second period that is after the first period, the second drive setting the control voltage to a second voltage level, to thereby allow the resistance state of the first storage device to be a resistance state that depends on the voltage at the first node.

21. The driving method according to claim 20,
wherein the semiconductor circuit further includes:
a third transistor that includes a drain, a source, and a gate coupled to the first node or the second node, and in which a second direct-current voltage is supplied to one of the drain and the source;
a fourth transistor that is turned ON to couple the other of the drain and the source of the third transistor to the third node,
wherein the first drive is performed through further turning OFF the fourth transistor in the first period, and
wherein the second drive is performed through turning ON the fourth transistor and turning OFF the first transistor and the second transistor in the second period.

22. The driving method according to claim 20,
wherein the semiconductor circuit further includes:
a third transistor that includes a drain, a source, and a gate coupled to the first node or the second node, and in which one of the drain and the source is coupled to the third node;
a fourth transistor that is turned ON to supply a second direct-current voltage to the other of the drain and the source of the third transistor,
wherein the first drive is performed through further turning OFF the fourth transistor in the first period, and
wherein the second drive is performed through turning ON the fourth transistor and turning OFF the first transistor and the second transistor in the second period.

23. The driving method according to claim 21, comprising performing a third drive through setting the control voltage to the first voltage level, turning ON the first transistor, and turning OFF the second transistor and the fourth transistor, in a third period that is after the second period.

24. The driving method according to claim 20, wherein the second drive is performed through turning ON the first transistor and turning OFF the second transistor in the second period.

25. The driving method according to claim 24, comprising performing a third drive through setting the control voltage to the first voltage level, turning ON the first transistor, and turning OFF the second transistor, in a third period that is after the second period.

26. An electronic apparatus with a semiconductor circuit and a battery that supplies a power supply voltage to the semiconductor circuit, the semiconductor circuit comprising:
- a first circuit that is able to generate, on a basis of a voltage at a first node, an inverted voltage of the voltage at the first node, and apply the inverted voltage to a second node;
- a second circuit that is able to generate, on a basis of a voltage at the second node, an inverted voltage of the voltage at the second node, and apply the inverted voltage to the first node;
- a first transistor that is turned ON to couple the first node to a third node;
- a second transistor that is turned ON to supply a first direct-current voltage to the third node;
- a first storage section that is coupled to the third node and includes a first storage device that is able to take a first resistance state or a second resistance state; and
- a driver;
wherein the first storage section includes a first terminal coupled to the third node and a second terminal to which a control voltage is supplied,
wherein, in a first period, the driver sets the control voltage to a first voltage level that is different from a voltage level of the first direct-current voltage, turns ON the second transistor, and turns OFF the first transistor, to thereby allow a resistance state of the first storage device to be the first resistance state, and,
wherein, in a second period that is after the first period, the driver sets the control voltage to a second voltage level to thereby allow the resistance state of the first storage device to be a resistance state that depends on the voltage at the first node.

* * * * *